United States Patent [19]
Mitsui et al.

[11] Patent Number: 6,078,641
[45] Date of Patent: Jun. 20, 2000

[54] X-RAY LITHOGRAPHY SYSTEM AND X-RAY LITHOGRAPHY METHOD

[75] Inventors: Soichiro Mitsui; Kenichi Murooka, both of Kanagawa, Japan

[73] Assignee: Kabushiki Kaisha Toshiba, Kawasaki, Japan

[21] Appl. No.: 09/143,520

[22] Filed: Aug. 28, 1998

[30] Foreign Application Priority Data

Aug. 29, 1997 [JP] Japan ..................................... 9-234780

[51] Int. Cl.⁷ ..................................................... G21K 5/00
[52] U.S. Cl. ............................................. 378/34; 378/210
[58] Field of Search .................................................. 378/34

[56] References Cited

U.S. PATENT DOCUMENTS 5,268,951  12/1993  Flamholz et al. .
5,835,560  11/1998  Amemiya et al. .......................... 378/34

FOREIGN PATENT DOCUMENTS 4-184300   7/1992   Japan .
8-179099   7/1996   Japan .

*Primary Examiner*—Craig E. Church
*Attorney, Agent, or Firm*—Oblon, Spivak, McClelland, Maier & Neustadt, P.C.

[57] ABSTRACT

An X-ray lithography system and an X-ray exposure method are provided which is able to perform distortion correction and magnification correction in pattern projection, by using an X-ray reflection mirror whose radius of curvature is changed so as to differentiate its reflection characteristic according to an in-plane incident position of an X-ray beam. More particularly, the X-ray lithography system comprises an X-ray reflection mirror driving unit connected to the X-ray reflection mirror, for changing a position of the X-ray beam incident into the X-ray reflection mirror, a relative positional information acquiring unit for acquiring relative positional information between a pattern on the X-ray mask and a pattern on the wafer as an exposed substrate during exposure, a two dimensional information acquiring unit for acquiring two dimensional information of the X-ray beam during exposure, and an X-ray reflection mirror controlling unit for feedback-controlling the X-ray reflection mirror driving unit in real time, based on the relative positional information and the two dimensional information during exposure by the X-ray beam. Thus, while feedback-controlling an incident position and an incident angle of the X-ray beam into the X-ray reflection mirror and relative positional relationship between the X-ray reflection mirror and the X-ray mask, exposure can be performed by setting a divergence angle or collimation of the X-ray beam to desired values on a surface of the X-ray mask. Accordingly, the mask pattern can be aligned and projected onto each exposure field on the wafer in which distortion is caused due to various manufacturing processes.

27 Claims, 33 Drawing Sheets

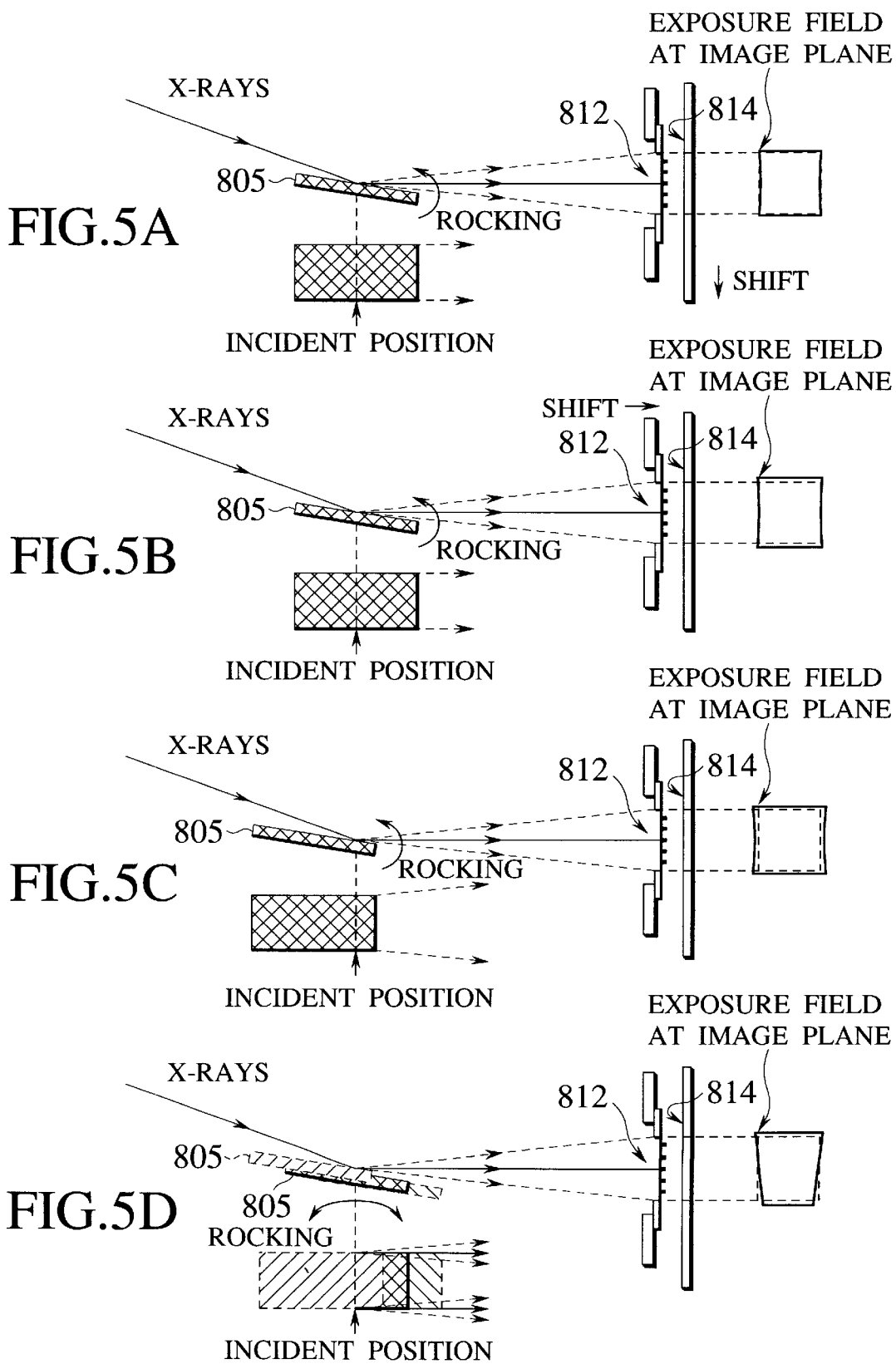

X-RAYS

805(885)

X-RAYS

INCIDENT POSITION

X-RAYS

805(885)

X-RAYS

INCIDENT POSITION

X-RAY LITHOGRAPHY SYSTEM AND X-RAY LITHOGRAPHY METHOD

BACKGROUND OF THE INVENTION

1. Field of the Invention

The present invention relates to a lithography using an X-ray beam and, more particularly, an X-ray lithography system having a distortion correction (or magnification correction) function in pattern projection and an X-ray lithography method using the same.

2. Description of the Related Art

In recent years, the level of miniaturization and high accuracy of the design rule for the semiconductor device has been constantly risen. In the optical lithography, the advanced technology such as resolution enhancement technology using a phase-shift mask and an excimer laser has been proposed. However, such request has become more severe, and essential limitation because of the wavelength of light has become apparent. In particular, the severe request for dimensional standard (short dimension (critical dimension)/long dimension accuracy) of the exposure mask and alignment accuracy has been made. Such request has been similarly made on the X-ray lithography which is promising as one of the advanced lithography technologies from respects of resolution and throughput in the exposure technology of less than 0.15 $\mu$m. In the X-ray lithography, the reduction printing system has not been at the practical use level at present since normally it is difficult to implement the efficient refractive or reflective optical system, and therefore the one-by-one exposure system has been mainly developed. In the one-by-one X-ray lithography, in order to projection the pattern formed on the mask by the proximity exposure method onto the wafer at substantially 1× magnification, improvement of the critical dimension/long dimension accuracy of the pattern on the mask, improvement of the high resolution pattern projection technology, improvement of the pattern alignment accuracy between the mask and the wafer and the process substrates, etc. have been important development items. For this reason, especially various studies concerning the improvement of the critical dimension/long dimension accuracy of the X-ray mask pattern as the key technology have been done in the prior art. For example, reduction in stress of the X-ray absorber pattern and the membrane (the X-ray transmissive thin film), uniformization of stress and film thickness, improvement of the pattern delineation accuracy, and development of the etching technology have been advanced. However, if the lithography means of less than 0.15 $\mu$m is taken into account, the mask having accuracy at the practical level has not been fabricated yet and also the lithography system comprising the exposure system has not constructed yet. Meanwhile, not only the accuracy but also the function for accommodating sufficiently the existing lithography process have been requested in the advanced lithography. For example, in the manufacturing of the LSI and others, normally several tens to one hundred or more of complicated and various fabrication steps are continued to superpose ten or more sheets of fine mask patterns mutually. In such LSI manufacturing steps, there is the case the mask pattern must be superposed mutually by using different type of steppers like a combination of the optical stepper and the X-ray stepper. In the case where different type of steppers are employed, the exposure sequences such as exposure field size and direction, pre-alignment system, etc. must be matched with specifications mutually and therefore it is the premise that such exposure sequences can be practically used freely in combination according to various steppers. In particular, normally the image distortion of the exposure field due to lens distortion, difference in the magnification in the manufacturing process, etc. are contained in the substrate which is formed by the optical exposure system as the conventional lithography. In order to superpose the overlying circuit patterns onto the substrate on which the underlying circuit patterns are formed by the conventional lithography within predetermined accuracy, the exposure function which can correct correctable distortions as much as possible are needed at the lowest. Such correcting function is of course indispensable for the exposure method employed in the X-ray lithography, nevertheless the correcting functions being studied up to now in the prior art have not reached the practical level yet in the existing state. Up to now, as a means for attaining projection accuracy according to a correction function, the methods physically expanding/contracting or deforming a part or all of the mask or the wafer are proposed. However, there has been a possibility that complexity and high cost in the mask manufacturing process are caused by these proposed method. Furthermore, there has been another problem that complexity of the stage mechanism of the exposure system is caused. Also, such systems are difficult to operate at high speed because physical deformation is applied, so that the one skilled in the art has been anxious about the problems of reduction in throughput and mask endurance (fatigue fracture).

In the conventional proposals concerning the beam line and the X-ray reflection mirror in the X-ray lithography system, most of them relate to rocking and drive of the mirror and the mirror shape in order to improve uniformity of the exposure intensity and to expand the exposure region. The proposals concerning the mirror shape are limited to batch expansion of the exposure region and improvement of uniformity of the exposure intensity. Other proposals is mainly concerned with the technology of reducing the divergence of the X-ray beam and enhancement of the collimation of the X-ray beam. In Patent Application Publication (KOKAI) Hei 7-78755, the exposure system having a two-sheeted X-ray reflection mirror construction, in which the vertical phase error of the exposure field can be varied by changing a grazing angle of the second X-ray reflection mirror during shifting the second X-ray reflection mirror linearly, has been proposed.

The X-ray exposure technology in the prior art has been achieving, to same extent, expansion of the exposure field as well as maintenance of uniformity of the exposure dose for the present. However, since the pattern formed on the X-ray mask once is exposed still remaining positional distortion caused at the time of mask fabrication, there has been the problem that alignment accuracy between the X-ray mask and the wafer cannot be sufficiently obtained. Even when the X-ray mask pattern can be formed with fully desired accuracy and the exposure is effected by using the X-ray beam having extremely high collimation, the alignment accuracy of the overlying pattern to mate with the X-ray mask pattern has not been able to be achieved in fact if the underlying exposure field profiles are different every semiconductor substrate (semiconductor chip) because of difference in the LSI manufacturing process. Also, in the technology disclosed by Patent Application Publication (KOKAI) Hei 7-78755, there has been such a problem that, although the positional distortion in the vertical direction of the exposure field can be reduced in exposure by applying the exposure system disclosed by this Publication, the distortion in the horizontal direction of the exposure field cannot be reduced. In addition, it has been impossible to improve complicated positional distortion such as perpendicularity correction, etc.

As described above, it has been impossible for the X-ray exposure technology in the prior art to reduce or correct the positional distortion simultaneously in both the horizontal and vertical directions in exposure. For example, as mentioned above, the desired alignment accuracy has not been able to be attained for various substrate or chips unless the pattern position and the exposure field profile are changed by applying physical action to the X-ray mask. In addition, the X-ray beam has a certain finite divergence angle since such X-ray beam is not perfectly in parallel, but the problem of image distortion caused by the divergence angle has arisen since the divergence angle is a fixed value. At the present, the method which corrects the projection displacement generated by the divergence of the X-ray beam previously in depicting and forming the mask pattern has been proposed as the method of dissolving the above problem. However, according to the method in which the X-ray mask pattern is designed and formed every time while correcting the image distortion due to the manufacturing process or the divergence of the X-ray in accordance with various LSI substrates respectively, there has been the problem that such method cannot be applied individually in case the LSI manufacturing process is changed or in case the X-ray exposure system or the beam line is changed.

In Patent Application Publication (KOKAI) Hei 8-55785, the overall magnification correction can be performed by using proximity gap change and temperature control and the magnification correction along the scanning direction can be performed by minutely moving the semiconductor wafer and the X-ray mask relatively in synchronous with the scanning of the X-ray beam, so that the projection rate correction can be implemented independently in the longitudinal direction and the lateral direction. According to this method, the magnification correction can be done in the horizontal direction and the vertical direction separately. However, as described above, since the field size must be changed by expanding/contracting the substrate by virtue of temperature control according to each substrate or chip or the gap must be changed if the underlying exposure field profile is different every substrate or chip according to difference in the process, there has been the problem that the much process time is consumed and the process speed is decreased. As with the substrate contraction due to heat, it has become difficult to control a heat source and keep the exposure atmosphere at a constant temperature. In the method of changing the gap, there has been the problem that, since pressure difference is caused between the upper surface and the lower surface of the X-ray mask as a thin film structure at the time of changing the gap and thus the Membrane of the mask is distorted mechanically (physically), it is difficult to control such gap.

Furthermore, there has been the problem that, if the mask itself is deformed due to heat generated by the exposure, vibration, variation of the gap, etc., the projection of the pattern to mate with the underlying profile with predetermined positional accuracy is difficult from the aspect of responsibility.

SUMMARY OF THE INVENTION

The present invention has been made in light of the above problems and it is an object of the present invention to provide an X-ray lithography system which has functions of performing distortion correction and magnification correction in pattern projection. Where a concept of the "distortion correction" should be interpreted to include higher order correction such as correction for a barrel shape, a trapezoidal shape, etc.

It is another object of the present invention to provide an X-ray lithography system which is able to get matching between mutual exposure field size and profile easily and to align the mask patterns with predetermined accuracy even when different type of lithography systems are employed in the same manufacturing process.

It is still another object of the present invention to provide an X-ray lithography system which is able to align the mask patterns with predetermined accuracy without complexity and high cost in mask fabrication process.

It is yet still another object of the present invention to provide an X-ray lithography system which is able to align the mask patterns easily with high accuracy even when the exposure field profile on the wafer is deformed due to process variation such as etching technology, etc., thermal effect, distortion generated by the multi-layered structure, etc. in the LSI manufacturing process.

It is further object of the present invention to provide an X-ray lithography system which is able to control the magnification in both the horizontal and vertical directions, and to perform perpendicularity correction between a longitudinal side and a lateral side of the exposure field and correction for a barrel shape and a trapezoidal shape which is in higher order than the perpendicularity correction.

It is still further object of the present invention to provide an X-ray lithography system which is able to shorten an exposure time at high throughput and with high accuracy.

It is still further object of the present invention to provide an X-ray lithography system which is able to eliminate the necessity of making a design of the mask pattern in which a magnification or demagnification amount in both the horizontal and vertical directions of the projected pattern is estimated in advance.

It is still further object of the present invention to provide an X-ray lithography method which can easily perform distortion correction and magnification correction in pattern projection.

It is still further object of the present invention to provide an X-ray lithography method which is able to get matching between mutual exposure field size and profile easily and to align the mask patterns with predetermined accuracy even when different type of lithography machines are employed in the same manufacturing process.

It is still further object of the present invention to provide an X-ray lithography method which is able to align the mask patterns with predetermined accuracy without complexity and high cost in mask fabrication process.

It is still further object of the present invention to provide an X-ray lithography method which is able to align the mask patterns easily with high accuracy even when the exposure field profile on the wafer is deformed due to process variation such as etching technology, etc., thermal effect, distortion generated by the multi-layered structure, etc. in the LSI manufacturing process.

It is still further object of the present invention to provide an X-ray lithography method which is able to control the magnification in both the horizontal and vertical directions, and to perform perpendicularity correction between a longitudinal side and a lateral side of the exposure field and correction for a barrel shape and a trapezoidal shape which is in higher order than the perpendicularity correction.

It is still further object of the present invention to provide an X-ray lithography method which is able to shorten an exposure time at high throughput and with high accuracy.

It is yet still further object of the present invention to provide an X-ray lithography method which is able to eliminate the necessity of making a design of the mask pattern in which a magnification or demagnification amount in both the horizontal and vertical directions of the projected pattern is estimated in advance.

In order to achieve the above object, according to a first aspect of the present invention, there is provided an X-ray lithography system for emitting an X-ray beam reflected by an X-ray reflection mirror onto a predetermined mask (X-ray mask) and exposing a desired pattern on a wafer as an exposed substrate by the X-ray beam transmitted through the X-ray mask, comprising an X-ray reflection mirror, an X-ray reflection mirror driving unit, a relative positional information acquiring means, a two dimensional information acquiring means, and an X-ray reflection mirror controlling unit. The X-ray reflection mirror is constructed such that its radius of curvature is changed to differentiate its reflection characteristic according to an in-plane incident position of the X-ray beam. The X-ray reflection mirror driving unit is connected to the X-ray reflection mirror to change an incident position of the X-ray beam into the X-ray reflection mirror. In the present invention, "the incident position of the X-ray beam" is defined as a center position of a belt-shaped X-ray beam, since the X-ray beam emitted from an SOR beam source has a finite divergence angle around an optical axis. The relative positional information acquiring means acquires relative positional information between a pattern on the X-ray mask and a pattern on the wafer during exposure. The two dimensional information acquiring means for acquires two dimensional information of the X-ray beam during exposure. The X-ray reflection mirror controlling unit feedback-controls the X-ray reflection mirror driving unit based upon at least one of the relative positional information and the two dimensional information during exposure by the X-ray beam.

More particularly, the present invention is associated with the X-ray lithography system which employs a synchrotron radiation (SOR) beam as the exposure beam. In other words, the X-ray lithography system comprises at least a synchrotron ring for generating the SOR beam with strong directivity and high intensity, an X-ray beam output port for extracting the X-ray beam from the synchrotron ring, a beam line which is evacuated up to ultra-high vacuum, an aperture provided in the beam line to restrict an X-ray area, an X-ray reflection mirror for reflecting the X-ray beam, an X-ray shutter, an X-ray exposure chamber in which the projected patterns are formed by transmitting the X-ray beam passed through the beam line through predetermined area of the X-ray mask, on which predetermined patterns are formed, to expose the wafer (semiconductor wafer), on which the photosensitive resist is coated, by means of proximity exposure, and an isolation window for isolating an ultra-high vacuum on the beam line side with an atmospheric pressure (normally a predetermined gas atmosphere consisting of He gas, etc.) on the exposure chamber side to extract the X-ray beam. The position of the X-ray reflection mirror is shifted by the X-ray reflection mirror driving unit such that, when the X-ray (SOR) beam which is extracted from the port and has a finite divergence angle around the optical axis is emitted into and then reflected from the X-ray reflection mirror, the X-ray beam can be radiated into the predetermined position of the X-ray reflection mirror surface at the predetermined angle relative to the surface. The exposure field profile of the X-ray mask can be formed in exposure by shifting the incident position of the X-ray beam such that the divergence angle or the collimation (parallelism) of the X-ray beam reflected by the X-ray reflection mirror can mate with the exposure field profile on the wafer. For this reason, even though the exposure field profile on the wafer is deformed due to various reasons, the exposure field on the X-ray mask can be corrected so as to mate with the deformed exposure field profile. Hence, in case different type of steppers are employed in the same LSI manufacturing process or in case variation of the underlying mask pattern is caused due to variation in the LSI manufacturing process, heat treatment effect, etc., the overlying mask pattern can be fitted for the underlying mask pattern with high accuracy. As the X-ray reflection mirror driving unit, a manipulator having six-axis degree of freedom, etc. may be employed.

The X-ray reflection mirror may be constructed such that its geometrical shape can be changed along the predetermined axis direction. For instance, it is preferable that a radius of curvature of the X-ray reflection mirror should be changed along the predetermined axis direction. (The representative structures are shown in FIGS. 3 and 4.) In the X-ray lithography system according to the present invention, the X-ray reflection mirror driving unit and the X-ray mirror controlling unit drive/control the X-ray reflection mirror so as to move the incident position of the X-ray beam along the predetermined axis direction.

The X-ray reflection mirror scanning mechanism and the X-ray reflection mirror driving unit may be constructed as an integrated single body physically (mechanically) or as separated bodies mutually. In addition, a part or all of the X-ray reflection mirror scanning mechanism and the X-ray reflection mirror driving unit may be disposed in the beam line or on the outside of the beam line.

More preferably, another X-ray reflection mirror (second X-ray reflection mirror) which reflects further the X-ray beam reflected by the X-ray reflection mirror (first X-ray reflection mirror) should be provided. In particular, it is preferable that the X-ray lithography system comprises at least a synchrotron ring for generating the SOR beam, a port for outputting the X-ray beam, a beam line which is evacuated up to ultra-high vacuum, an aperture provided in the beam line to restrict the X-ray area, a first X-ray reflection mirror for reflecting the X-ray beam, a second X-ray reflection mirror for reflecting the X-ray beam being reflected by the first X-ray reflection mirror, an isolation window for isolating the ultra-high vacuum on the beam line side with the atmospheric pressure (or a low pressure different from the beam line) on the exposure chamber side to extract the X-ray beam, the X-ray detector, and an X-ray exposure chamber in which the X-ray mask, on which predetermined patterns are formed, and the wafer, on which the photosensitive resist is coated, are disposed and then the projected patterns are formed by exposing patterns on the X-ray mask onto the wafer by virtue of proximity exposure. In this X-ray lithography system, the X-ray reflection mirror is shifted by the X-ray reflection mirror driving unit such that, when the X-ray beam is emitted into and then reflected from the first X-ray reflection mirror, the X-ray beam can be radiated into the predetermined position of the first X-ray reflection mirror surface at the predetermined angle relative to the surface. The X-ray beam can be formed by shifting the first X-ray reflection mirror such that the divergence angle or the collimation of the X-ray beam reflected by the first X-ray reflection mirror can be changed, and then the X-ray beam is radiated into the second X-ray reflection mirror and then reflected therefrom to reach the wafer via the X-ray mask.

In this case, if roles of the first X-ray reflection mirror and the second X-ray reflection mirror are allotted respectively, drive/control of their positions, orientations (angle), etc. can be facilitated, which can yield the more precise exposure.

For example, the X-ray beam which is reflected at the predetermined horizontal divergence angle by the first X-ray reflection mirror is radiated into the second X-ray reflection mirror, and then the desired areas on the wafer are exposed by rocking the second X-ray reflection mirror in the situation that both the in-plane position of the X-ray beam incident into the second X-ray reflection mirror and the distance between the second X-ray reflection mirror and the X-ray exposure mask are kept constant. In addition, the X-ray beam which is reflected at the predetermined horizontal divergence angle by the first X-ray reflection mirror is radiated into the second X-ray reflection mirror, and then the vertical magnification may be controlled by changing the distance from the X-ray mask to the first X-ray reflection mirror in the situation that the incident angle of the X-ray beam into the second X-ray reflection mirror and the incident in-plane position thereof are kept roughly constant. More preferably, upon emitting the X-ray beam, which is reflected at the predetermined horizontal divergence angle by the first X-ray reflection mirror, into the second X-ray reflection mirror, the second X-ray reflection mirror should be moved in the same direction as the incident direction (optical axis direction) of the X-ray beam into the second X-ray reflection mirror. In this manner, extension of the exposure field in the vertical direction can be prevented or the vertical magnification can be controlled. In this case, it is of course that the second X-ray reflection mirror may also be swung.

According to a second aspect of the present invention, there is provided an X-ray lithography system for emitting the X-ray beam reflected by the X-ray reflection mirror onto the predetermined mask (X-ray mask) and exposing the desired pattern on the wafer as the exposed substrate by the X-ray beam transmitted through the X-ray mask, comprising an X-ray reflection mirror, an X-ray reflection mirror driving unit, a relative positional information acquiring means, a two dimensional information acquiring means, a data storing portion, and an X-ray reflection mirror controlling unit. Like the first aspect, the X-ray reflection mirror is constructed such that its radius of curvature is changed to differentiate its reflection characteristic according to an in-plane incident position of an X-ray beam. The X-ray reflection mirror driving unit is connected to the X-ray reflection mirror to change an incident position of the X-ray beam into the X-ray reflection mirror. The relative positional information acquiring means acquires relative positional information between a pattern on the X-ray mask and a pattern on the wafer prior to exposure. The two dimensional information acquiring means acquires two dimensional information of the X-ray beam prior to exposure. The data storing unit stores at least one of the relative positional information and the two dimensional information. The X-ray reflection mirror controlling unit controls the X-ray reflection mirror driving unit based upon at least one of the relative positional information and the two dimensional information stored in the data storing unit.

The data storing portion is connected to the X-ray reflection mirror controlling unit, and then the X-ray reflection mirror may be driven/controlled based on the data stored in the data storing portion. Actually the data storing portion may be arranged at any place. That is, the data storing portion may placed in the X-ray exposure chamber or placed in the X-ray reflection mirror controlling unit in combination. As stored data, there may be the divergence angle data of the X-ray beam, positional information in the exposure field on the wafer, positional information of the mask, exposure conditions (gap, etc.), and others. Since it is not needed during exposure to detect the divergence angle and the positional information if such information and data are measured in advance, the exposure can be completed in a shorter time to thus improve a throughput.

A third aspect of the present invention is associated with an X-ray lithography method using the X-ray lithography system according to the above first aspect of the present invention. That is, the X-ray lithography method according to the third aspect comprises the steps of acquiring relative positional information between a pattern on the X-ray mask and a pattern on the wafer during exposure, acquiring two dimensional information of the X-ray beam during exposure, and correcting relative positional displacement between the pattern on the X-ray mask and the pattern on the wafer by performing feedback- control of the X-ray reflection mirror driving unit based upon at least one of the relative positional information and the two dimensional information to move a position of the X-ray beam incident into the X-ray reflection mirror which has different reflection characteristics according to its position.

According to the third aspect, even in the case that the exposure field on the underlying mask pattern is the exposure field formed by the optical stepper or in the case that pattern deformation, etc. are caused according to various reasons in the manufacturing process, the mask alignment can be achieved with extremely high accuracy since the overlying pattern can be projected to mate with the underlying mask pattern. It is apparent from the explanation in the first aspect that the X-ray reflection mirror whose radius of curvature is set to be changed along the predetermined axis direction may be employed.

More particularly, the horizontal divergence angle of the X-ray beam is controlled by moving the position of the X-ray beam incident into the X-ray reflection mirror and at the same time the vertical divergence angle of the X-ray beam is controlled by rocking the X-ray reflection mirror. Where the wording "moving the position of the X-ray beam" may include either of continuous movement and sequential movement. The "sequential movement" means step and repeat movement which is moved to the selective position by control and fixed to that position.

Alternatively, it is preferable that, in the situation that the incident position of the X-ray beam is fixed to the predetermined position in the X-ray reflection mirror or while changing the incident position continuously, the incident angle of the X-ray beam into the X-ray mask should be controlled by moving the X-ray reflection mirror in parallel with the optical axis. Since the exposure magnification in the vertical direction can be adjusted by moving the X-ray reflection mirror in parallel with the optical axis, such complicated design that a vertical dimension of the X-ray mask is reduced in advance in X-ray mask design can be omitted.

In the third aspect of the present invention, it is preferable that the X-ray beam should be reflected further by another X-ray reflection mirror (second X-ray reflection mirror) different from the above X-ray reflection mirror (first X-ray reflection mirror). If roles of the first X-ray reflection mirror and the second X-ray reflection mirror are allotted respectively, degree of freedom such as mutual positional movement, rotation, etc. can be enhanced and the exposure field profile can be facilitated.

A fourth aspect of the present invention is associated with an X-ray lithography method using the X-ray lithography system according to the above second aspect of the present invention. In other words, the X-ray lithography method according to the fourth aspect comprises the steps of acquiring relative positional information between a pattern on the X-ray mask and a pattern on the wafer prior to exposure, acquiring two dimensional information of the X-ray beam prior to exposure, storing at least one of the relative positional information and the two dimensional information, and correcting relative positional displacement between the pattern on the X-ray mask and the pattern on the wafer by reading the at least one of the relative positional information and the two dimensional information, which have been stored, and then moving an incident position of the X-ray beam into the X-ray reflection mirror, which has different reflection characteristics according to its position, by use of such information.

According to the fourth aspect of the present invention, since detection of the divergence angle data of the X-ray beam and positional information is not needed during exposure, the exposure can be completed in a shorter time to thus improve a throughput.

Other and further objects and features of the present invention will become obvious upon an understanding of the illustrative embodiments about to be described in connection with the accompanying drawings or will be indicated in the appended claims, and various advantages not referred to herein will be occur to one skilled in the art upon employing of the invention in practice.

BRIEF DESCRIPTION OF THE DRAWINGS

FIGS. 5A to 5D are views showing a rocking operation of the X-ray reflection mirror according to the first embodiment of the present invention respectively;

DETAILED DESCRIPTION OF THE PREFERRED EMBODIMENTS

Figure 1:
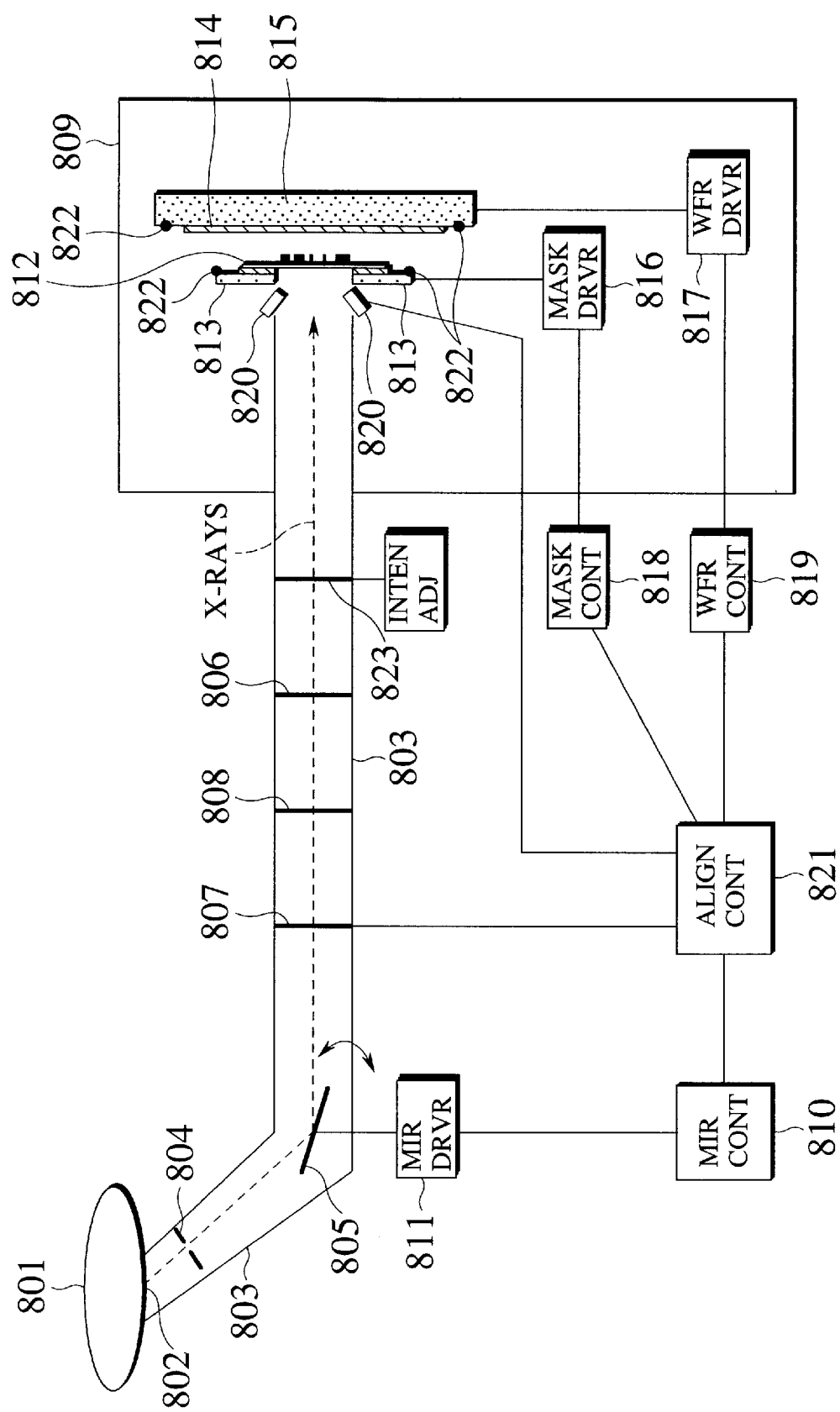
FIG. 1 is a schematic view showing a configuration of an X-ray lithography system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. It will be appreciated that the various drawings are not drawn to scale from one figure to another nor inside a given figure for facilitating the reading of the drawings.

FIRST EMBODIMENT

FIG. 1 is a view showing a schematic configuration of an X-ray lithography system according to a first embodiment of the present invention. In the first embodiment of the present invention, a pattern of an X-ray mask 812 is projected onto a wafer 814 as an exposed substrate by controlling an X-ray reflection mirror 805. At that time, image distortion correction and magnification correction are performed. The X-ray lithography system shown in FIG. 1 comprises at least an X-ray reflection mirror 805, an X-ray reflection mirror driving unit 811 connected to the X-ray reflection mirror 805, a relative positional information acquiring means (820, 821), a two dimensional information acquiring means (807, 821) and an X-ray reflection mirror controlling unit 810 for feedback- controlling the X-ray reflection mirror driving unit in real time, based upon at least one of the relative positional information and the two dimensional information during exposure by the X-ray beam. The relative positional information acquiring means (820,821) acquires the relative positional information between a pattern on the X-ray mask and a pattern on the wafer during exposure. The two dimensional information acquiring means (807,821) acquires the two dimensional information of the X-ray beam during exposure. The relative positional information acquiring means comprises an optical alignment system 820 an alignment controlling unit 821. The two dimensional information acquiring means comprises an X-ray detector 807 and the alignment controlling unit 821.

In detail, the X-ray lithography system shown in FIG. 1 comprises a synchrotron ring 801 for generating an SOR (synchrotron radiation) beam, an X-ray beam output port 802, a beam line 803 which is evacuated up to ultra-high vacuum, an aperture 804 for restricting an X-ray area, the X-ray reflection mirror 805, an isolation window 806 for isolating an ultra-high vacuum on the beam line side with an atmospheric pressure on the exposure chamber side, the X-ray detector 807, an X-ray shutter 808, and an X-ray exposure chamber 809. The X-ray reflection mirror driving unit 811 which is controlled by the X-ray reflection mirror controlling unit 810 is connected to the X-ray reflection mirror 805. The X-ray reflection mirror controlling unit 810 controls and drives an incident position of the X-ray beam and a orientation and rocking of the mirror. A part or all of the X-ray reflection mirror driving unit 811 may be disposed in the beam line 803 or disposed on the outside of the beam line 803. The X-ray detector 807 is employed to measure horizontal and vertical collimation (parallelism) of the X-ray beam reflected by the X-ray reflection mirror 805 as two dimensional information. This X-ray detection signal is input into the X-ray reflection mirror controlling unit 810 and used to drive the X-ray reflection mirror 805.

Figure 2:
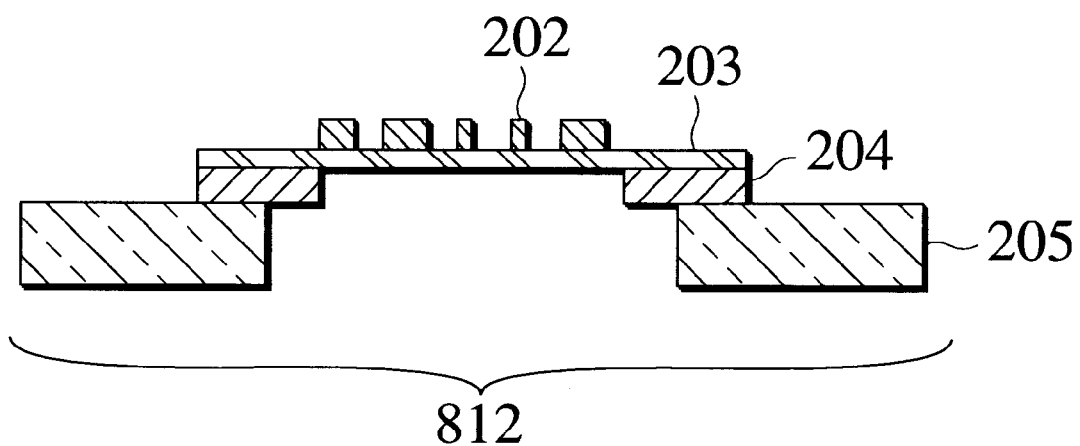
FIG. 2 is a sectional view showing an X-ray mask shown in FIG. 1

In the X-ray exposure chamber 809, the X-ray mask 812 is held on a mask stage 813 and a wafer 814 is held on a wafer stage 815. A mask stage driving unit 816 and a mask stage controlling unit 818, and a wafer stage driving unit 817 and a wafer stage controlling unit 819 are connected to the mask stage 813 and the wafer stage 815 respectively. A sectional view of the typical X-ray mask 812 is shown in FIG. 2. The X-ray mask 812 consists of an X-ray absorption pattern (thickness of 0.4 $\mu$m) 202 made of tungsten-rhenium (W—Re) alloy, an X-ray transmission thin film (thickness of 2 $\mu$m) 203 made of silicon carbide (SiC), an Si supporting substrate (thickness of 2 $\mu$m, outer diameter of 76 mm) 204 for supporting the X-ray transmission thin film 203, and a supporting frame $SiO_2$ glass (thickness of 4 mm, outer diameter of 100 mm, opening of 60 mm $\phi$) 205 for reinforcing the above. An X-ray transmission window (42 mm square) is formed by removing a part of the Si supporting substrate 204 by virtue of back etching. An exposure field is a 20 mm×40 mm square region, and predetermined patterns are formed in this region. As shown in FIG. 1, the X-ray mask 812 is held on the mask stage 813 in the X-ray exposure chamber 809 which is a major constituent element of the X-ray lithography system. The wafer 814 is held on the wafer stage 815. The X-ray mask 812 and the wafer 814 can be set by the mask stage driving unit 816 and the wafer stage driving unit 817 in the X-ray exposure chamber 809 to have a predetermined gap. For example, such gap may be set to 20 $\mu$m. In this case, parallelism (collimation) of the X-rays between the X-ray mask 812 and the wafer 814 of ±0.2 $\mu$m can be attained in this exposure field region. Also, the X-ray exposure chamber 809 is constructed to enable a sequential exposure according to a step and repeat system. In a stepper for performing the sequential exposure, the relative position between a pattern on the X-ray mask 812 and an exposure field on the wafer 814 can be detected by the optical alignment system 820, then both the mask stage driving unit 816 for the mask stage 813 and the wafer stage driving unit 817 for the wafer stage 815 are controlled by a servo mechanism in a closed-loop fashion based on this detection signal, and then an alignment exposure is performed.

Figure 3A:
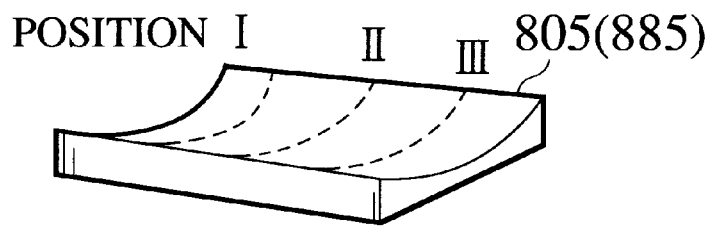
FIG. 3A is a schematic view showing an example of an X-ray reflection mirror shown in FIG. 1 and employed in the present invention.
Figure 3B:
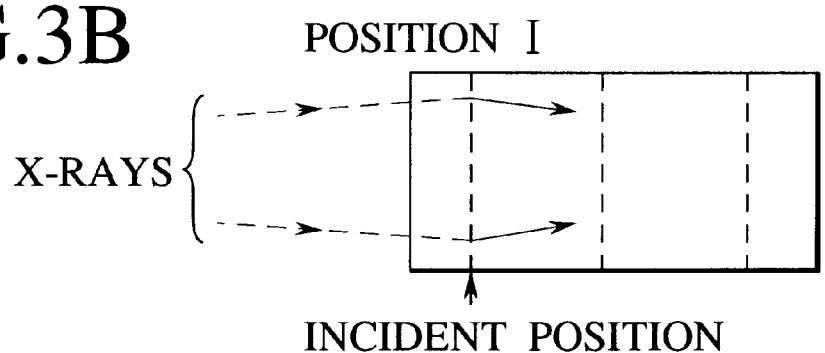
FIG. 3B is a schematic view showing a reflection angle of an X-ray beam at an in-plane position I of the X-ray reflection mirror shown in FIG. 3A.
Figure 3C:
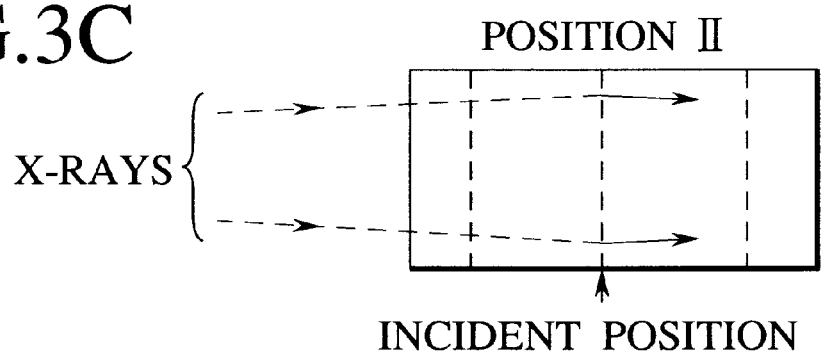
FIG. 3C is a schematic view showing the reflection angle of the X-ray beam at an in-plane position II of the X-ray reflection mirror.
Figure 3D:
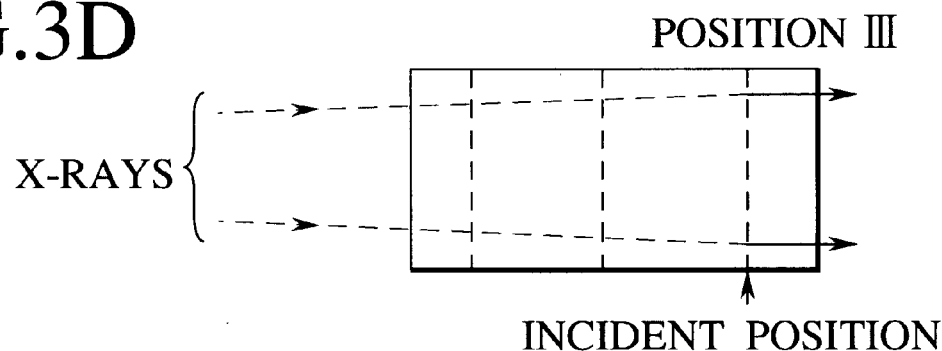
FIG. 3D is a schematic view showing the reflection angle of the X-ray beam at an in-plane position III of the X-ray reflection mirror.
Figure 4A:
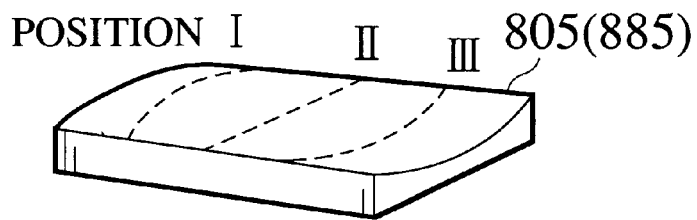
FIG. 4A is a schematic view showing another example of the X-ray reflection mirror used in the present invention.
Figure 4B:
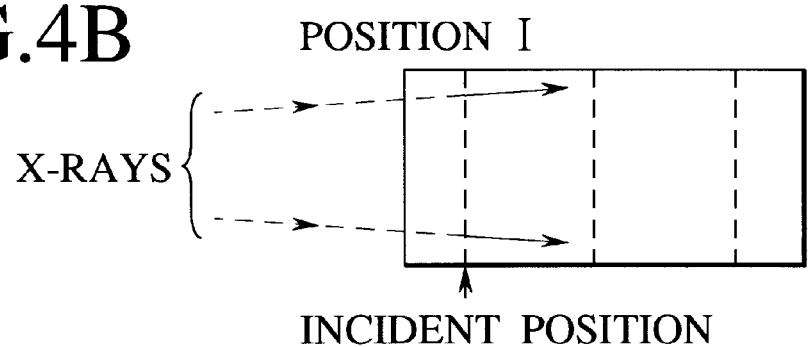
FIG. 4B is a schematic view showing a reflection angle of X-ray beam at an in-plane position I of the X-ray reflection mirror shown in FIG. 4A.
Figure 4C:
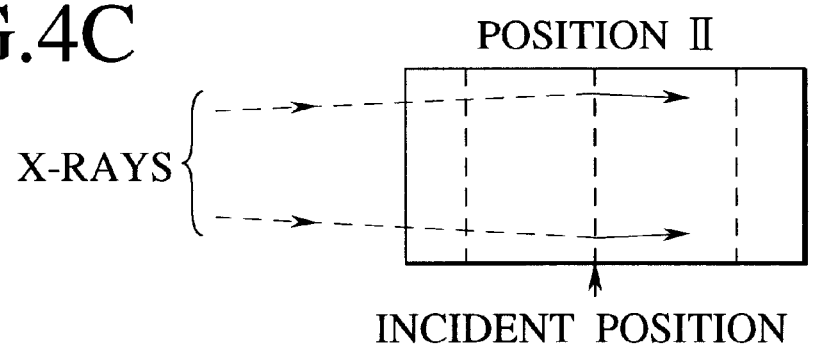
FIG. 4C is schematic view showing the reflection angle of the X-ray beam at an in-plane position II of the X-ray reflection mirror.
Figure 4D:
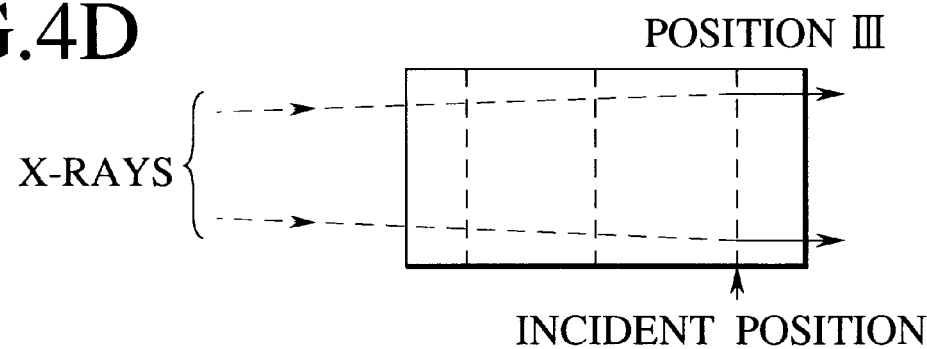
FIG. 4D is a schematic view showing the reflection angle of the X-ray beam at an in-plane position III of the X-ray reflection mirror.

A belt-shaped X-ray beam emitted from an SOR beam source 801 has a finite divergence angle around an optical axis in the horizontal direction. But such X-ray beam, when radiated into the X-ray reflection mirror 805 and reflected thereby, is converged and then collimated roughly into a parallel beam. As shown in FIG. 3A and FIG. 4A, an example of the X-ray reflection mirror employed in the present invention is designed and constructed such that a radius of curvature is differentiated according to a position on an optical axis. Hence, a focusing characteristic (reflection characteristic) is different at an in-plane position of the X-ray reflection mirror, and a horizontal divergence angle can be changed continuously according to an incident position of the X-ray beam. The X-ray reflection mirror shown in FIG. 3A belongs to a toroidal system and a radius of curvature is increased in the order of in-plane positions I, II, III of the X-ray reflection mirror. FIG. 3B is a schematic view showing a reflection angle of an X-ray beam at the in-plane position I, FIG. 3C is a schematic view showing the reflection angle of the X-ray beam at the in-plane position II, and FIG. 3D is a schematic view showing the reflection angle of the X-ray beam at an in-plane position III. Also, the X-ray reflection mirror shown in FIG. 4A has such a feature that the radii of curvature are set differently at the in-plane positions I, II, III, and the radius of curvature becomes substantially infinite at the in-plane position II, and signs of curvature are inverted at the in-plane positions I, III. FIG. 4B is a schematic view showing a reflection angle of the X-ray beam at the in-plane position I of the X-ray reflection mirror shown in FIG. 4A, FIG. 4C is a schematic view showing the reflection angle of the X-ray beam at the in-plane position II, and FIG. 4D is a schematic view showing the reflection angle of the X-ray beam at the in-plane position III. If the X-ray reflection mirror which has different reflection characteristics at the in-plane positions as shown above is employed and the incident position of the X-ray beam into the X-ray reflection mirror is selected, horizontal collimation of the X-ray beam can be freely adjusted. Therefore, in exposure by using this X-ray reflection mirror, the pattern on the X-ray mask can be projected onto the wafer 814 while changing a horizontal magnification of the X-ray mask pattern into a desired value. As for the vertical direction of the exposure field on the wafer 814, a magnification of the projected pattern can be controlled by adjusting the relative distance between the X-ray mask 812 and the X-ray reflection mirror 805 and by changing the divergence angle of the X-ray beam according to a rocking amount of the X-ray reflection mirror 805. However, the X-ray mask 812 and the wafer 814 must be moved together toward the X-ray reflection mirror 805 to adjust the relative distance between the X-ray mask 812 and the X-ray reflection mirror 805, so that there has been a problem that the X-ray lithography system should be constructed on a large scale. If the X-ray reflection mirror 805 is to be swung, the vertical magnification of the projected pattern becomes constant since the vertical divergence angle is determined according to a positional relationship between the X-ray mask 812 and the X-ray reflection mirror 805. Hence, the vertical magnification can be easily adjusted by either changing the gap between the X-ray mask 812 and the wafer 814 with keeping the divergence angle constant or relatively moving vertically the X-ray mask 812 and the wafer 814 at different velocities.

FIGS. 5A to 5D show the representative examples in which the X-ray reflection mirror 805 is swung while keeping the distance between the X-ray mask 812 and the X-ray reflection mirror 805 constant. As shown in FIG. 5A, if the wafer 814 is moved at relatively different velocity in the vertical direction from the scanning velocity (circumferential velocity) of the X-ray beam corresponding to the rocking operation of the X-ray reflection mirror 805, projection can be made while changing the vertical magnification. As shown in FIG. 5B, if the gap between the X-ray mask 812 and the wafer 814 is also changed, a magnification can be changed according to the horizontal divergence angle of the X-ray beam and the amount of rocking. As shown in FIGS. 3B to 3D and FIGS. 4B to 4D, in the present invention, the horizontal divergence angle of the reflected X-ray beam becomes different according to the position on the optical axis of the X-ray reflection mirror 805. Accordingly, as shown in FIG. 5C, the horizontal magnification of the projected pattern can be varied by moving the incident position onto the X-ray reflection mirror 805 and at the same time rocking the X-ray reflection mirror 805. Movement of the incident position may be conducted by either continuous movement or sequential movement. The "sequential movement" means such a step movement that, after the incident position has been moved to a selective position by virtue of control, such incident position is fixed to that position. Similarly, as shown in FIG. 5D, the horizontal magnification of the projected pattern on the wafer 814 can be changed according to change in the incident position of the X-ray beam by rocking the X-ray reflection mirror 805 while moving the incident position into the X-ray reflection mirror 805.

Figure 6A:
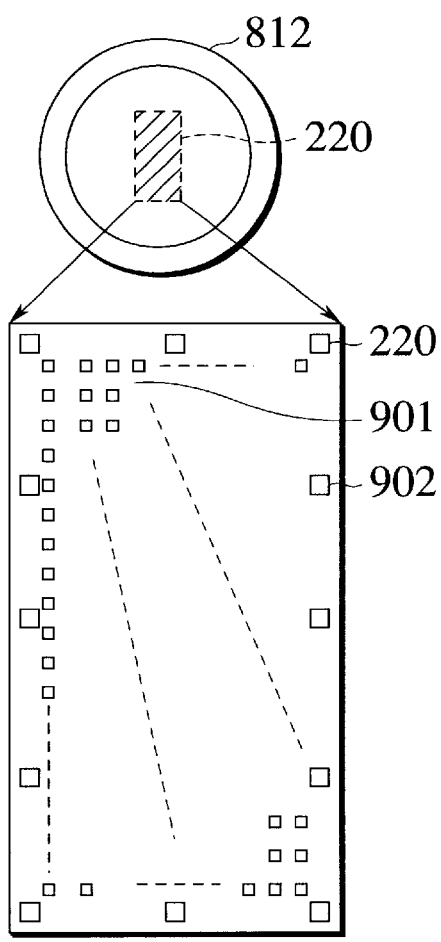
FIG. 6A is a view showing a pattern layout of an exposure field pattern of an X-ray mask used in the present invention.
Figure 6B:
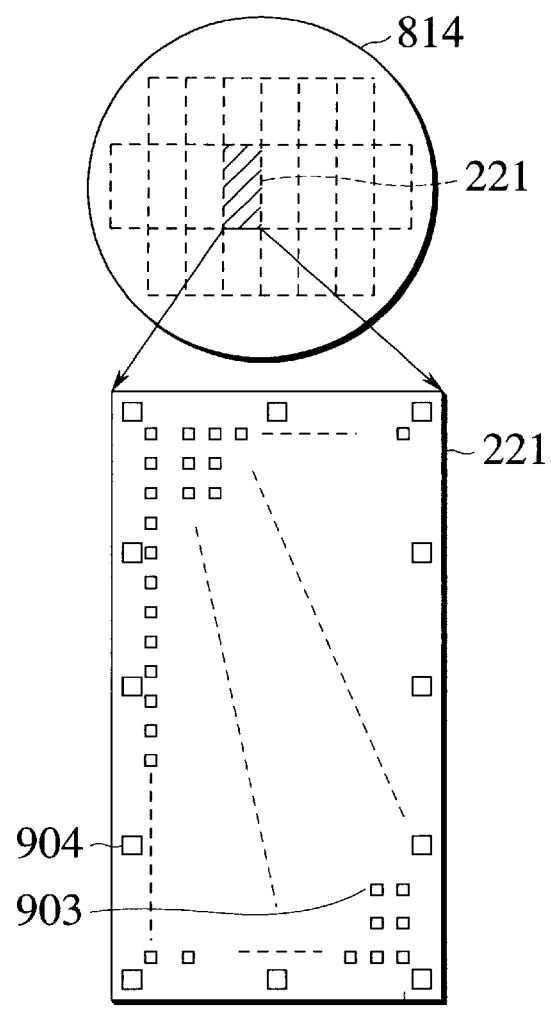
FIG. 6B is a schematic view showing a pattern layout of an exposure field pattern on a wafer used in the present invention.

In FIG. 1, setting of the gap between the X-ray mask 812 and the wafer 814 can be adjusted based on a profile information signal which is obtained by a gap sensor 822 in driving respective stages to scan the X-ray mask 812 and the wafer 814. At that time, such gap setting can be carried out in the situation that the X-ray mask 812 holds its orientation such that the X-ray beam which is along a center line of a circular arc of the rocking of the X-ray reflection mirror 805 is vertically incident into the pattern surface of the X-ray mask 812. Also, the optical alignment system 820 which can detect an alignment position between the X-ray mask 812 and the wafer 814 is installed in the X-ray exposure chamber 809. An alignment controlling unit 821 is connected to the optical alignment system 820. In addition, an X-ray intensity distribution adjusting means 823 which can adjust an X-ray intensity distribution on the wafer 814 is provided to the beam line 803 located between the X-ray reflection mirror 805 and the X-ray exposure chamber 809. As shown in FIG. 6A, alignment evaluation patterns 901 and alignment marks 902 in addition to device patterns are formed on an exposure field pattern 220 of the X-ray mask 812. Similarly, as shown in FIG. 6B, alignment evaluation patterns 903 and alignment marks 904 in addition to device patterns are formed on an exposure field pattern 221 of the wafer 814. Twenty of total exposure fields are formed through sequential exposure on the wafer 814, as shown in FIG. 6B. The alignment evaluation patterns 901, 903 are designed to have box-in-box patterns in alignment exposure and are formed in respective exposure fields 220, 221 at 9×17 points. Further, the alignment marks 902, 904 are arranged at upper and lower sides and right and left sides of the exposure fields 220, 221 respectively, and particularly right and left side alignment marks 902, 904 are aligned linearly. A relative positional information acquiring means of the present invention is composed of the optical alignment system 820 and the alignment controlling unit 821. A two dimensional information acquiring means of the present invention is composed of the X-ray detector 807 and the alignment controlling unit 821. That is, the alignment controlling unit 821 can function as a common unit to the relative positional information acquiring means and the two dimensional information acquiring means of the present invention.

Next, an example of exposure sequence in an X-ray lithography method according to the first embodiment of the present invention will be explained with reference to a flowchart shown in FIG. 7 hereunder.

(a) First, in step S101, the X-ray mask 812 and the wafer 814 are loaded into the X-ray exposure chamber 809 and then placed on the mask stage 813 and the wafer stage 815 respectively. Then, in step S102, the gap setting between the X-ray mask 812 and the wafer 814, orientation control of the X-ray mask 812, and orientation control of the wafer 814 are carried out by using the mask stage driving unit 816 and the wafer stage driving unit 817. Then, in step S103, in order to execute sequential exposure by virtue of a step and repeat system, the wafer is moved into a predetermined exposure field by using the wafer stage driving unit 817.

Figure 7:
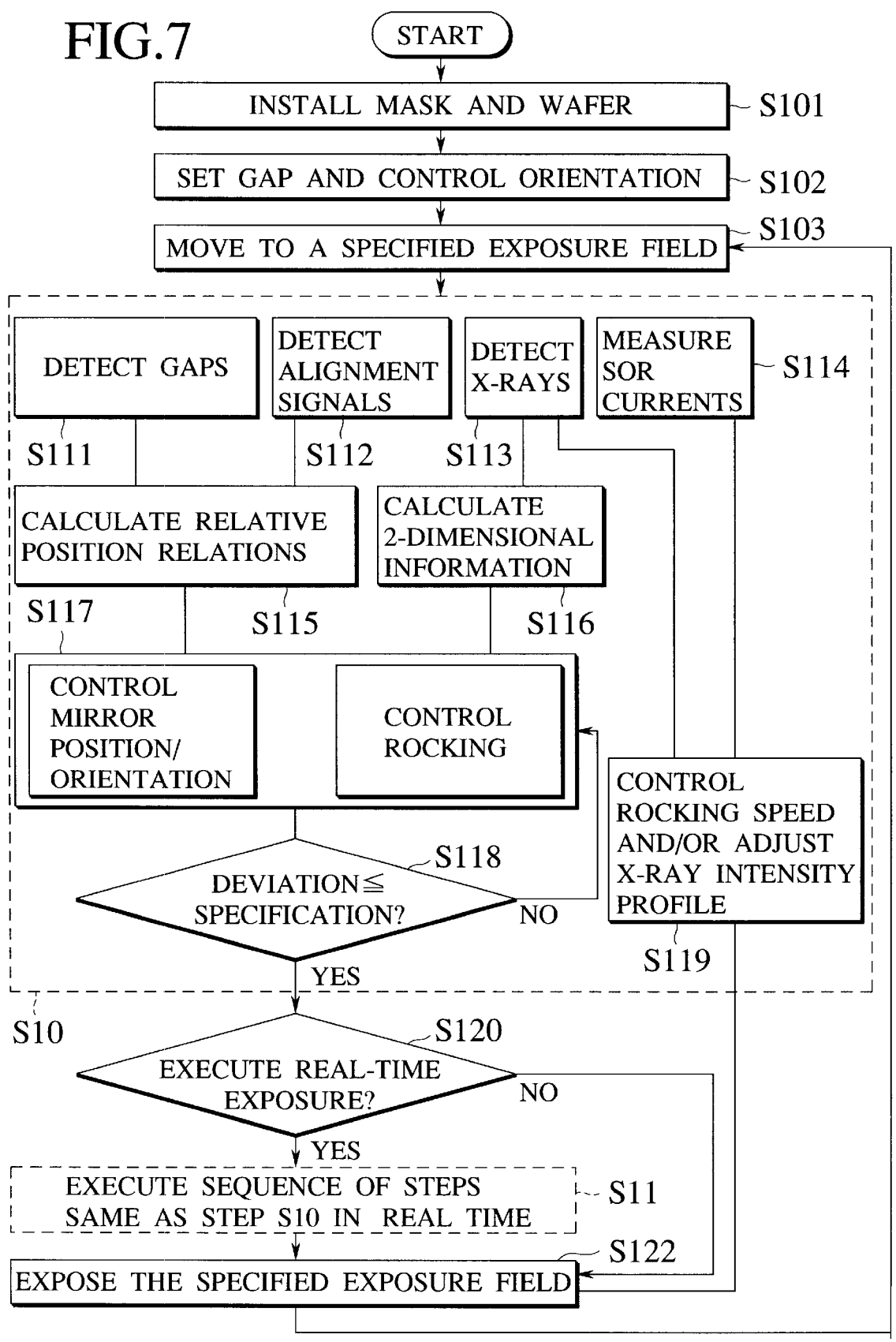
FIG. 7 is a flowchart showing exposure sequence of X-ray lithography according to the first embodiment of the present invention.

(b) The processes are advanced to step S10 indicated by a broken line in FIG. 7 from this point. More particularly, in step S111, the gap between the X-ray mask 812 and the wafer 814 can be detected by using the gap sensor 822. In step S112, position signals are detected from the alignment marks 902 on the X-ray mask 812 and the alignment marks 904 on the wafer 814 by the optical alignment system 820. In step S115, position information of patterns on the X-ray mask 812, position information of patterns on the wafer 814, and relative positional relationships (positional displacement, distortion, etc.) among them are calculated by the alignment controlling unit 821 based on the position signals derived from the alignment marks 902 on the X-ray mask 812 and the alignment marks 904 on the wafer 814. In step S113, the X-ray beam can be detected by the X-ray detector 807. In step S116, the alignment controlling unit 821 can calculate horizontal and vertical collimation of the X-ray beam, which is reflected by the X-ray reflection mirror 805, as two dimensional information by using this detection signal. The relative positional information of the patterns are transferred to the mask stage controlling unit 818 and the wafer stage controlling unit 819, and then the alignment operation is controlled by the mask stage controlling unit 818 and the wafer stage controlling unit 819.

(c) At the same time, the relative positional information supplied from the alignment controlling unit 821 are transfer to the X-ray reflection mirror controlling unit 810. In step S117, the incident position of the X-ray beam relative to the X-ray reflection mirror 805 and the orientation and rocking of the X-ray reflection mirror 805 are set by the X-ray reflection mirror driving unit 811 based on the relative positional information and the two dimensional information of the X-ray beam. This setting is performed such that, under the condition that the predetermined gap between the X-ray mask 812 and the wafer 814 is being kept, the divergence angles of the X-ray beam incident into the X-ray mask can be set to desired angles in both the horizontal and vertical directions and also an alignment accuracy between the X-ray mask 812 and the wafer 814 can be suppressed less than a desired standard on a calculation. This can be set by carrying out loops in step S117 and step S118 repeatedly until the positional displacement comes to the desired standard, while checking in step S118 whether or not the positional displacement is less than the desired standard. In case the divergence angle of the X-ray beam incident into the X-ray mask 812 is optimized, it is checked by the X-ray reflection mirror controlling unit 810, before starting exposure by opening the X-ray shutter 808, whether or not the divergence angle of the X-ray beam detected by the X-ray detector 807 has satisfied predetermined conditions of objective exposure fields of the X-ray mask 812 and the wafer 814. Then, above setting of the X-ray reflection mirror 805 is repeated until it has been checked by the X-ray reflection mirror controlling unit 810 that such predetermined conditions can be satisfied.

(d) Meanwhile, in step S114, a storage current value in an SOR ring is measured. In step S119, a rocking speed of the X-ray reflection mirror 805 is controlled based on either the storage current value in the SOR ring or an X-ray intensity detected in step S113 to obtain a desired exposure dose. In other words, a mirror rocking operation carried out by the X-ray reflection mirror driving unit 811 is controlled by the X-ray reflection mirror controlling unit 810 to thus control the rocking speed of the X-ray reflection mirror 805.

(e) In step S120, if it is decided that "execute real-time exposure", the process in step S11, which is identical to step S10, is carried out. If it is decided that "don't execute real-time exposure", the process is advanced to step S122 in which a predetermined exposure field is exposed. In step S11, positional signals which correspond to the position of the exposure field are detected in real time from the alignment marks 902 on the X-ray mask 812 and the alignment marks 904 of the exposure field on the wafer 814, which is being exposed, by the optical alignment system 820 even during exposure. Then, positional information of the pattern on the X-ray mask 812 and positional information of the pattern on the wafer 814, which are formed by the alignment controlling unit 821 based on such positional signals, are transfer to the X-ray reflection mirror controlling unit 810. Then, an incident position of the X-ray beam into the X-ray reflection mirror 805 and orientation of the X-ray reflection mirror 805 are controlled based on the signal information detected by the X-ray detector 807 in real time, using these positional informations as references. The real time control is executed so that the divergence angle of the X-ray beam incident into the X-ray mask 812 can be set to less than the desired standard in both the horizontal and the vertical direction, and that alignment accuracy between the X-ray mask 812 and the wafer 814 can be set to less than the desired standard on a calculation. That is, while being driven in real time by the X-ray reflection mirror driving unit 811 to satisfy the conditions of less than the desired standard values, both the mask stage controlling unit 818 and the wafer stage controlling unit 819 carry out sequentially the alignment operation of the predetermined exposure field in synchronous with the rocking operation of the X-ray reflection mirror 805 (step S11). In this way, the step-and-repeat exposure is applied to the predetermined exposure field on the wafer 814 (step S122). Then, the process returns to step S103 and then the exposures on succeeding exposure fields are repeated according to steps S10, S11, etc.

As easily understood, the synchrotron radiation has a beltlike shape while the X-ray beam which is formed according to the extension of the exposure field caused by the rocking operation of the X-ray reflection mirror 805 has a roughly beltlike shape which is long in the horizontal direction. The X-ray beam having this beltlike shape is scanned along the vertical direction of the exposure field and is employed to expose. In addition, adjustment of an X-ray intensity distribution, e.g., an assurance of the in-plane uniformity of the X-ray exposure dose, etc., if the case may be, is performed by the X-ray intensity distribution adjusting means 823. Such X-ray intensity distribution adjusting means 823 may be composed of at least a sheet of SiN thin film, preferably four sheets of SiN thin films each of which has different thickness and thickness distribution in combination. The SiN thin films whose thickness distributions are made thicker gradually along the longitudinal direction and the lateral direction and conversely made thinner gradually along the longitudinal direction and the lateral direction are prepared respectively. An average thickness of the SiN thin films is 0.3 $\mu$m. The thickness distributions are adjusted by combining the SiN thin films appropriately in the beam line in the vertical direction, the horizontal direction, or the oblique direction so as to let the X-ray intensity roughly uniform in the exposure field region.

SECOND EMBODIMENT

In the first embodiment of the present invention, the case has been explained as the X-ray lithography system where the X-ray reflection mirror 805 is swung while keeping the distance between the incident position of the X-ray beam into the X-ray reflection mirror 805 and the X-ray mask 812 constant. Since the exposure field has been extended by rocking the X-ray reflection mirror 805, the projected pattern on the wafer 814 is projected to be extended inevitably larger than the exposure field on the X-ray mask 812 along the vertical direction. For this reason, the mask pattern must be designed after an amount of extension in projection is estimated previously. That is, a special X-ray mask pattern which is small in size rather than the actual exposure field to be formed on the wafer 814 must be designed and then employed. In other words, in the first embodiment, since such restriction must be imposed in fabricating the X-ray mask 812, mask design becomes complicated and complex and it takes a lot of time to fabricate and check the X-ray mask 812. In order to perform the exposure by changing the magnification in the vertical direction while avoiding the above, the exposure must be performed while either adjusting the gap between the X-ray mask 812 and the wafer 814 or shifting the wafer 814 in response to the rocking operation of the X-ray reflection mirror 805. A second embodiment of the present invention will be made to improve such circumstances.

Figure 8:
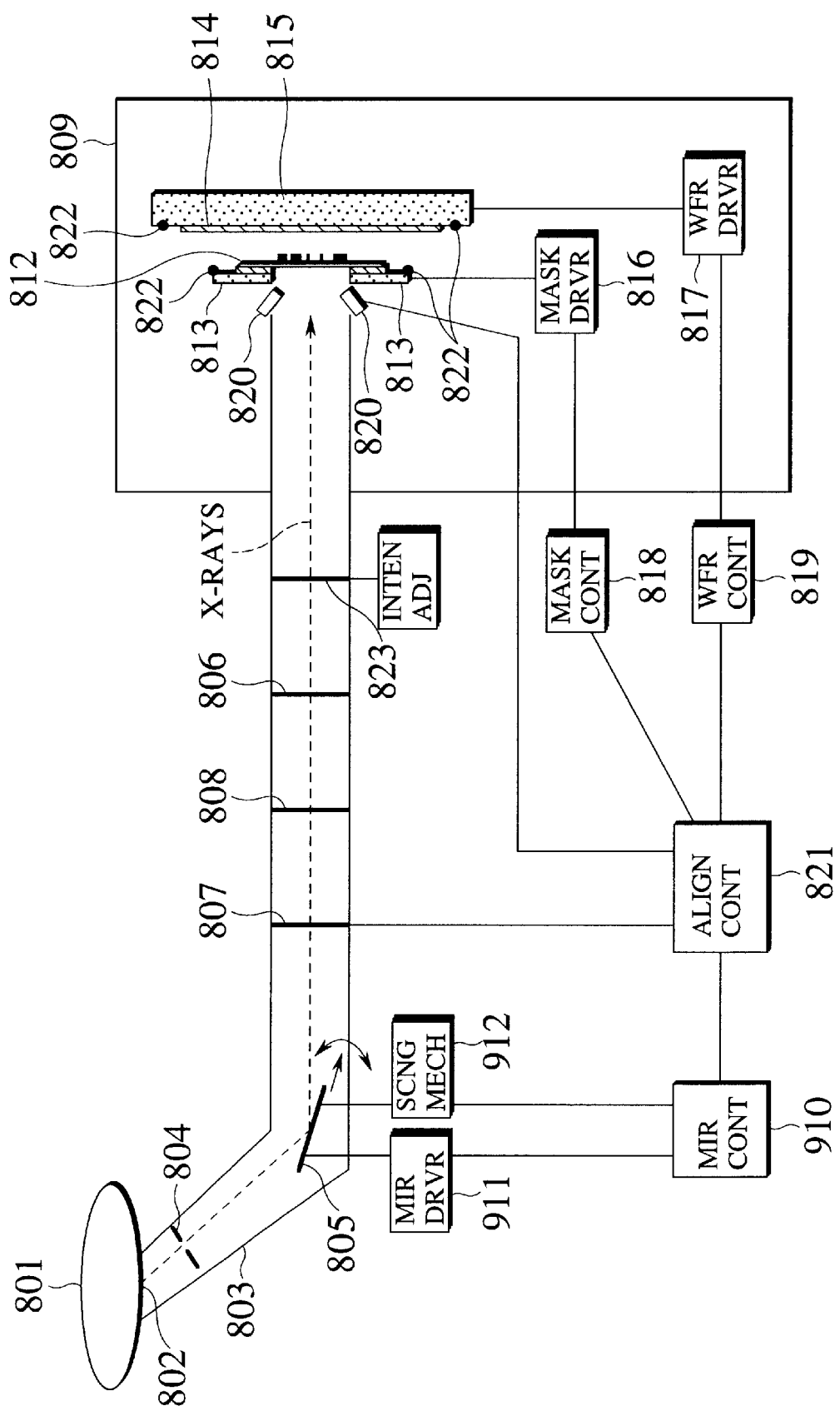
FIG. 8 is a view showing a schematic configuration of an X-ray lithography system according to a second embodiment of the present invention.

FIG. 8 is a view showing a schematic configuration of an X-ray lithography system according to a second embodiment of the present invention. The second embodiment of the present invention corresponds to the case where an X-ray reflection mirror 905 is moved in parallel with the optical axis direction of the X-ray beam. The X-ray lithography system shown in FIG. 8 comprises at least the synchrotron ring 801 for generating the SOR beam, the X-ray beam output port 802, the beam line 803 which is evacuated up to ultra-high vacuum, the aperture 804 for restricting the X-ray area, the X-ray reflection mirror 805, the isolation window 806 for isolating the ultra-high vacuum on the beam line side with the atmospheric pressure on the exposure chamber side, the X-ray detector 807, the X-ray shutter 808, and the X-ray exposure chamber 809. An X-ray reflection mirror driving unit 911 which controls and drives a orientation and rocking of the X-ray reflection mirror 805 and an incident position of the X-ray beam is connected to the X-ray reflection mirror 805. In addition, an X-ray reflection mirror scanning mechanism 912 which moves the X-ray reflection mirror 805 in parallel with the optical axis of the X-ray beam to extend the exposure field is provided to the X-ray reflection mirror 805. The X-ray reflection mirror driving unit 911 and the X-ray reflection mirror scanning mechanism 912 are connected to an X-ray reflection mirror controlling unit 910 and are controlled by the X-ray reflection mirror controlling unit 910 respectively. In FIG. 8, the X-ray reflection mirror driving unit 911 and the X-ray reflection mirror scanning mechanism 912 are set forth as separate bodies, but these are schematic representations as a system configuration. It is a matter of course that both may be constructed as an integral body in an actual physical (mechanical) structure. It is a matter of design which can be selected arbitrarily according to the configuration of the beam line, etc. whether or not they should be constructed as the integral body or the separate bodies. Further, it may be decided according to design that a part or all of the X-ray reflection mirror driving unit 911 and the X-ray reflection mirror scanning mechanism 912 may be disposed in the beam line 803 or disposed on the outside of the beam line 803. The X-ray detector 807 is employed to measure horizontal and vertical collimation of the X-ray beam reflected by the X-ray reflection mirror 805 as two dimensional information. This X-ray detection signal is input into the X-ray reflection mirror controlling unit 910 and used to drive the X-ray reflection mirror 805.

In the X-ray exposure chamber 809, the X-ray mask 812 is held on the mask stage 813 and also the wafer 814 is held on the wafer stage 815. The mask stage driving unit 816 and the mask stage controlling unit 818, and the wafer stage driving unit 817 and the wafer stage controlling unit 819 are connected to the mask stage 813 and the wafer stage 815 respectively. A gap between the X-ray mask 812 and the wafer 814 may be set to 20 $\mu$m and collimation of ±0.2 $\mu$m can be attained in this exposure field region of 20 mm×40 mm. Such gap between the X-ray mask 812 and the wafer 814 can be adjusted and set based on a profile information signal obtained by the gap sensor 822 when the X-ray mask 812 and the wafer 814 are scanned by driving the mask stage 813 and the wafer stage 815. At that time, the orientation of the X-ray mask 812 is determined such that the X-ray beam from the X-ray reflection mirror 805 is radiated vertically into the X-ray mask 812. Also, the optical alignment system 820 which can detect an alignment position between the X-ray mask 812 and the wafer 814 is installed in the X-ray exposure chamber 809. The alignment controlling unit 821 is connected to the optical alignment system 820. In addition, the X-ray intensity distribution adjusting means 823 which can adjust the X-ray intensity distribution on the wafer 814 is provided to the beam line 803 located between the X-ray reflection mirror 805 and the X-ray exposure chamber 809. The alignment mark in the exposure field and the evaluation patterns are similar to those in the first embodiment. That is, as shown in FIG. 6A, the alignment evaluation patterns 901 and the alignment marks 902 as well as device patterns are formed on the exposure field pattern 220 of the X-ray mask 812. Similarly, the alignment evaluation patterns 903 and the alignment marks 904 as well as device patterns are formed on the exposure field 221 on the wafer 814. The alignment evaluation patterns 901, 903 are designed to have the box-in-box patterns in alignment exposure and are formed at 9×17 points in respective exposure fields 220, 221. Further, the alignment marks 902, 904 are arranged at upper and lower sides and right and left sides of the exposure fields 220, 221 respectively, and particularly right and left side alignment marks 902, 904 are aligned linearly. The relative positional information acquiring means of the present invention is composed of the optical alignment system 820 and the alignment controlling unit 821. The two dimensional information acquiring means of the present invention is composed of the X-ray detector 807 and the alignment controlling unit 821. That is, the alignment controlling unit 821 can function as a common unit to the relative positional information acquiring means and the two dimensional information acquiring means of the present invention.

Figure 9:
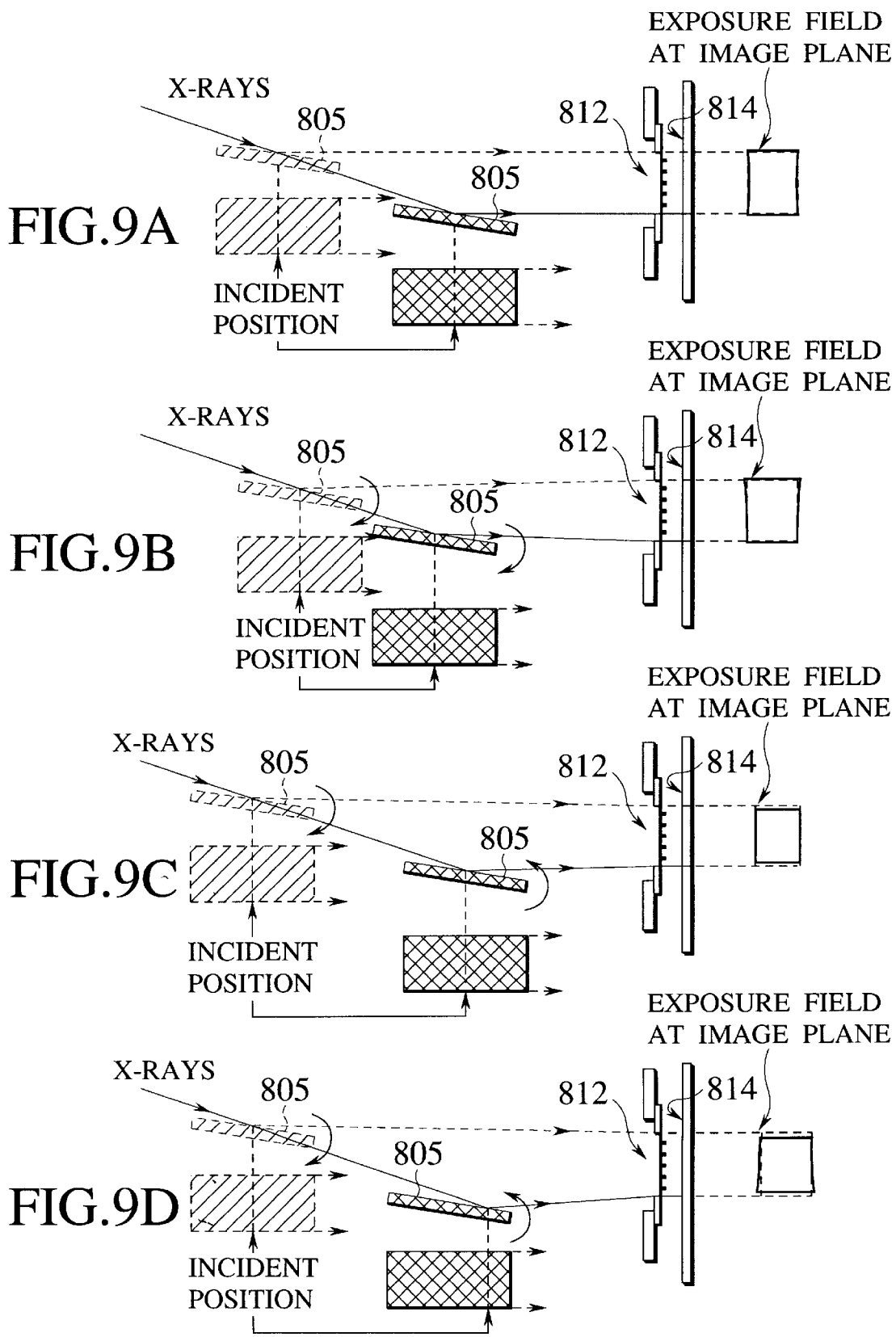
FIGS. 9A to 9D are views showing a movement of an X-ray reflection mirror according to the second embodiment of the present invention along an optical axis direction respectively.

Next, the representative examples of the case the X-ray reflection mirror 805 is moved in parallel with the optical axis direction of the X-ray beam will be shown in FIGS. 9A to 9D. Where the "optical axis direction of the X-ray beam" does not mean an traveling axis after the X-ray beam has been reflected by the X-ray reflection mirror 805, but means the same direction as the incident direction of the X-ray beam into the X-ray reflection mirror 805. As shown in FIG. 9A, in an arrangement wherein the X-ray beam is radiated vertically onto the pattern surface of the X-ray mask 812 with keeping the incident angle/the reflection angle into/from the X-ray reflection mirror 805 constant, if the X-ray reflection mirror 805 is moved in parallel with the optical axis direction, divergence of the X-ray beam along the vertical direction of the exposure field on the wafer 814 can be made zero in fact. As shown in FIGS. 9B and 9C, if the incident angle of the X-ray beam into the X-ray reflection mirror 805 is changed by rocking the X-ray reflection mirror 805 and together the X-ray reflection mirror 805 is shifted in the optical axis direction, magnification and reduction of the exposure field in the vertical direction can be achieved. In addition, as shown in FIG. 9D, if the incident position on the X-ray axis of the X-ray reflection mirror 805 is changed, the horizontal divergence angle of the X-ray beam can be controlled.

Next, an example of exposure sequence in an X-ray lithography method according to the second embodiment of the present invention will be explained with reference to a flowchart shown in FIG. 10 hereunder. Where, the same reference numerals are assigned to the same steps in FIG. 7.

(a) First, in step S101, the X-ray mask 812 and the wafer 814 are loaded into the X-ray exposure chamber 809 and then placed on the mask stage 813 and the wafer stage 815 respectively. Then, in step S102, the gap setting between the X-ray mask 812 and the wafer 814, orientation control of the X-ray mask 812, and the orientation control of the wafer 814, and the orientation control of the wafer 814 are carried out. Then, in step S103, the wafer 814 is moved into the predetermined exposure field.

Figure 10:
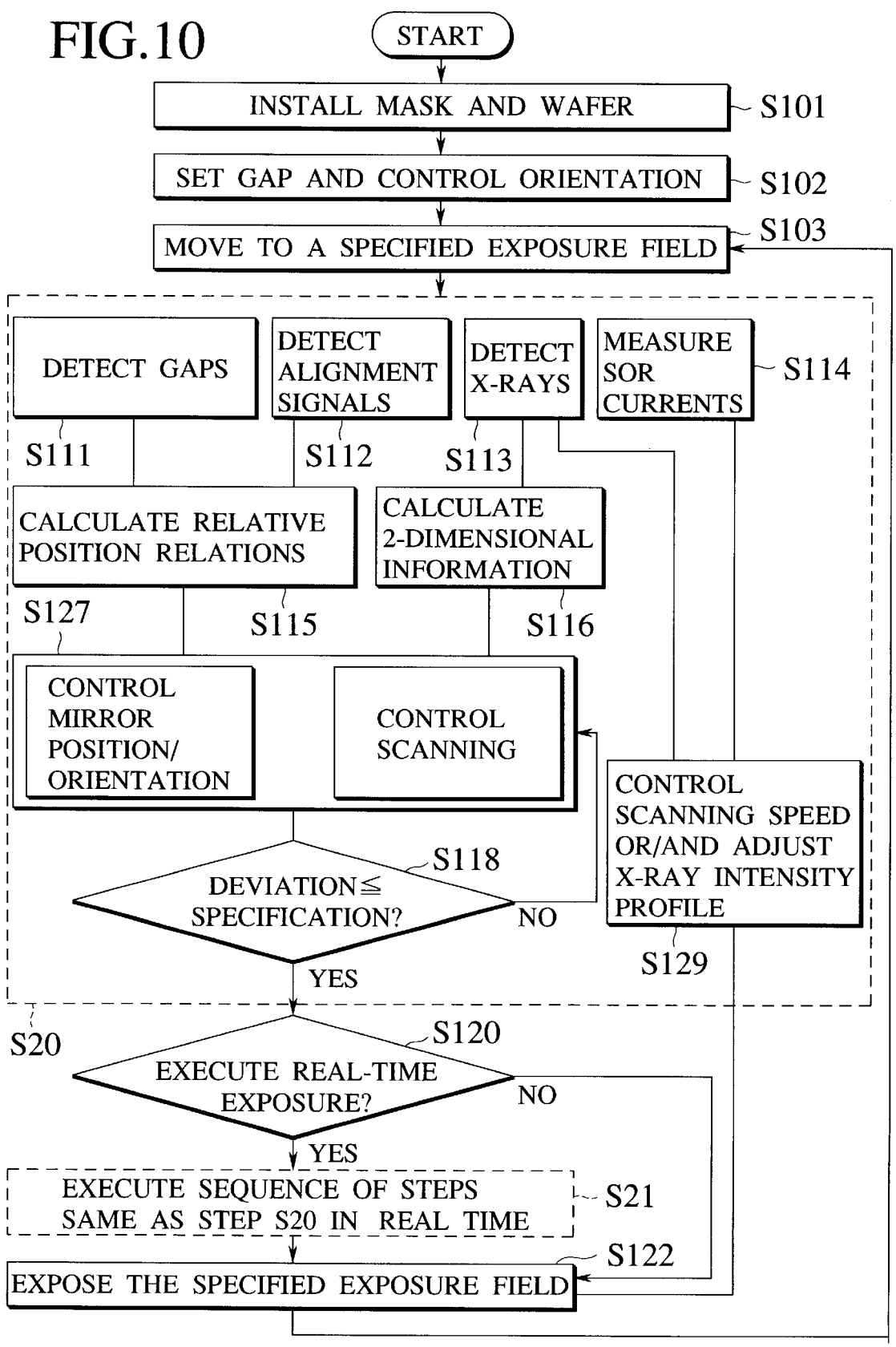
FIG. 10 is a flowchart showing exposure sequence of X-ray lithography according to the second embodiment of the present invention.

(b) The processes are advanced to step S20 indicated by a broken line in FIG. 10 from now. More particularly, in step S111, the gap between the X-ray mask 812 and the wafer 814 is detected. In step S112, position signals are detected from the alignment marks 902 on the X-ray mask 812 and the alignment marks 904 on the wafer 814. In step S115, the alignment controlling unit 821 calculates relative positional relationships (positional displacement, distortion, etc.) between the X-ray mask 812 and the wafer 814, based on the position signals derived from the alignment marks 902 on the X-ray mask 812 and the alignment marks 904 on the wafer 814. In step S113, the X-ray beam can be detected. In step S116, the alignment controlling unit 821 calculates horizontal and vertical collimation of the X-ray beam as two dimensional information by using this detection signal. The relative positional information of the patterns are transferred to the mask stage controlling unit 818 and the wafer stage controlling unit 819, and then the alignment operation is controlled by the mask stage controlling unit 818 and the wafer stage controlling unit 819. The mask stage controlling unit 818 controls the mask stage driving unit 816 while the wafer stage controlling unit 819 controls the wafer stage driving unit 817, whereby the step-and-repeat alignment operation can be controlled.

(c) At the same time, the positional information supplied from the alignment controlling unit 821 are transfer to the X-ray reflection mirror controlling unit 910. In step S127, the X-ray reflection mirror controlling unit 910 controls both the incident position and the incident angle of the X-ray beam relative to the X-ray reflection mirror 805, the orientation of the X-ray reflection mirror 805, and movement in parallel with the optical axis (mirror scanning amount) of the X-ray reflection mirror 805, based on the positional information and the signal information from the X-ray detector 807. This control is set by the X-ray reflection mirror driving unit 911 and the X-ray reflection mirror scanning mechanism 912 such that a distance between the X-ray mask 812 and the wafer 814 can be kept at a predetermined gap, the divergence angles of the X-ray beam can be set to desired angles in both the horizontal and vertical directions, and also the alignment accuracy between the X-ray mask 812 and the wafer 814 can be suppressed less than a desired standard value on a calculation. This can be set by carrying out loops in step S127 and step S118 repeatedly until the positional displacement falls within the desired standard, while checking in step S118 whether or not the positional displacement becomes less than the desired standard. In case the divergence angle of the X-ray beam incident into the X-ray mask 812 is optimized, it is checked by the X-ray reflection mirror controlling unit 910, before starting exposure by opening the X-ray shutter 808, whether or not the divergence angle of the X-ray beam detected by the X-ray detector 807 has satisfied predetermined conditions of objective exposure fields of the X-ray mask 812 and the wafer 814. Then, above setting of the X-ray reflection mirror 805 is repeated until it has been checked by the X-ray reflection mirror controlling unit 910 that such predetermined conditions can be satisfied.

(d) Meanwhile, in step S114, the storage current value in the SOR ring is measured. In step S129, a scanning speed of the X-ray reflection mirror 805 in the direction parallel with the optical axis is controlled based on either the storage current value in the SOR ring or an X-ray intensity detected in step S113 to obtain the desired exposure dose. This scanning speed of the X-ray reflection mirror 805 by the X-ray reflection mirror scanning mechanism 912 in the direction parallel with the optical axis is controlled by the X-ray reflection mirror controlling unit 910.

(e) In step S120, if it is decided that "execute real-time exposure", the process in step S21 which is identical to step S20 is carried out. If it is decided that "don't execute real-time exposure", the process is goes to step S122 in which a predetermined exposure field is exposed. In step S21, positional signals which correspond to the position of the exposure field are detected in real time from the alignment marks 902 on the X-ray mask 812 and the alignment marks 904 of the exposure field on the wafer 814, which is being exposed, by the optical alignment system 820 even during exposure. Then, positional information of the pattern on the X-ray mask 812 and positional information of the pattern on the wafer 814, which are formed by the alignment controlling unit 821 based on such positional signals, are transfer to the X-ray reflection mirror controlling unit 910. Then, the X-ray reflection mirror controlling unit 910 controls the incident position and the incident angle of the X-ray beam into the X-ray reflection mirror 805 and the orientation of the X-ray reflection mirror 805, based on the signal information detected by the X-ray detector 807 in real time using such information as references. This control is performed to satisfy such conditions that the divergence angle of the X-ray beam incident into the X-ray mask 812 can be set to less than the desired standard in both the horizontal and the vertical direction and also the alignment accuracy between the X-ray mask 812 and the wafer 814 can be set to less than the desired standard on a calculation. At this time, while the X-ray reflection mirror 805 is being driven in real time by the X-ray reflection mirror driving unit 911 and the X-ray reflection mirror scanning mechanism 912, both the mask stage controlling unit 818 and the wafer stage controlling unit 819 control the mask stage driving unit 816 and the wafer stage driving unit 817 in synchronous with the movement (scanning operation) of the X-ray reflection mirror 805 along the optical axis direction of the X-ray beam so as to conduct the mask alignment(step S21). In this way, the step-and-repeat exposure is applied to the predetermined exposure field on the wafer 814 (step S122). Then, the process returns to step S103 and then the exposures on succeeding exposure fields are repeated according to steps S20, S21, etc. Like the above, the exposure fields are moved sequentially and the alignment operations are performed in sequence to expose the wafers 814 respectively.

As stated in the first embodiment, the X-ray beam having the beltlike shape is scanned along the vertical direction of the exposure field on the X-ray mask 812 and is employed to expose the wafer 814. In addition, adjustment of an X-ray intensity distribution, e.g., an assurance of the in-plane uniformity of the X-ray exposure dose, etc., if the case may be, is performed by the X-ray intensity distribution adjusting means 823, which is same as the one stated in the first embodiment.

THIRD EMBODIMENT

Figure 11:
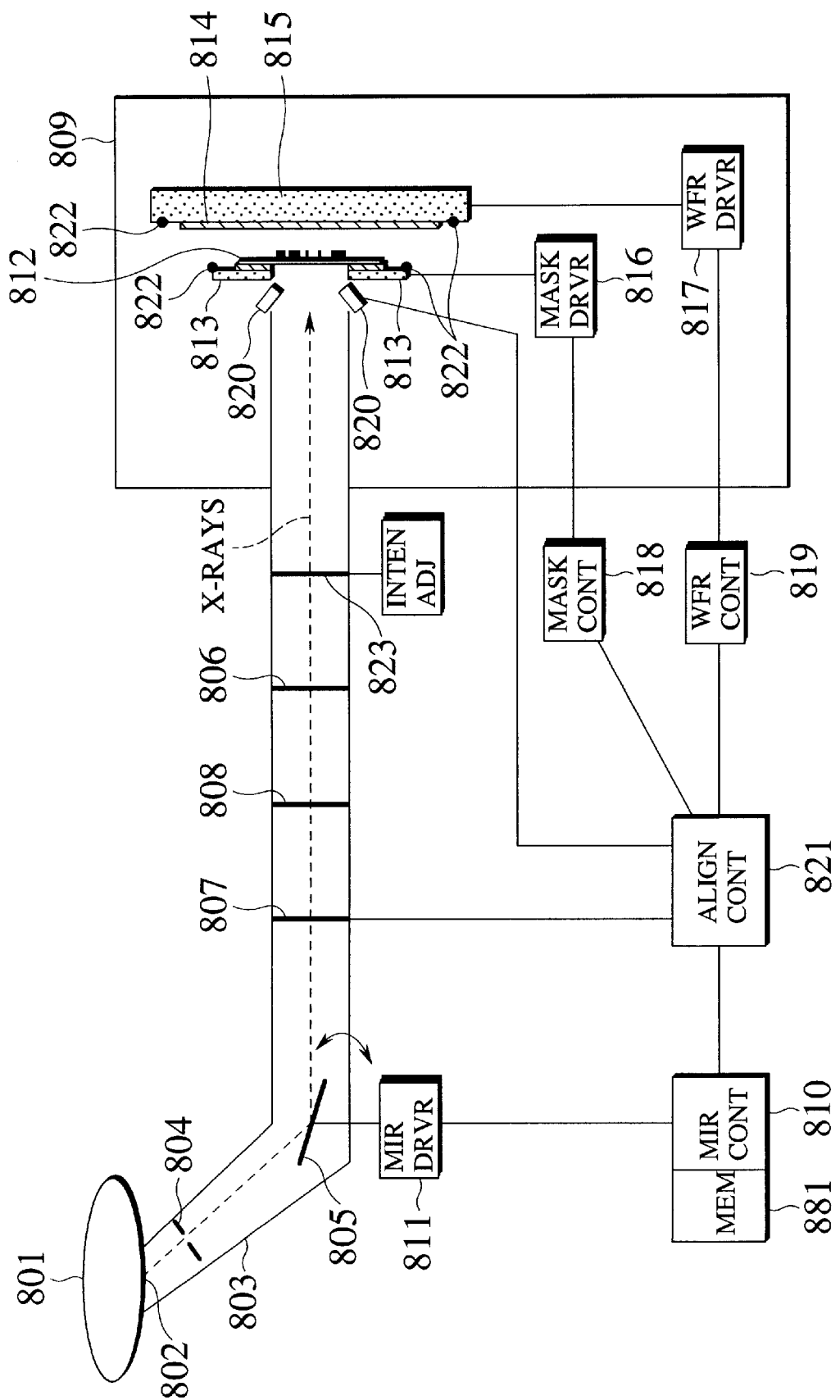
FIG. 11 is a view showing a schematic configuration of an X-ray lithography system according to a third embodiment of the present invention.

In the first and second embodiments, the real-time exposure has been explained. In the real-time exposure, while detecting the alignment signals of the exposure fields on the X-ray mask and the wafer sequentially in real time according to the in-plane position of the exposure field, the necessary constituent elements such as the X-ray reflection mirror, etc., are drive and controlled, based upon at least one of the positional information as for the relative positional relationship and an absolute displacement amount. As shown in FIG. 11, if a data storing portion 881 is provided in the X-ray mirror controlling unit 810 to store data of the mirror drive control therein, the alignment accuracy can be improved by correcting positional distortion based on the stored data.

An X-ray lithography system shown in FIG. 11 comprises at least the synchrotron ring 801 for generating the SOR beam, the X-ray beam output port 802, the beam line 803 which is evacuated up to ultra-high vacuum, the aperture 804 for restricting the X-ray area, the X-ray reflection mirror 805, the isolation window 806 for isolating the ultra-high vacuum on the beam line side with the atmospheric pressure on the exposure chamber side, the X-ray detector 807, the X-ray shutter 808, and the X-ray exposure chamber 809. The X-ray reflection mirror driving unit 811 which is controlled by an X-ray reflection mirror controlling unit 810 is connected to the X-ray reflection mirror 805. The X-ray reflection mirror controlling unit 810 controls/drives the incident position of the X-ray beam and the orientation and rocking of the mirror 805. A data storing portion 881 such as RAM, etc. which stores data concerning mirror drive control is connected to or built in the X-ray reflection mirror controlling unit 810. At least one of relative positional relationship information, mask position information as for the mask position on an overall exposure field, data of the divergence angle of the X-ray beam, data of exposure conditions such as the gap, etc. are stored in the data storing portion 881. The data storing portion 881 may be placed at any concrete position. For example, the data storing portion 881 may be placed in the inside of the X-ray exposure chamber 809. The X-ray detector 807 is employed to measure horizontal and vertical collimation of the X-ray beam reflected by the X-ray reflection mirror 805 as two dimensional information. This two dimensional information are input into the X-ray reflection mirror controlling unit 810. In addition, these information are read and used to drive the X-ray reflection mirror 805.

The X-ray exposure chamber 809 is similar to those in the first and second embodiments. The X-ray mask 812 is held on the mask stage 813 and the wafer 814 is held on the wafer stage 815. The mask stage driving unit 816 and the mask stage controlling unit 818 for controlling the unit 816 are connected to the mask stage 813, and the wafer stage driving unit 817 and the wafer stage controlling unit 819 for controlling the unit 817 are connected to the wafer stage 815.

Figure 12:
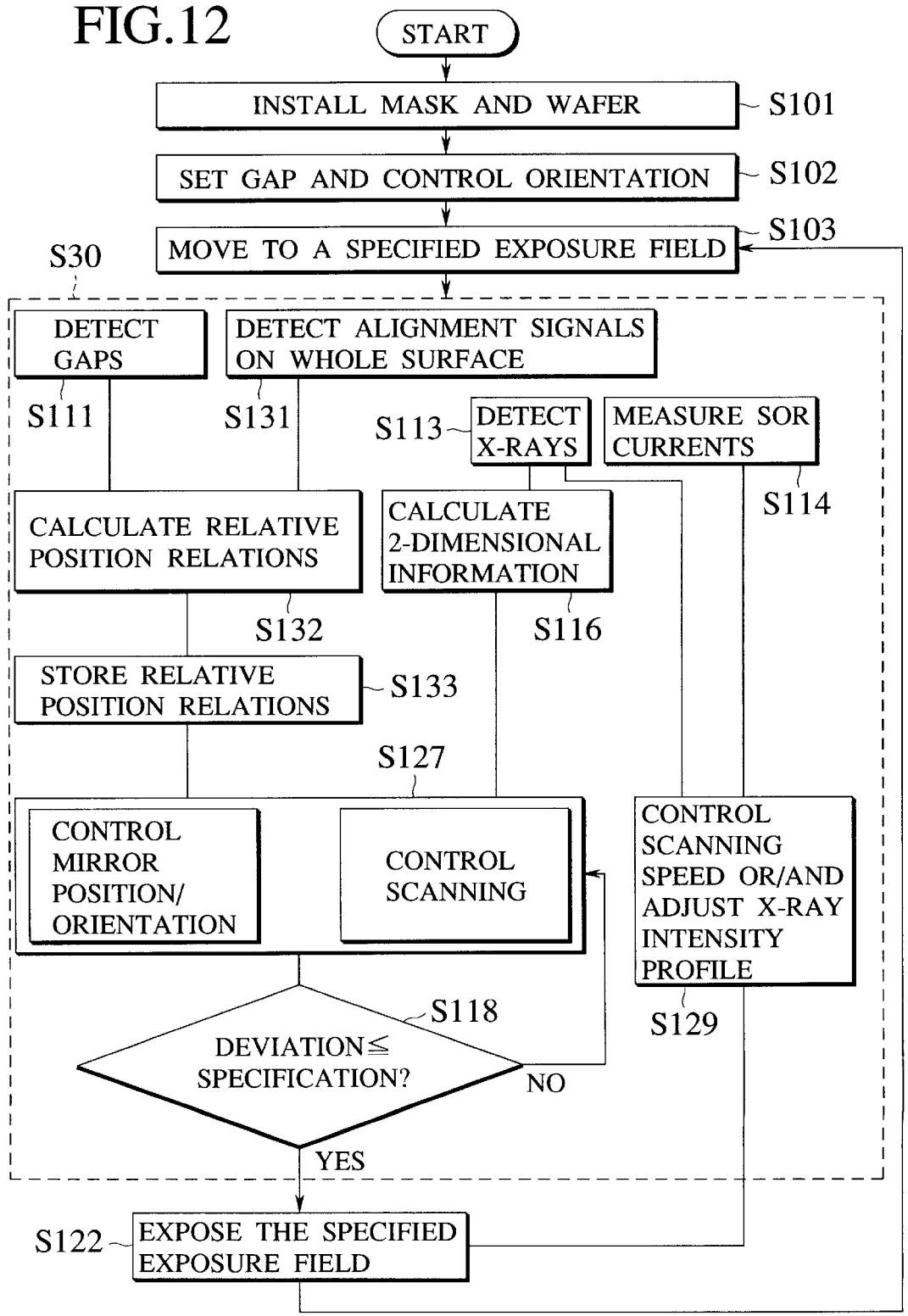
FIG. 12 is a flowchart showing exposure sequence of X-ray lithography according to the third embodiment of the present invention.
Figure 13:
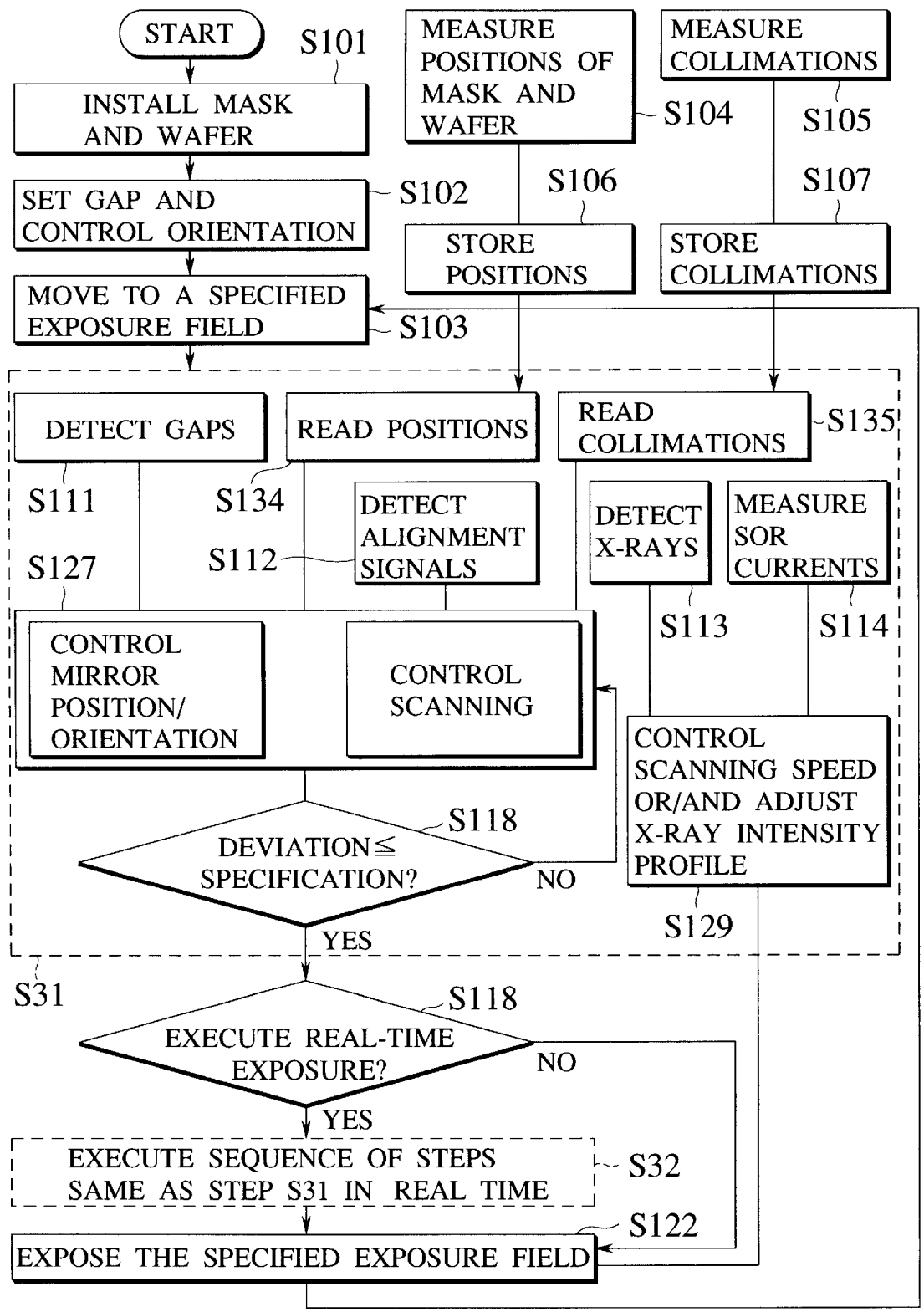
FIG. 13 is a flowchart showing exposure sequence of X-ray lithography according to a modification of the third embodiment of the present invention.
Figure 14:
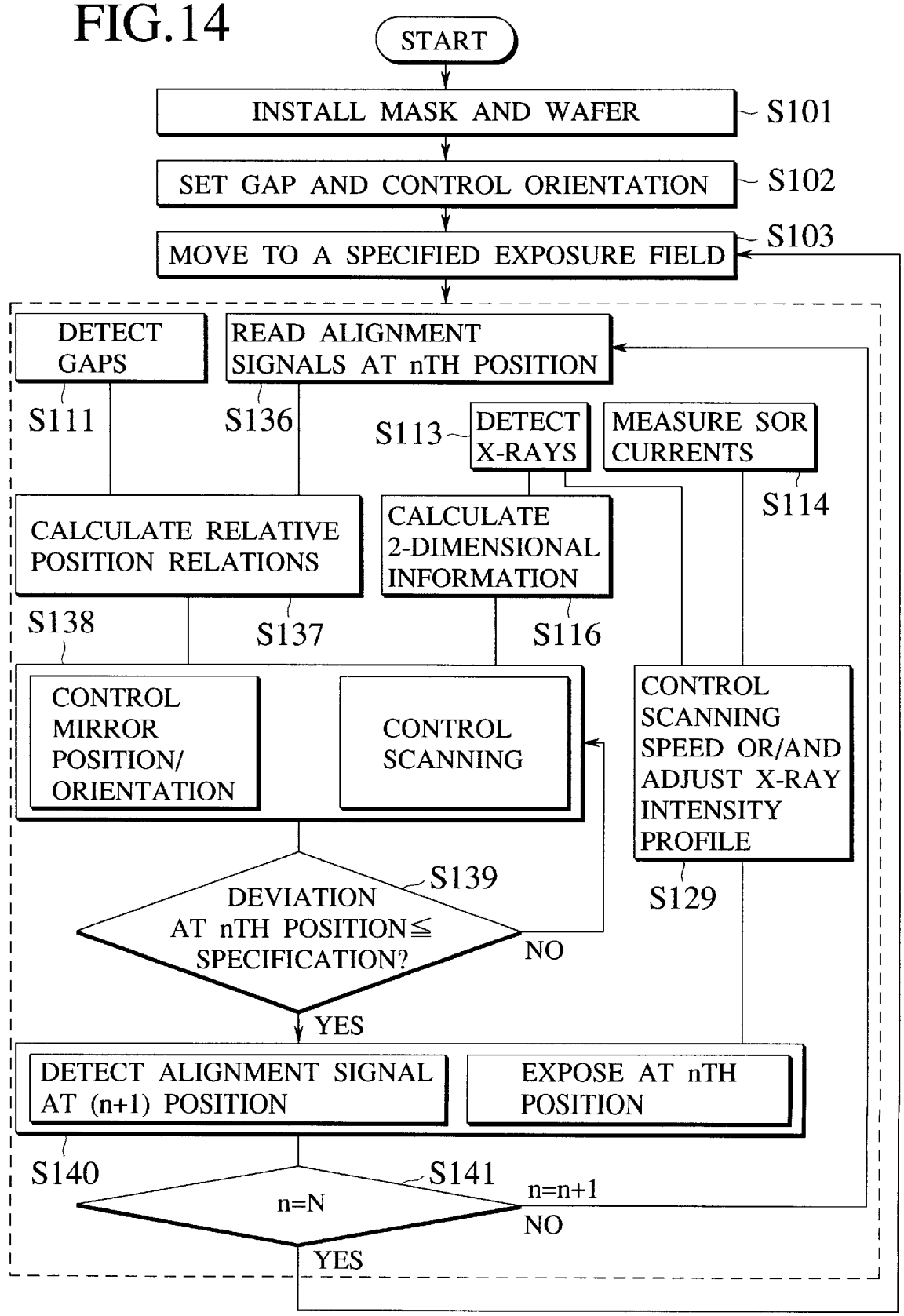
FIG. 14 is a flowchart showing exposure sequence of X-ray lithography according to another modification of the third embodiment of the present invention.

In the third embodiment of the present invention, an alignment and exposure may be performed in compliance with exposure sequence of X-ray lithography shown in FIGS. 12 to 14. In flowcharts shown in FIGS. 12 to 14, the same references are assigned to the same steps as those in the flowchart shown in FIG. 7 and their explanation will be omitted.

FLOWCHART IN FIG. 12

After the wafer 814 has been installed in the exposure chamber 809 and moved to the predetermined exposure field via step S101 to step S103, positional displacement information are detected from the alignment marks on the overall surface in step S131. More particularly, prior to starting irradiation of the X-ray beam actually, positional displacement information are detected from the alignment marks on the overall surface of the objective exposure field in step S131. And then, relative positional relationship (positional displacement, distortion, etc.) between the patterns of the X-ray mask 812 and the wafer 814 are calculated by using the detected alignment marks on the overall surface and the gap information in step S132. In step S133, data calculated in step S132 are stored in the data storing portion 881. In step S127, the incident position and the incident angle of the X-ray beam relative to the X-ray reflection mirror 805 and the orientation of the X-ray reflection mirror 805 and movement (mirror scanning amount) in parallel with the optical axis are controlled, by controlling the actually necessary operation of the X-ray reflection mirror driving unit 811, based on data stored in the data storing portion 881. Like the above, the alignment exposure can be executed sequentially.

FLOWCHART IN FIG. 13

In the flowchart in FIG. 13, firstly, positions of the X-ray mask 812 and the wafer 814 are measured in step S104. And then, collimation of the X-ray beam formed according to the incident angle and the incident position of the X-ray reflection mirror 805 is measured in step S105. In step S106, the data of relative positional relationship between the X-ray mask 812 and the wafer 814 measured in step S104 are stored in the data storing portion 881. At the same time, in step S107, the data of collimation of the X-ray beam measured in step S105 are stored in the data storing portion 881. Then, the data of relative positional relationship stored in the data storing portion 881 are read in step S134, and then the data of collimation of the X-ray beam stored in the data storing portion 881 are read in step S135. In this manner, while reading the data, which are detected prior to starting the irradiation of the X-ray beam actually and then stored, from the data storing portion 881, the actually necessary operations of the X-ray reflection mirror driving unit 811 are controlled in step S127. In other words, the X-ray reflection mirror controlling unit 910 controls the incident position and the incident angle of the X-ray beam relative to the X-ray reflection mirror 805 and the orientation of the X-ray reflection mirror 805 and the movement (mirror scanning amount) in parallel with the optical axis, based on the data of relative positional relationship and the data of collimation of the X-ray beam. Like the above, the alignment exposure can be executed sequentially by controlling the operation of the X-ray reflection mirror driving unit 811.

FLOWCHART IN FIG. 14

As shown in a flowchart of FIG. 14, it is possible to execute a parallel processing. That is, after the predetermined exposure field is segmented into N areas (n=1 to N), information of the next scanned position (n+1-th position) may be detected while the X-ray beam is being irradiated actually to the present field position (n-th position), instead of detecting the positional information of the overall exposure field. In other words, the alignment positional signal at the n-th field position stored in the data storing portion 881 are read in step S136, and then the relative positional relationships (positional displacement, distortion) at the n-th position are calculated in step S137. In step S138, the incident position and the incident angle of the X-ray beam relative to the X-ray reflection mirror 805 and the orientation of the X-ray reflection mirror 805 and the movement (mirror scanning amount) in parallel with the optical axis are controlled based on the relative positional information at the n-th position and the two dimensional information of the X-ray beam. While determining whether or not the relative positional relationship (positional displacement) at the n-th position becomes below the desired standard in step S139, loops in step S138 and step S139 are carried out repeatedly until the positional displacement can be reduced less than the desired standard. In this manner, if the positional displacement have been less than the desired standard, the n-th field position is irradiated actually by the X-ray beam to expose in step S140. At the same time, in step S140, information of the succeedingly scanned position (n+1-th position) are detected prior to the present field position (n-th position), to which the X-ray is irradiated actually, and then stored in the data storing portion 881. Then, in step S141, it is decided whether or not n=N. If "negative", n is set to n=n+1 and the process returns to step S136. If "affirmative", the process returns to step S103 and goes to the next exposure field. Thus, prior to the field position (n-th position) to which the X-ray is irradiated actually to expose, information of the succeedingly scanned position (n+1-th position) are detected and calculated sequentially and then stored in the data storing portion 881, so that the predetermined field positions which are segmented into N areas can be exposed sequentially. Further, in the step-and-repeat operation, information of the succeedingly scanned position can be stored in the data storing portion 881 and necessary constituent elements of the X-ray lithography system can be driven and controlled based on the data to enable the alignment exposure.

It is possible to obtain the relative positional information of beyond the next position (n+1-th position) beforehand, such as the relative positional information of n+2-th position, or n+3-th position, . . . , while a present field position (n-th position) is irradiated by the X-ray beam.

It is further possible to perform the position detection previously without loading of the X-ray mask 812 and the wafer 814 into the X-ray exposure chamber 809, then store the data in the data storing portion 881, and then perform the exposure based on the data.

Figure 15:
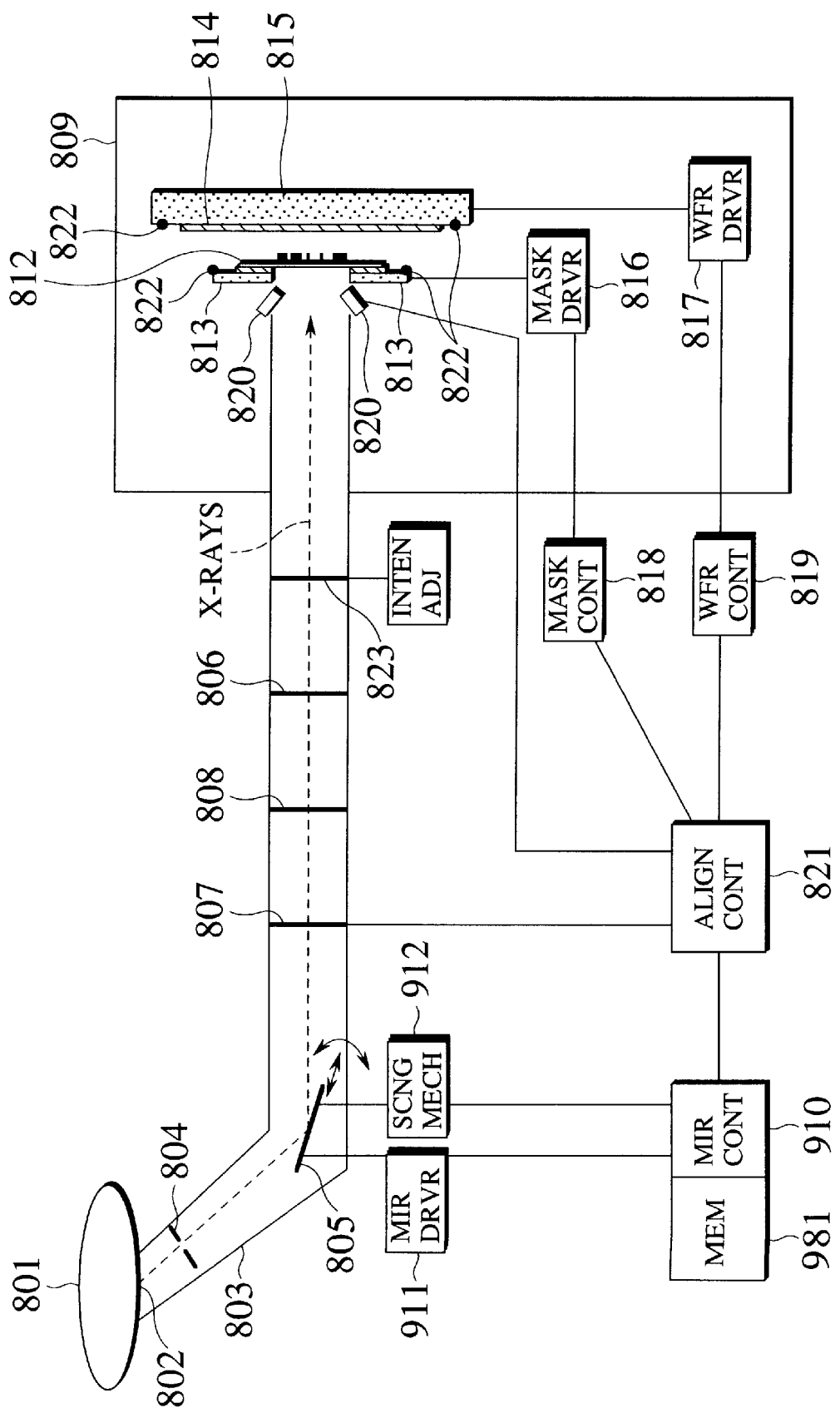
FIG. 15 is a view showing a schematic configuration of an X-ray lithography system according to a modification of the third embodiment of the present invention.

Three exposure sequences shown in FIGS. 12 to 14 make possible suitable employment according to the exposure object if a part or all of such three exposure sequences are executed in combination with the exposure sequence shown in FIG. 7 or FIG. 10. As a consequence, the advantages of the present invention can become more remarkably. If they are employed in combination with the exposure sequence shown in FIG. 10, a data storing portion 981 may be connected to the X-ray reflection mirror controlling unit 910, as shown in FIG. 15, otherwise a data storing portion may be built in the X-ray reflection mirror controlling unit 910. Information of the relative positional relationship of the overall exposure fields, the collimation of the X-ray beam, etc. may be stored in this data storing portion 981.

In the step-and-repeat exposure, the alignment positional signal at the n+1-th field position may be detected in advance at the time of exposure of the n-th field position and then such information may be stored in the data storing portion 981.

Moreover, not only the alignment exposure method like the die-by-die system wherein the positional information are detected every exposure field and then the X-ray reflection mirror drive/control is optimized every field, but also the alignment exposure method like the global alignment system can be employed. In the global alignment system, the drive and control of the X-ray reflection mirror is optimized, based on the positional information of the particular exposure field on the wafer 814, and then the alignment exposure of remaining field is performed by using this optimized drive and control, as a representative control mode. If such method is employed, higher speed exposure process can be achieved.

In addition, as with the shape of the X-ray reflection mirror 805, the shape shown in FIG. 3A is easily applied to the present invention. However, if the reflection mirror whose in-plane profiles are different according to the positions is employed, data of the divergence angle of the X-ray beam formed according to the incident position and the incident angle into the surface of the X-ray mirror 805, etc. may be measured in advance and then such data may be stored in the data storing portions 881, 981. If the third embodiment of the present invention is applied by using the stored data as a data table, the alignment accuracy can be improved without damaging various effects achieved in the first and second embodiments, so that there is the merit that the exposure can be handled in a short time.

FOURTH EMBODIMENT

Figure 16:
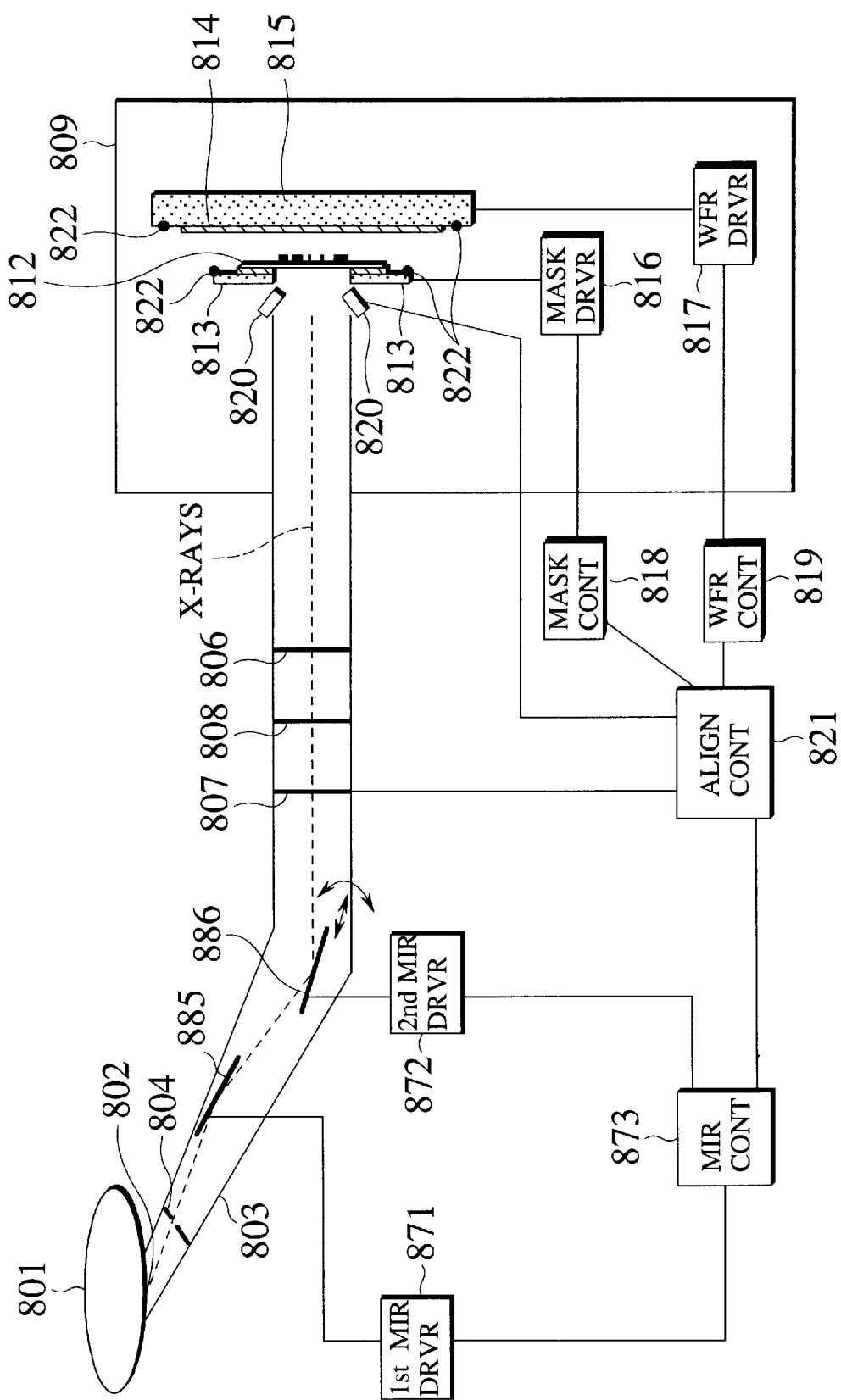
FIG. 16 is a view showing a schematic configuration of an X-ray lithography system according to a fourth embodiment of the present invention.

FIG. 16 is a view showing a schematic configuration of an X-ray lithography system according to a fourth embodiment of the present invention. The fourth embodiment of the present invention corresponds to the case where a first X-ray reflection mirror 885 and a second X-ray reflection mirror 886 are employed and the second X-ray reflection mirror 886 is swung. A distance between the second X-ray reflection mirror 886 and the X-ray mask 812 is kept substantially constant.

More particularly, the X-ray lithography system shown in FIG. 8 comprises, as major constituent elements, at least the synchrotron ring 801 for generating the SOR beam, the X-ray beam output port 802, the beam line 803 which is evacuated up to ultra-high vacuum, the aperture 804 for restricting the X-ray area, a first X-ray reflection mirror 885, a second X-ray reflection mirror 886, the X-ray detector 807, the X-ray shutter 808, the isolation window 806 for isolating the ultra-high vacuum on the beam line side with the atmospheric pressure on the exposure chamber side, and the X-ray exposure chamber 809. A first X-ray reflection mirror driving unit 871 which sets the incident position of the X-ray beam and the orientation of the X-ray reflection mirror is connected to the first X-ray reflection mirror 885. Similarly, a second X-ray reflection mirror driving unit 872 is connected to the second X-ray reflection mirror 886. The first X-ray reflection mirror driving unit 871 and the second X-ray reflection mirror driving unit 872 are driven and controlled by an X-ray mirror controlling unit 873. A part or all of the first X-ray reflection mirror driving unit 871 and the second X-ray reflection mirror driving unit 872 may be disposed in the beam line 803 or disposed on the outside of the beam line 803. The X-ray detector 807 is employed to measure horizontal and vertical collimation of the X-ray beam reflected by the second X-ray reflection mirror 886 as two dimensional information. This X-ray detection signal is input into the X-ray reflection mirror controlling unit 873 and used to drive two X-ray reflection mirrors 885, 886. As shown in FIG. 16, the SOR beam emitted from the synchrotron ring 801 is picked up via the aperture 804 and then the SOR beam (X-ray beam) is extended to the exposure field by rocking the X-ray reflection mirror. The SOR beam formed by the first X-ray reflection mirror 885 has a roughly beltlike geometry which is long in the horizontal direction. The SOR beam having the beltlike geometry is scanned in the vertical direction of the field by using the second X-ray reflection mirror 886 and employed to expose. In order to maintain in-plane uniformity of the exposure dose, the X-ray intensity distribution may be improved by applying the method disclosed in Patent Application Publication (KOKAI) Hei 3-237400 to the isolation window 806 previously. This method is that the negative resist is coated on the thin film mask side of the isolation window 806, then the X-ray beam is scanned and irradiated to the window 806, and then the window 806 is taken out once to be developed, whereby the window 806 can be fabricated.

In the X-ray exposure chamber 809, the X-ray mask 812 is held on the mask stage 813 to which the mask stage driving unit 816 and the mask stage controlling unit 818 are connected. The X-ray mask 812 has the same configuration as explained with reference to FIG. 2 in the first embodiment. More particularly, the X-ray mask 812 consists of the X-ray absorption pattern (thickness of 0.4 $\mu$m) 202 made of tungsten-rhenium (W—Re) alloy, the X-ray transmission thin film (thickness of 2 $\mu$m) 203 made of silicon carbide (SiC), the Si supporting substrate (thickness of 600 $\mu$m, outer diameter of 76 mm) 204 for supporting the X-ray transmission thin film 203, and the supporting frame $SiO_2$ glass (thickness of 4 mm, outer diameter of 100 mm, opening of 60 mm $\phi$) 205 for reinforcing the above. An X-ray transmission window (42 mm square) is formed by removing a part of the Si supporting substrate 204 by virtue of back etching. An exposure field is a 20 mm×40 mm square region, and predetermined patterns are formed in this region. The wafer 814 is held on the wafer stage 815 to which the wafer stage driving unit 817 and the wafer stage controlling unit 819 are connected to perform the step-and-repeat sequential exposure. The gap between the X-ray mask 812 and the wafer 814 is set to 20 $\mu$m. The collimation of ±0.2 $\mu$m can be attained in the exposure field region of 20 mm×40 mm. Setting of the gap between the X-ray mask 812 and the wafer 814 can be adjusted and set based on the profile information signal which is obtained by the gap sensor 822 in driving respective stages to scan the X-ray mask 812 and the wafer 814. At that time, the orientation of the X-ray mask 812 is decided such that the X-ray beam which is along a center line of the circular arc formed by the rocking operation of the second X-ray reflection mirror 886 is vertically incident into the pattern surface of the X-ray mask 812. Also, the optical alignment system 820 which can detect an alignment position between the X-ray mask 812 and the wafer 814 is installed in the X-ray exposure chamber 809. The alignment controlling unit 821 is connected to the optical alignment system 820. In addition, as shown in FIG. 6, the alignment evaluation patterns 901 and the alignment marks 902 in addition to device patterns are formed on the X-ray mask 812. Similarly, the alignment evaluation patterns 903 and the alignment marks 904 in addition to device patterns are formed on the wafer 814. The alignment evaluation patterns 901, 903 are designed to have box-in-box patterns in alignment exposure and are formed in respective exposure fields 220, 221 at 9×17 points. Further, the alignment marks 902, 904 are arranged at upper and lower sides and right and left sides of the exposure fields 220, 221 respectively, and particularly right and left side alignment marks 902, 904 are aligned linearly. In the sequential exposure according to the step and repeat system, relative position between a pattern on the X-ray mask 812 and an exposure field on the wafer 814 can be detected by the optical alignment system 820, then driving of the mask stage 813 and the wafer stage 815 is controlled based on this detection signal, and then an exposure is performed in a closed-loop fashion.

Figure 17A:
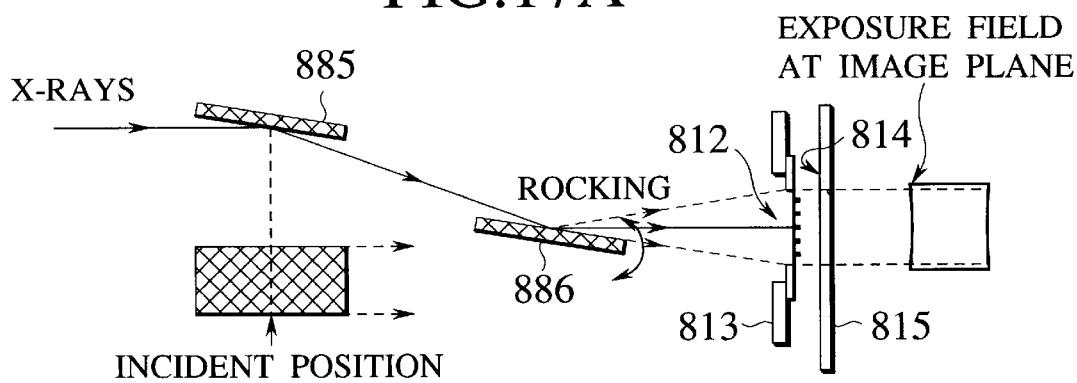
FIGS. 17A to 17C are views showing operations of first and second X-ray reflection mirrors according to the fourth embodiment of the present invention respectively.
Figure 17B:
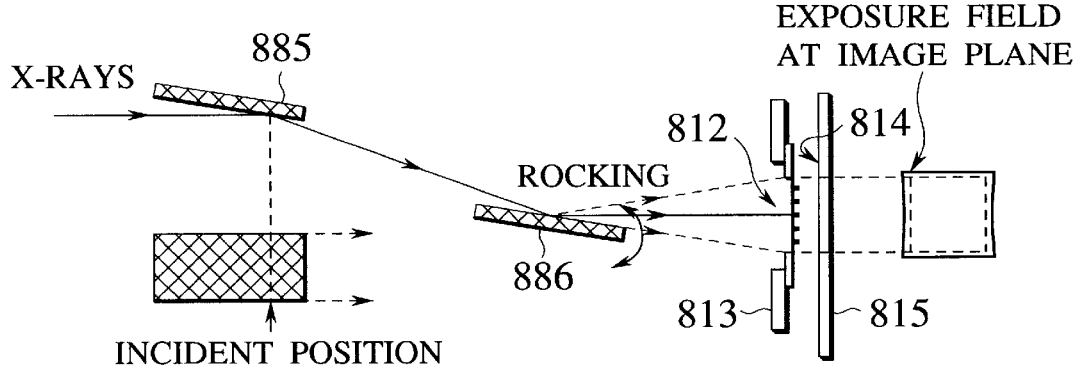
Figure 17C:
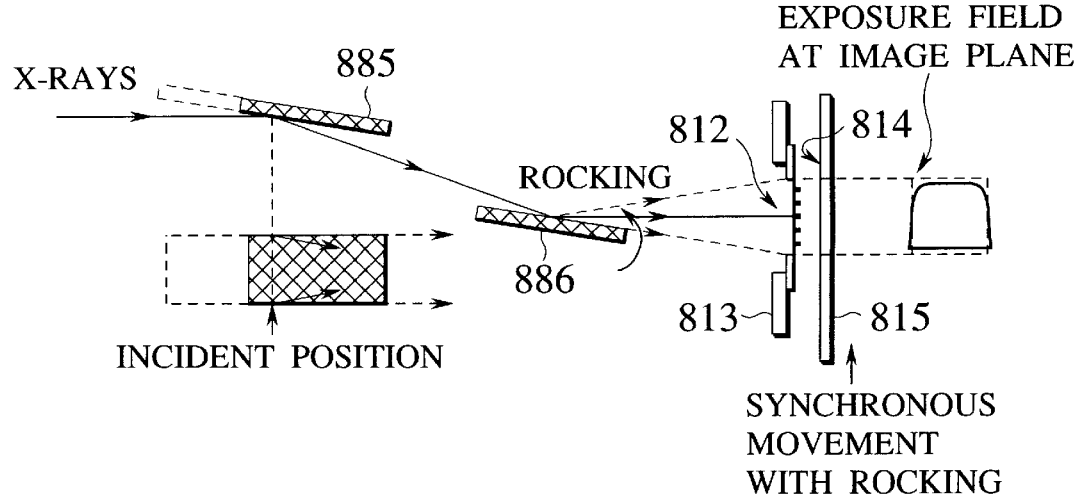

A belt-shaped X-ray beam emitted from the SOR beam source 801 has a finite divergence angle around the optical axis in the horizontal direction. But such X-ray beam, when radiated into the first X-ray reflection mirror 885 and reflected thereby, is converged and then collimated roughly into a parallel beam. As shown in FIG. 3A and FIG. 4A, as the first X-ray reflection mirror 885 employed in the present invention, such a configuration may be used that reflection characteristics are different according to the in-plane positions and the horizontal divergence angle is differentiated continuously according to the incident position of the X-ray beam. The X-ray reflection mirror shown in FIG. 3A belongs to a toroidal system and a radius of curvature is increased in the order of in-plane positions I , II , III of the X-ray reflection mirror. Also, the X-ray reflection mirror shown in FIG. 4A has such a feature that the radii of curvature are set differently at the in-plane positions I , II , III and the radius of curvature becomes substantially infinite at the in-plane position II, and signs of curvature are inverted between the in-plane positions I and II. The horizontal divergence angle of the X-ray beam can be adjusted by employing the first X-ray reflection mirror 885 as shown in FIG. 3A or FIG. 4A and selecting the incident position into the first X-ray reflection mirror 885, so that the pattern can be projected onto the wafer 814 by changing the magnification of the pattern of the X-ray mask 812 in the horizontal direction in exposure by using this. For the vertical direction of the exposure field, the vertical divergence angle of the X-ray beam can be adjusted by rocking and scanning the second X-ray reflection mirror 886. At that time, it is desired that, even after the X-ray has been reflected by the second X-ray reflection mirror 886, the horizontal divergence angle of the X-ray beam being adjusted by the first X-ray reflection mirror 885 should be hardly changed to expose. For this reason, a planar shape of the second X-ray reflection mirror 886 is easily used to preserve the divergence angle. In case, the extension of the exposure region is performed only by the rocking operation, the vertical magnification of the projected pattern becomes constant since the vertical divergence angle is determined depending upon positional relationship between the second X-ray reflection mirror 886 and the X-ray mask 812. Therefore, as described above, the vertical magnification may be adjusted by either modifying the gap between the X-ray mask 812 and the wafer 814 or moving relatively the X-ray mask 812 and the wafer 814 in the vertical direction at different velocities. However, the gap modification is not preferable since there is a problem that the X-ray transmission thin film is caused to deflect and therefore the control unit becomes complicated to suppress such deflection. In case the second X-ray reflection mirror 886 is to be swung, representative examples are shown in FIGS. 17A to 17C. FIG. 17A is the case where an amount of horizontal divergence is reduced to almost zero by the first X-ray reflection mirror 885, but the magnification of the projected pattern in the horizontal direction is not changed. FIG. 17B is the case where the divergence angle of the X-ray beam is increased by moving the first X-ray reflection mirror 885 and thus the horizontal projected pattern is increased in size rather than the exposure field. FIG. 17C is the case where the vertical magnification is reduced by moving gradually the wafer 814 in synchronous with the rocking operation of the X-ray mirror while changing the horizontal magnification by the first X-ray reflection mirror 885.

As apparent from FIGS. 17A to 17C, in the event of the configuration of the X-ray lithography system according to the fourth embodiment of the present invention, for convenience of the rocking operation of the second X-ray reflection mirror 886 to ensure the exposure field region, the divergence angle of the X-ray beam in the vertical direction of the exposure field can be enhanced. Therefore, since the pattern is projected to be expanded along the vertical direction in projection, the X-ray mask 812 which is formed smaller than the field size of the wafer 814 to estimate an expanded amount in advance must be employed. However, as described above, the vertical magnification can be adjusted by either changing the gap between the X-ray mask 812 and the wafer 814 or moving relatively the X-ray mask 812 and the wafer 814 along the vertical direction at different velocities relative to the rocking operation of the mirror.

Figure 18:
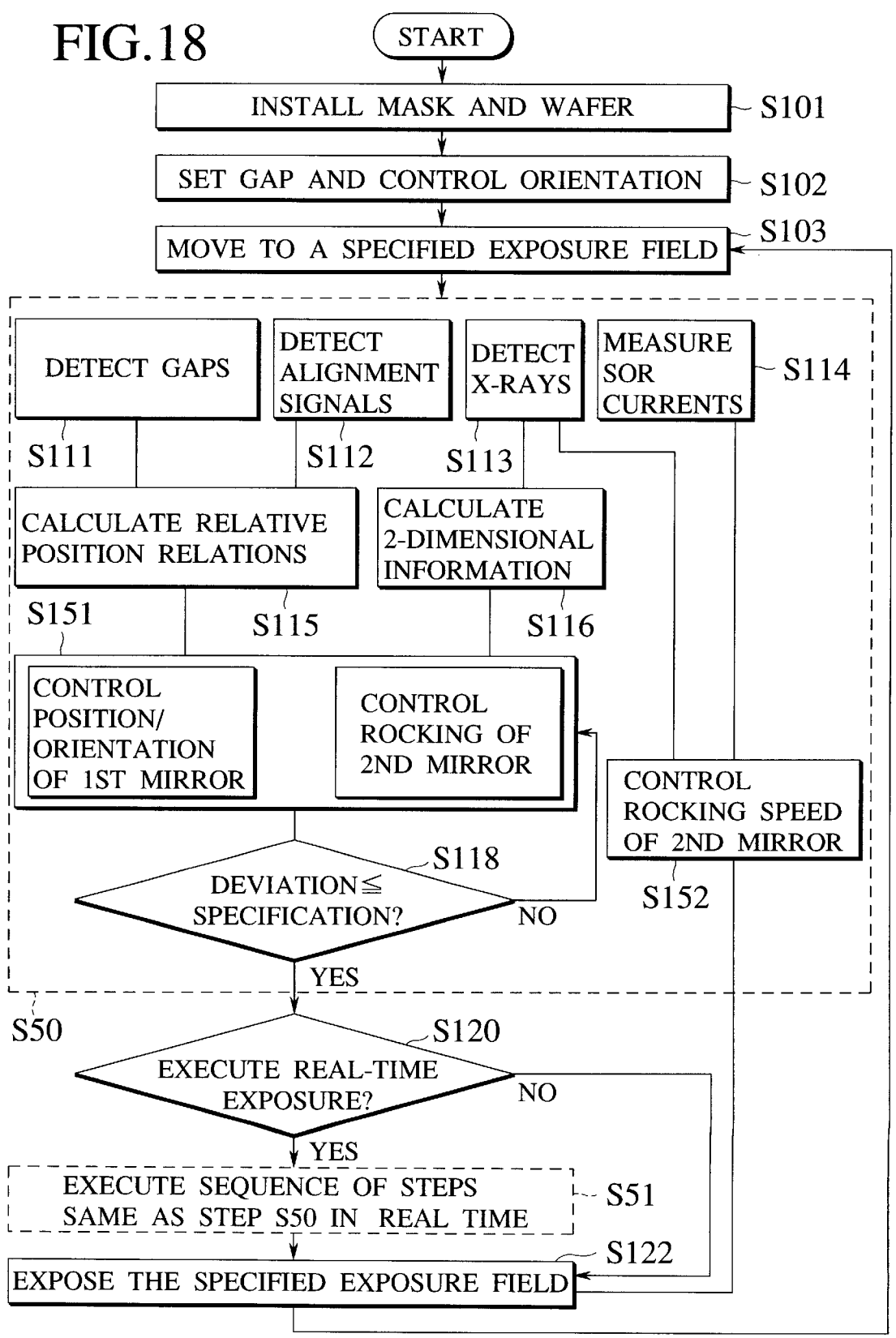
FIG. 18 is a flowchart showing exposure sequence of X-ray lithography according to the fourth embodiment of the present invention.

In turn, as shown in FIG. 18, an example of appropriate exposure sequence conducted in the present invention will be explained hereinbelow. In a flowchart shown in FIG. 18, it is to be noted that the same reference numerals are affixed to the same steps as those in FIG. 7. Flows in step S101 to step S103 are similar to those in FIG. 7 and their explanation will be omitted. Accordingly, the processes in step S50 and forth, indicated by a broken line in FIG. 18, will be explained hereinbelow.

(a) In step S111, the gap between the X-ray mask 812 and the wafer 814 is detected. In step S112, the position signals are detected from the alignment marks 902 on the X-ray mask 812 and the alignment marks 904 on the wafer 814. Then, in step S115, relative positional relationships (positional displacement, distortion, etc.) between the X-ray mask 812 and the wafer 814 are calculated by the alignment controlling unit 821 based on the position signals derived from the alignment marks 902 on the X-ray mask 812 and the alignment marks 904 on the wafer 814. In step S113, the X-ray beam can be detected. In step S116, the alignment controlling unit 821 can calculate horizontal and vertical collimation of the X-ray beam as two dimensional information by using this detection signal. The relative positional information of the patterns are transferred to the mask stage controlling unit 818 and the wafer stage controlling unit 819, and then the alignment operation is controlled by the mask stage controlling unit 818 and the wafer stage controlling unit 819.

(b) At the same time, the relative positional information supplied from the alignment controlling unit 821 are transfer to the X-ray reflection mirror controlling unit 873. In step S151, the horizontal divergence angle of the X-ray beam incident into the X-ray mask 812 is set and controlled based on the relative positional information and two dimensional information of the X-ray beam. That is, in step S151, the incident position of the X-ray beam relative to the first X-ray reflection mirror 885 and the orientation and rocking operation of the first X-ray reflection mirror 885 are set and controlled by the first X-ray reflection mirror driving unit 871 based on the relative positional information and the two dimensional information of the X-ray beam. Also, in step S151, the rocking operation of the second X-ray reflection mirror 886 can be set and controlled by the second X-ray reflection mirror driving unit 872. This setting and control is performed such that, under the condition that the predetermined gap between the X-ray mask 812 and the wafer 814 is being set, the divergence angles of the X-ray beam incident into the X-ray mask 812 can be set to desired angles in both the horizontal and vertical directions, and also the alignment accuracy between the X-ray mask 812 and the wafer 814 can be suppressed less than the desired standard on a calculation. This can be set by performing loops in step S151 and step S118 repeatedly until the positional displacement comes to the desired standard, while checking in step S118 whether or not the positional displacement is less than the desired standard. Under the condition that the desired alignment accuracy is maintained like the above, the incident position of the X-ray beam into the first X-ray reflection mirror 885 can be set by the first X-ray reflection mirror driving unit 871. In case the divergence angle of the X-ray beam incident into the X-ray mask 812 is optimized, it is checked by the X-ray reflection mirror controlling unit 873, before starting the exposure by opening the X-ray shutter 808, whether or not the divergence angle of the X-ray beam detected by the X-ray detector 807 has satisfied predetermined conditions of objective exposure fields of the X-ray mask 812 and the wafer 814.

(c) Meanwhile, in step S152, the rocking speed of the second X-ray reflection mirror 886 is controlled based on either the storage current value in the SOR ring or the X-ray intensity detected by the X-ray detector 807 to obtain a desired exposure dose. More particularly, the rocking operation of the second X-ray reflection mirror 886 carried out by the second X-ray reflection mirror driving unit 872 is controlled by the X-ray reflection mirror controlling unit 873.

(d) In step S120, if it is decided that "execute real-time exposure", the process in step S51 which is identical to step S50 is carried out. If it is decided that "don't execute real-time exposure", the process is advanced to step S122 in which a predetermined exposure field is exposed. In step S51, positional signals which correspond to the position of the exposure field are detected in real time from the alignment marks 902 on the X-ray mask 812 and the alignment marks 904 of the exposure field on the wafer 814, which is being exposed, by the optical alignment system 820 even during exposure. Then, positional information of the pattern on the X-ray mask 812 and positional information of the pattern on the wafer 814, which are formed by the alignment controlling unit 821 based on such positional signals, are transfer to the X-ray reflection mirror controlling unit 873. Then, the horizontal divergence angle of the X-ray beam incident into the X-ray mask 812 is controlled based on such positional information and the X-ray information detected by the X-ray detector 807 in real time. Adjustment of the divergence angle of the X-ray beam can be set to satisfy the conditions that the alignment accuracy between the X-ray mask 812 and the wafer 814 is set to less than the desired standard on a calculation. That is, the incident position of the X-ray beam into the first X-ray reflection mirror 885 and the orientation of the first X-ray reflection mirror 885 can be adjusted in real time by the X-ray reflection mirror driving unit 871 in synchronous with the rocking operation of the second X-ray reflection mirror 886. Then, drives of respective stages are controlled by the mask stage controlling unit 818 and the wafer stage controlling unit 819 to perform sequentially the alignment exposure (step S51). In this way, the step-and-repeat exposure is applied to the predetermined exposure field on the wafer 814 (step S122). Then, the process returns to step S103, and then the exposures on succeeding exposure fields are repeated according to steps S50, S51, etc.

FIFTH EMBODIMENT

In the above fourth embodiment, the case has been explained where the reflection mirror is swung with keeping the distance between the second X-ray reflection mirror and the X-ray mask constant. Since the exposure field is expanded by rocking the X-ray reflection mirror, the projected pattern has always been extended larger than the field on the X-ray mask along the vertical direction and then projected on the exposure field. Therefore, the pattern of the X-ray mask which is smaller in size than the field size on the wafer to estimate the extended amount previously has had to be employed. In order to change the vertical magnification so as to avoid the above, the exposure has had to be performed by either adjusting the gap between the X-ray mask and the wafer or shifting the wafer with respect to the rocking operation of the X-ray reflection mirror. However, if the gap is adjusted, the size of the projected pattern has been changed in the horizontal and vertical directions. Hence, since the horizontal magnification must be adjusted once again when separate magnifications are desired in two directions, there has had a fear that control becomes complicated. Also, according to a modified amount of the gap, there are many trouble aspects in control, e.g., reduction in exposure margin is caused to achieve shorter dimension accuracy and dimensional linearity, the X-ray transmission thin film of the X-ray mask is bent, and others. As an example to improve such circumstances, a fifth embodiment of the present invention shown hereunder will be explained.

Figure 19:
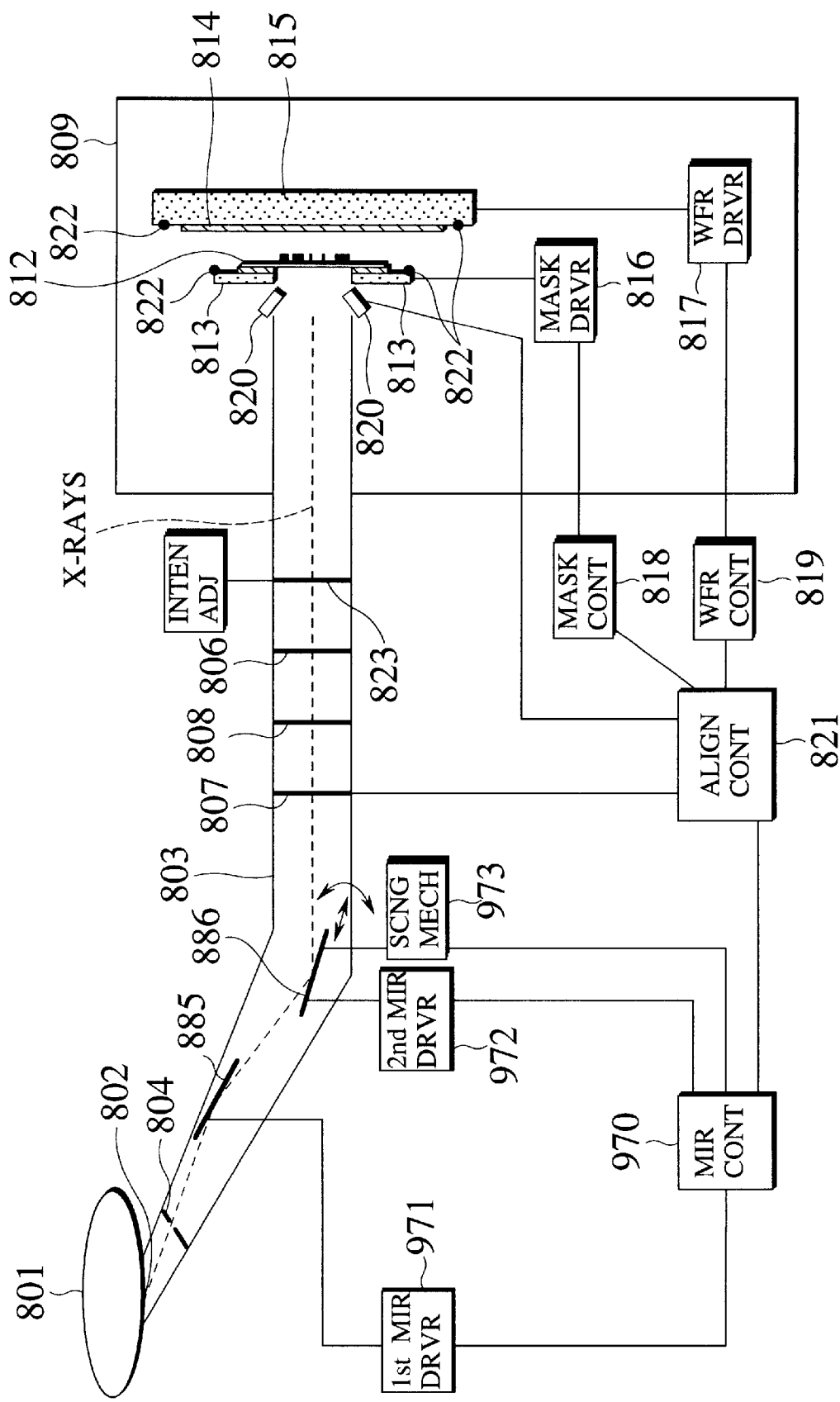
FIG. 19 is a view showing a schematic configuration of an X-ray lithography system according to a fifth embodiment of the present invention.

FIG. 19 is a view showing a schematic configuration of an X-ray lithography system according to a fifth embodiment of the present invention. The fifth embodiment of the present invention corresponds to the case where a first X-ray reflection mirror 885 and a second X-ray reflection mirror 886 are employed and then the second X-ray reflection mirror 886 is moved in parallel with the optical axis of the X-ray beam.

The X-ray lithography system shown in FIG. 19 comprises at least the synchrotron ring 801 for generating the SOR beam, the X-ray beam output port 802, the beam line 803 which is evacuated up to ultra-high vacuum, the aperture 804 for restricting the X-ray area, the first X-ray reflection mirror 885, the second X-ray reflection mirror 886, the X-ray detector 807, the X-ray shutter 808, the isolation window 806 for isolating the ultra- high vacuum on the beam line side with the atmospheric pressure on the exposure chamber side, and the X-ray exposure chamber 809. A first X-ray reflection mirror driving unit 971 which drives the incident position of the X-ray beam and the orientation of the X-ray reflection mirror is connected to the first X-ray reflection mirror 885. Similarly, a second X-ray reflection mirror driving unit 972 and an X-ray reflection mirror scanning mechanism 973 are connected to the second X-ray reflection mirror 886. The first X-ray reflection mirror driving unit 971, the second X-ray reflection mirror driving unit 972, and the X-ray reflection mirror scanning mechanism 973 are driven and controlled by a mirror controlling unit 970. In FIG. 19, the second X-ray reflection mirror driving unit 972 and the X-ray reflection mirror scanning mechanism 973 are set forth as separate bodies mutually, but they are merely a schematic representation as a system configuration. It is a matter of course that, as an actual physical or mechanical configuration, they may be integrated as a single body. Otherwise, they may be constructed as separate bodies. In addition, it should be selected according to design that a part or all of the first X-ray reflection mirror driving unit 971, the second X-ray reflection mirror driving unit 972, and the X-ray reflection mirror scanning mechanism 973 are disposed in the beam line 803 or disposed on the outside of the beam line 803. The X-ray detector 807 is employed to measure horizontal and vertical collimation of the X-ray beam reflected by the second X-ray reflection mirror 886 as two dimensional information. This X-ray detection signal is input into the X-ray reflection mirror controlling unit 970 and used to drive two first and second X-ray reflection mirrors 885, 886. The SOR beam passed through the aperture 804 has a roughly beltlike geometry which is long in the horizontal direction. Accordingly, as easily understood, even if the exposure field is extended by the rocking operation of the X-ray reflection mirror, the shaped SOR beam has also the roughly beltlike geometry which is long in the horizontal direction. In the fifth embodiment of the present invention, this X-ray beam (SOR beam) is scanned in the vertical direction of the field and employed in the step-and-repeat sequential exposure.

As shown in FIG. 19, in the X-ray exposure chamber 809, the X-ray mask 812 is held on the mask stage 813. The mask stage driving unit 816 and the mask stage controlling unit 818 are connected to the mask stage 813. The wafer 814 is held on the wafer stage 815. The wafer stage driving unit 817 and the wafer stage controlling unit 819 are connected to the wafer stage 815. The gap between the X-ray mask 812 and the wafer 814 is set to 20 $\mu$m and the collimation of ±0.2 $\mu$m can be attained in the exposure field region of 20 mm×40 mm. Setting of the gap between the X-ray mask 812 and the wafer 814 can be adjusted and set based on the profile information signal which is obtained by the gap sensor 822 in driving respective stages to scan the X-ray mask 812 and the wafer 814. At that time, the orientation of the X-ray mask 812 is decided such that the X-ray beam which is supplied from the second X-ray reflection mirror 886 is vertically incident into the pattern surface of the X-ray mask 812. The optical alignment system 820 which can detect an alignment position between the X-ray mask 812 and the wafer 814 is installed in the X-ray exposure chamber 809. The optical alignment system 820 is connected to the alignment controlling unit 821. In addition, the alignment evaluation patterns, the alignment marks, and device patterns, which are shown in FIG. 6, are formed similarly on the X-ray mask 812 and the wafer 814.

In the fifth embodiment of the present invention, the X-ray beam is collimated to roughly form the parallel beam when it is incident into the first X-ray reflection mirror 885 and then reflected from the first X-ray reflection mirror 885. As the first X-ray reflection mirror 885 used in the present invention, a structure is designed to have different reflection characteristics according to the in-plane positions and horizontal divergence angle being changed continuously according to the incident positions of the X-ray beam, as shown in FIGS. 3 and 4, may be employed. The horizontal divergence angle of the X-ray beam can be adjusted to a desired angle by employing the first X-ray reflection mirror 885 shown in FIGS. 3 and 4, and selecting the X-ray incident position into the first X-ray reflection mirror 885. Then, the pattern can be projected onto the wafer 914 while changing the horizontal magnification of the pattern of the X-ray mask in exposure by using this. As for the vertical direction of the exposure field, the magnification can be adjusted by the rocking and scanning of the second X-ray reflection mirror 886. At that time, it is desired that, even after the X-ray has been reflected by the second X-ray reflection mirror 886, the horizontal divergence angle of the X-ray beam being adjusted by the first X-ray reflection mirror 885 should be hardly changed. For this reason, a planar shape of the second X-ray reflection mirror 886 is preferably used to preserve the divergence angle.

Figure 20A:
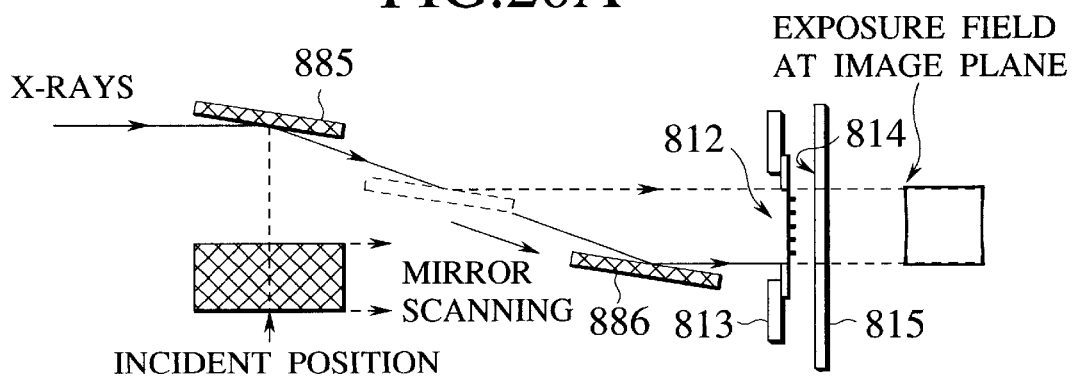
FIGS. 20A to 20C are views showing operations of first and second X-ray reflection mirrors according to the fifth embodiment of the present invention respectively.
Figure 20B:
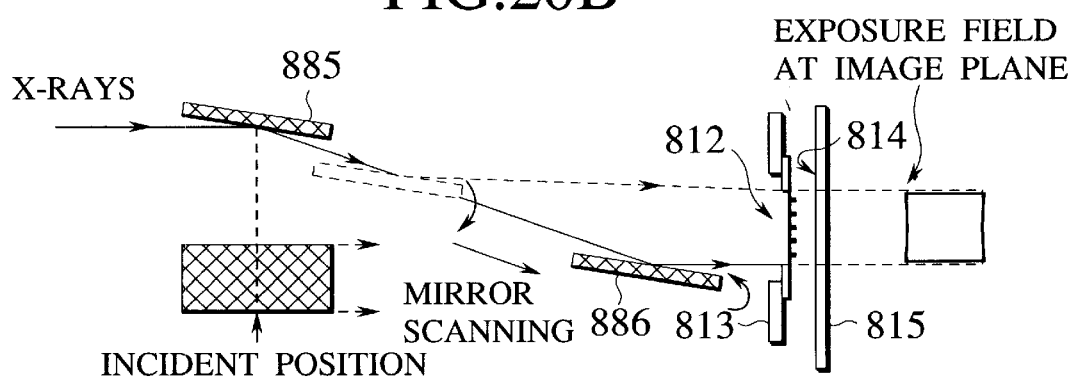
Figure 20C:
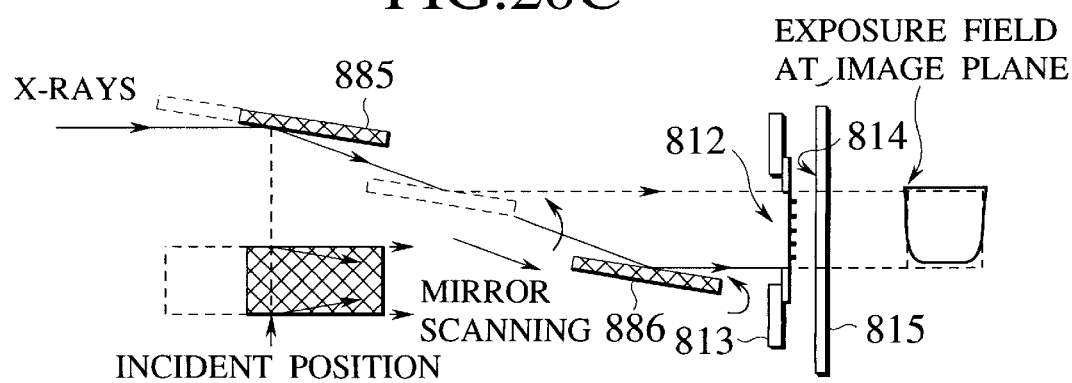

In case the second X-ray reflection mirror 886 in the fifth embodiment of the present invention is to be moved in parallel with the optical axis direction of the X-ray beam, representative examples are shown in FIGS. 20A to 20C. Where the "optical axis of the X-ray beam" means an axis same as an incident direction of the X-ray beam into the second X-ray reflection mirror 886 and does not mean an traveling axis of the X-ray beam reflected by the second X-ray reflection mirror 886. FIG. 20A is the case where, in the situation that the horizontal divergence angle is roughly set to zero by the first X-ray reflection mirror 885 and then the incident angle/the reflection angle of the X-ray beam into/from the second X-ray reflection mirror 886 are kept constant, the second X-ray reflection mirror 886 is scanned in parallel with the optical axis such that the X-ray beam is caused to radiate vertically into the X-ray mask 812. Thus, the horizontal and vertical magnification of the projected pattern is not changed. FIG. 20B is the case where, while fixing the incident position of the X-ray beam into the first X-ray reflection mirror 885, the projected pattern is reduced in size in the vertical direction by rocking the second X-ray reflection mirror 886 and scanning the position of the second X-ray reflection mirror 886. FIG. 20C is the case where, while changing the incident position of the X-ray beam into the first X-ray reflection mirror 885 and also rocking the second X-ray reflection mirror 886, the horizontal magnification of the projected pattern is changed on the in-plane by scanning the second X-ray reflection mirror 886 along the optical axis such that an upper area and a lower area of the projected pattern are expanded and reduced along the vertical direction respectively.

Next, an example of exposure sequence in the fifth embodiment of the present invention will be explained with reference to FIG. 21 hereinbelow. In a flowchart shown in FIG. 21, the same reference numerals are affixed to the same steps as those in FIG. 7. Flows in step S101 to step S103 are similar to those in FIG. 7 and their explanation will be omitted. Accordingly, the processes in step S60 and forth, indicated by a broken line in FIG. 21, will be explained hereinbelow.

(a) In step S111, the gap between the X-ray mask 812 and the wafer 814 are detected. The alignment signals are detected in step S112, and the X-ray beam is detected in step S113. Then, in step S115, relative positional relationships (positional displacement, distortion, etc.) between the X-ray mask 812 and the wafer 814 are calculated by the alignment controlling unit 821 based on the position signals derived from the alignment marks. In step S116, horizontal and vertical collimation of the X-ray beam reflected by the X-ray reflection mirror 805 are calculated as two dimensional information by using the X-ray signal detected in step S113. The relative positional information of the patterns are transferred to the mask stage controlling unit 818 and the wafer stage controlling unit 819, and then the alignment operation is controlled by the mask stage controlling unit 818 and the wafer stage controlling unit 819.

(b) The positional information supplied from the alignment controlling unit 821 are transfer to the X-ray reflection mirror controlling unit 970. In step S161, the incident position of the X-ray beam into the first X-ray reflection mirror 885, the incident angle of the X-ray beam, and the orientation of the first X-ray reflection mirror are adjusted based on the positional information and the signal information supplied from the X-ray detector 807. At the same time, in step S161, the rocking operation of the second X-ray reflection mirror 886 and mirror scanning in parallel with the optical axis can be adjusted respectively. This adjustment is performed such that the divergence angles of the X-ray beam incident into the X-ray mask 812 can be set to desired angles in both the horizontal and vertical directions and that, under the condition that the predetermined gap between the X-ray mask 812 and the wafer 814 is being set, the alignment accuracy between the X-ray mask 812 and the wafer 814 can be suppressed less than the desired standard on a calculation. According to such adjustment, the angle of the X-ray reflection mirror and the scanning of the X-ray reflection mirror can be controlled by the first X-ray reflection mirror driving unit 971, the second X-ray reflection mirror driving unit 972, and the second X-ray reflection mirror scanning mechanism 973. This can be set by carrying out loops in step S161 and step S118 repeatedly until the positional displacement falls to less than the desired standard, while checking in step S118 whether or not the positional displacement is less than the desired standard. In case the divergence angle of the X-ray beam incident into the X-ray mask 812 is optimized, it is checked by the X-ray reflection mirror controlling unit 970, before starting the exposure by opening the X-ray shutter 808, whether or not the divergence angle of the X-ray beam detected by the X-ray detector 807 has satisfied predetermined conditions of objective exposure fields of the X-ray mask 812 and the wafer 814. Setting of the first X-ray reflection mirror 885 and the second X-ray reflection mirror 886 are repeated until the predetermined conditions can be satisfied by the check of the X-ray reflection mirror controlling unit 970.

(c) Meanwhile, in step S114, the storage current value in the SOR ring is measured. In step S162, the scanning speed of the second X-ray reflection mirror 886 is controlled by the X-ray reflection mirror controlling unit 970 based on either the storage current value in the SOR ring or the X-ray intensity detected in step S113 to obtain a desired exposure dose.

(d) In step S120, if it is decided that "execute real-time exposure", the process in step S61 which is identical to step S60 is carried out. If it is decided that "don't execute real-time exposure", the process is advanced to step S122 in which the predetermined exposure field is exposed. In step S61, positional signals which correspond to the position of the exposure field are detected in real time from the alignment marks 902 on the X-ray mask 812 and the alignment marks 904 of the exposure field on the wafer 814, which is being exposed, by the optical alignment system 820 even during exposure. Then, positional information of the pattern on the X-ray mask 812 and positional information of the pattern on the wafer 814, which are calculated by the alignment controlling unit 821 based on such positional signals, are transfer to the X-ray reflection mirror controlling unit 970. The incident positions and the incident angles of the X-ray beam into the first X-ray reflection mirror 885 and the second X-ray reflection mirror 886, and the orientations of the first X-ray reflection mirror 885 and the second X-ray reflection mirror 886 can be adjusted, based on the signal information detected in real time by the X-ray detector 807 with using the positional information as references, such that the divergence angle of the X-ray beam incident into the X-ray mask 812 can be set to less than the predetermined values in both the horizontal and vertical directions. At the same time, the first X-ray reflection mirror 885 and the second X-ray reflection mirror 886 can be driven in real time by the first X-ray reflection mirror driving unit 971, the second X-ray reflection mirror driving unit 972, and the X-ray reflection mirror scanning mechanism 973 respectively in synchronous with the scanning operation of the second X-ray reflection mirror 886 along the optical axis direction of the X-ray beam such that the alignment accuracy between the X-ray mask 812 and the wafer 814 can be reduced to less than the desired standard value on a calculation. Then, the positions of the X-ray mask 812 and the wafer 814 are controlled sequentially by the mask stage controlling unit 818 and the wafer stage controlling unit 819 to then perform the step-and-repeat sequential exposure (step S61). In this way, the step-and-repeat exposure is applied to the predetermined exposure field on the wafer 814 (step S122). Then, the process returns to step S103, and then the exposures on succeeding exposure fields are repeated according to steps S60, S61, etc.

The SOR beam still keeps the roughly beltlike geometry which is long in the horizontal direction after it is subjected to extension of the exposure field by scanning the second X-ray reflection mirror 886 along the optical axis direction. The SOR beam which is shaped by scanning the second X-ray reflection mirror 886 along the optical axis direction is scanned in the vertical direction of the field to be used for exposure. In addition, if adjustment of the X-ray intensity distribution is requested, e.g., maintenance of the in-plane uniformity of the exposure light amount, such adjustment can be achieved by the X-ray intensity distribution adjusting means 823 using the SiN thin films which are identical to those in the first to third embodiments. In place of the X-ray intensity distribution adjusting means 823, a method of coating negative resist on the isolation window 809 may be employed, like the fourth embodiment.

SIXTH EMBODIMENT

Figure 22:
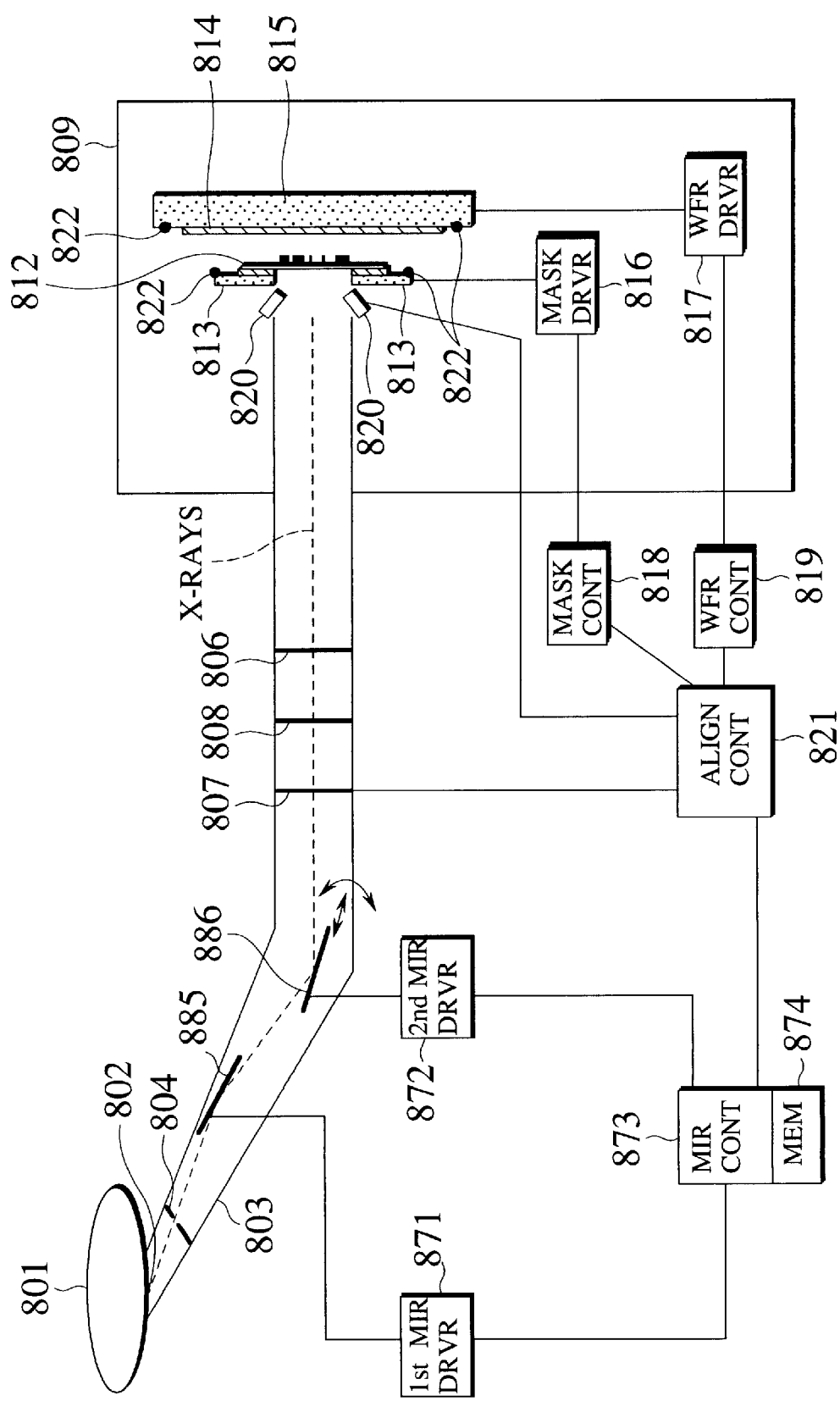
FIG. 22 is a view showing a schematic configuration of an X-ray lithography system according to a sixth embodiment of the present invention.

In the fourth and fifth embodiments, the examples have been set forth wherein the alignment signals of the exposure fields on the X-ray mask and the wafer are detected sequentially in real time according to the in-plane positions of the exposure fields and then the alignment exposure is executed by scanning the X-ray beam, while driving/ controlling various necessary constituent elements such as the X-ray reflection mirror based on the positional information associated with the relative positional relationship and an absolute displacement amount, etc. In the event that a data storing portion 874 is provided in the X-ray mirror controlling unit 873, as shown in FIG. 22, and then data concerning mirror drive control are stored in the data storing portion 874, the alignment accuracy can be improved by correcting the distortion of the exposure field, etc. based on the stored data. Then it is not required to correct the positional displacement in real time sequentially according to the position in the field, as mentioned above.

An X-ray lithography system shown in FIG. 22 comprises, as major constituent elements, at least the synchrotron ring 801 for generating the SOR beam, the X-ray beam output port 802, the beam line 803 which is evacuated up to ultra-high vacuum, the aperture 804 for restricting the X-ray area, the first X-ray reflection mirror 885, the second X-ray reflection mirror 886, the isolation window 806 for isolating the ultra- high vacuum on the beam line side with the atmospheric pressure on the exposure chamber side, the X-ray detector 807, the X-ray shutter 808, and the X-ray exposure chamber 809. The first X-ray reflection mirror driving unit 871 which sets the incident position of the X-ray beam and the orientation of the X-ray reflection mirror is connected to the first X-ray reflection mirror 885. Similarly, the second X-ray reflection mirror driving unit 872 is connected to the second X-ray reflection mirror 886. The first X-ray reflection mirror driving unit 871 and the second X-ray reflection mirror driving unit 872 are controlled by the X-ray reflection mirror controlling unit 873. A data storing portion 874 such as RAM which stores data concerning mirror drive control is connected to or built in the X-ray reflection mirror controlling unit 873. A concrete arranging position of the data storing portion 874 may be decided according to design specification of the overall X-ray lithography system, etc. For example, the data storing portion 874 may be displaced in the X-ray exposure chamber 809. The relative positional relationship information for the mask position in the whole exposure field, mask position information, exposure condition data such as the gap, and others can be stored in the data storing portion 874. The X-ray detector 807 is employed to measure horizontal and vertical collimation of the X-ray beam reflected by the X-ray reflection mirror 805 as two dimensional information. Such two dimensional information as for the collimation of the X-ray beam is input into the X-ray mirror controlling unit 873. The two dimensional information as for the collimation of the X-ray beam can be stored in the data storing portion 874. These information are read out and used to drive the first X-ray reflection mirror 885 and the second X-ray reflection mirror 886.

The X-ray exposure chamber 809 is substantially same as that in the first to fifth embodiments. The X-ray mask 812 is held on the mask stage 813. The wafer 814 is held on the wafer stage 815. The mask stage driving unit 816 and the mask stage controlling unit 818 are connected to the mask stage 813. The wafer stage driving unit 817 and the wafer stage controlling unit 819 are connected to the wafer stage 815.

Figure 23:
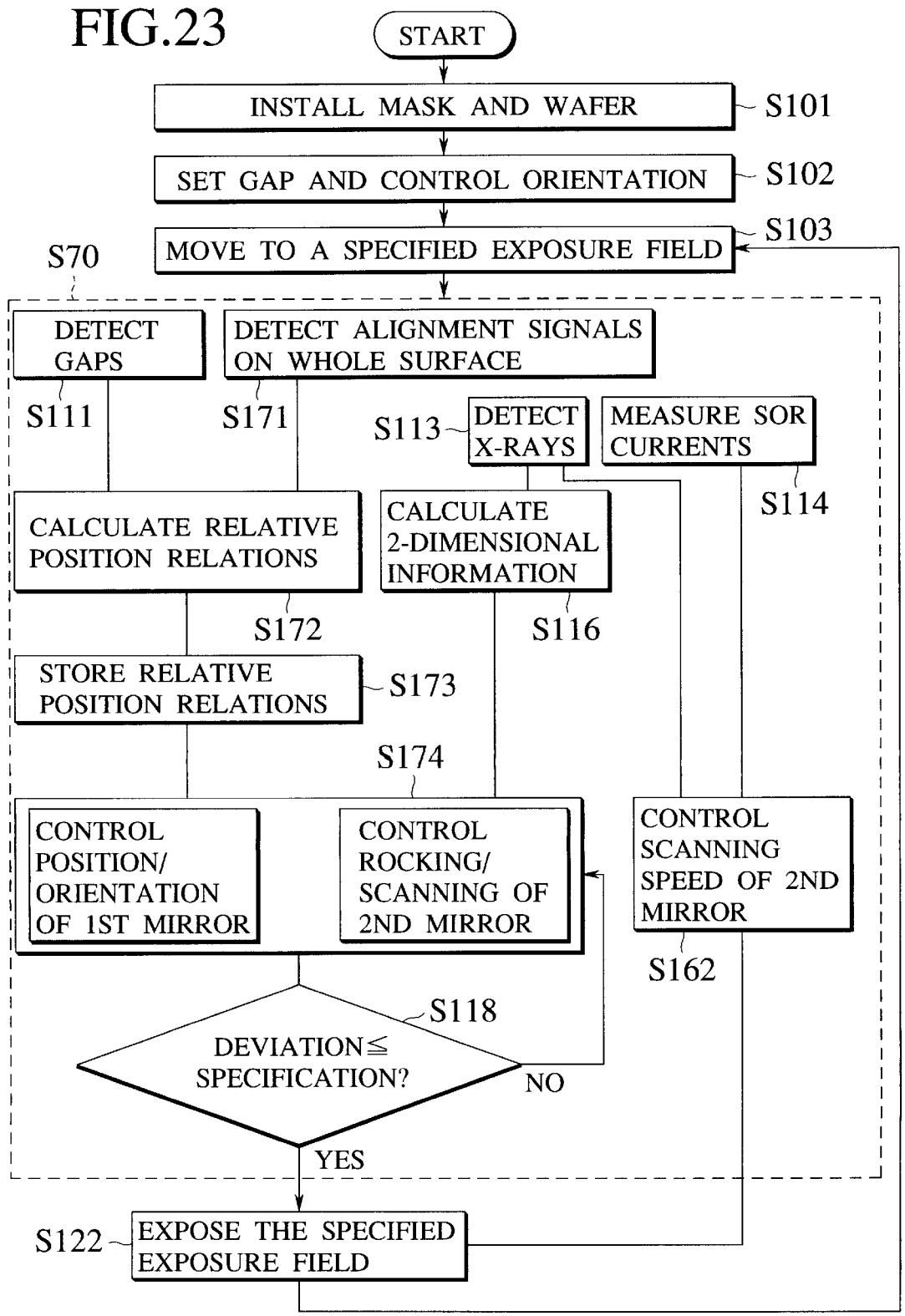
FIG. 23 is a flowchart showing exposure sequence of X-ray lithography according to the sixth embodiment of the present invention.
Figure 24:
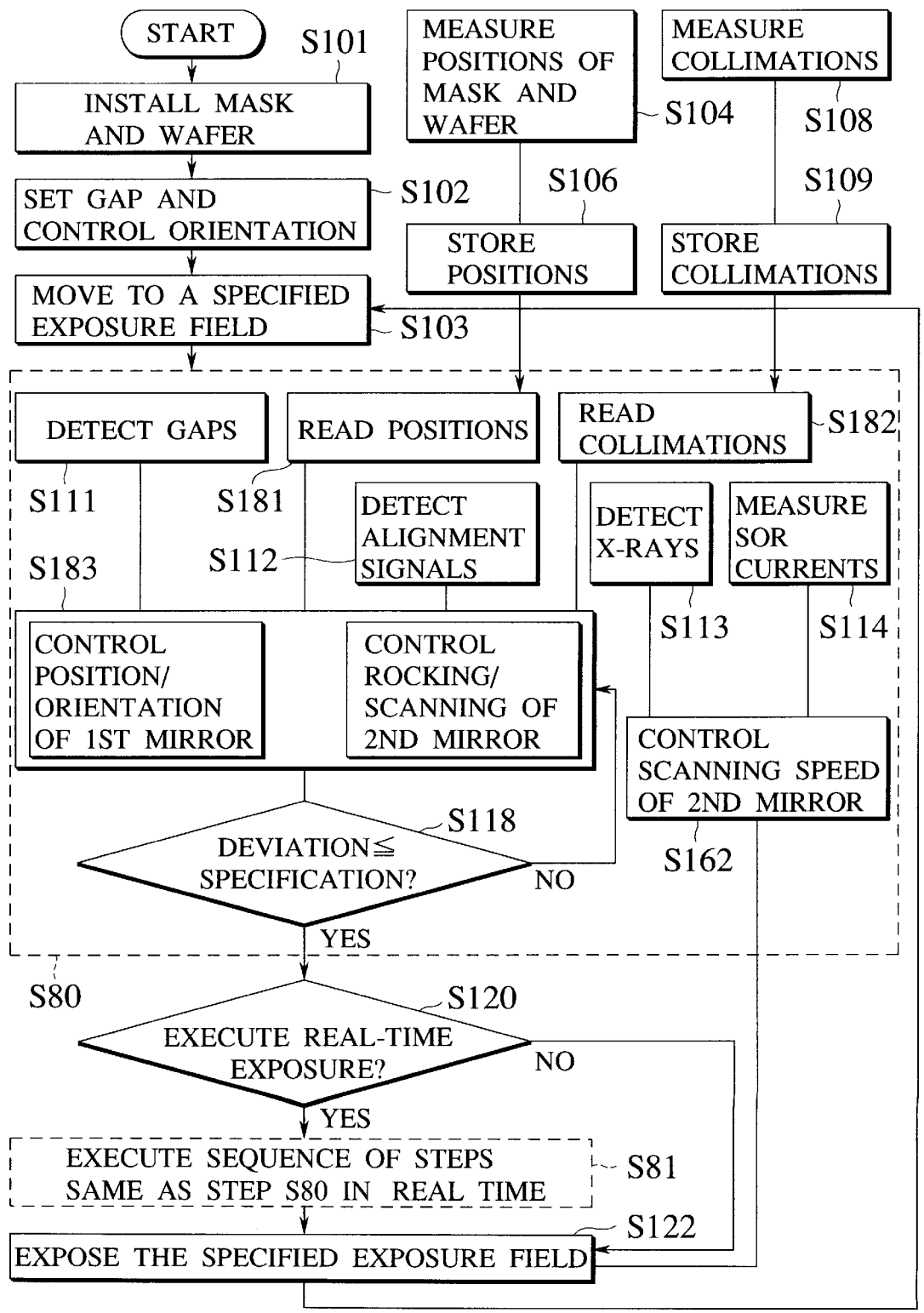
FIG. 24 is a flowchart showing exposure sequence of X-ray lithography according to a modification of the sixth embodiment of the present invention.
Figure 25:
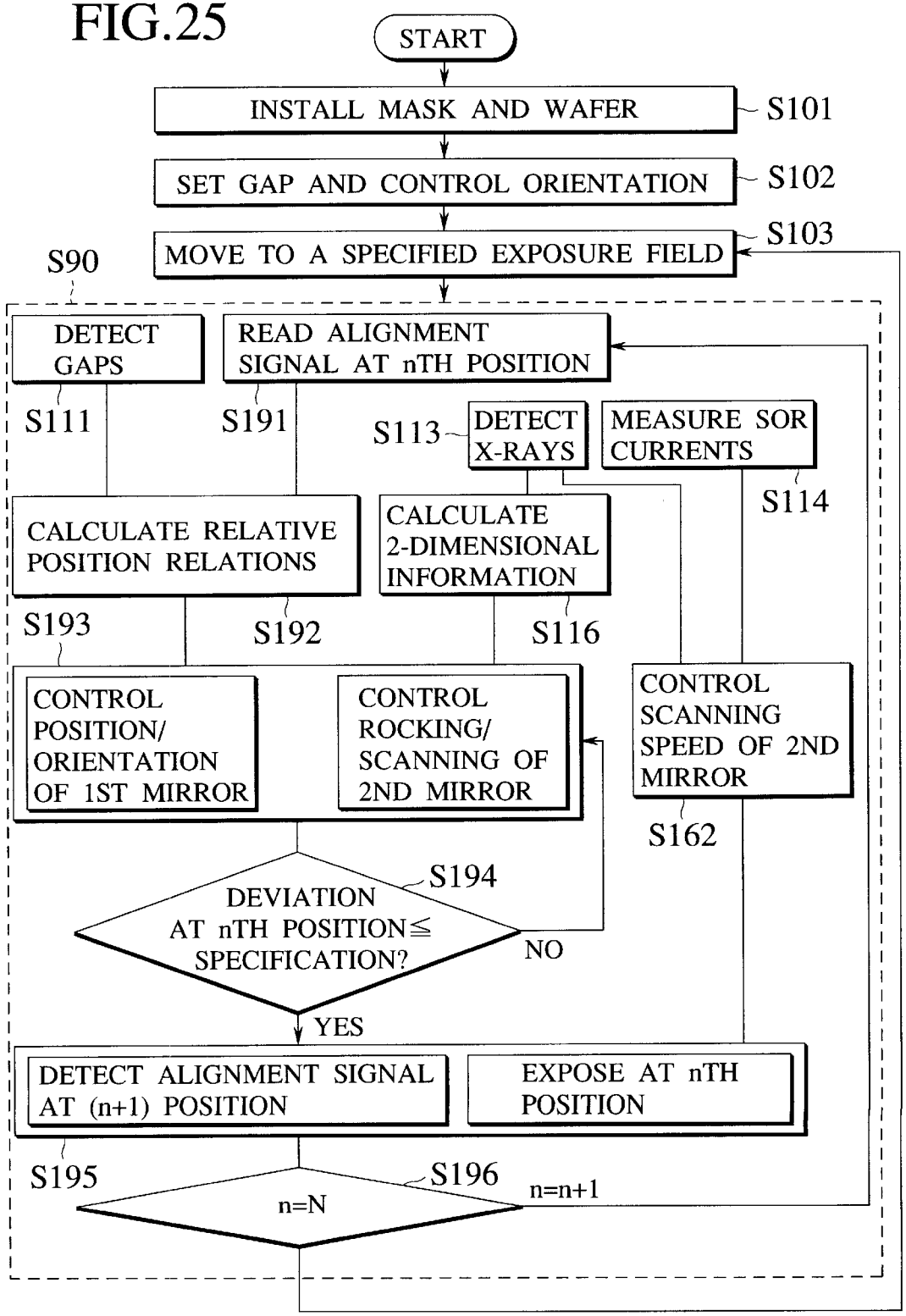
FIG. 25 is a flowchart showing exposure sequence of X-ray lithography according to another modification of the sixth embodiment of the present invention.

In the sixth embodiment of the present invention, an alignment and exposure may be performed in accordance with exposure sequence in a flowchart shown in FIGS. 23 to 25. In flowcharts shown in FIGS. 23 to 25, the same references are assigned to the same steps as those in the flowchart shown in FIG. 18 or FIG. 21 and their explanation will be omitted.

FLOWCHART IN FIG. 23

After the wafer 814 has been installed in the exposure chamber 809 and moved to the predetermined exposure field via step S101 to step S103, positional displacement information are detected from the alignment marks on the overall surface in step S171. More particularly, prior to starting actually irradiation of the X-ray beam, positional displacement information are detected from the alignment marks on the overall surface of the objective exposure field in step S171, and then relative positional relationship (positional displacement, distortion, etc.) between the pattern of the X-ray mask 812 and the pattern of the wafer 814 on the overall exposure field are calculated by using the detected alignment marks on the whole surface and the gap information in step S172. In step S173, data calculated in step S172 are stored in the data storing portion 874. In step S174, the first X-ray reflection mirror controlling unit 871 sets/ controls the incident position of the X-ray beam relative to the first X-ray reflection mirror 885 and the orientation of the first X-ray reflection mirror 885, based on data of the relative positional relationship on the overall field stored in the data storing portion 874. In step S183, at the same time, the second X-ray reflection mirror controlling unit 872 controls the rocking operation of the second X-ray reflection mirror 886 and the movement (mirror scanning amount) of the second X-ray reflection mirror 886 in parallel with the optical axis, based on the data of relative positional relationship on the overall field surface stored in the data storing portion 874. Like the above, the alignment exposure can be executed sequentially.

FLOWCHART IN FIG. 24

In the flowchart in FIG. 24, at first, positions of the X-ray mask 812 and the wafer 814 are measured in step S104. Simultaneously, collimation of the X-ray beam formed depending upon the incident position into the first X-ray reflection mirror 885, the orientation of the first X-ray reflection mirror 885, and the reflection angle of the second X-ray reflection mirror 886 is measured in step S108. In step S106, the data of relative positional relationship between the X-ray mask 812 and the wafer 814 measured in step S104 are stored in the data storing portion 874. At the same time, in step S109, the collimation data of the X-ray beam measured in step S108 are stored in the data storing portion 874. Then, the relative positional relationship data stored in the data storing portion 874 are read in step S181, and then the collimation data of the X-ray beam stored in the data storing portion 874 are read in step S182. In this manner, while reading the data, which are detected prior to starting the irradiation of the X-ray beam actually and then stored, from the data storing portion 874, the actually necessary operations of the X-ray reflection mirror driving unit are controlled in step S183. In other words, the first X-ray reflection mirror controlling unit 871 sets/ controls the incident position of the X-ray beam relative to the first X-ray reflection mirror 885 and the orientation of the first X-ray reflection mirror 885, based on the relative positional relationship data and the collimation data of the X-ray beam. At the same time, in step S183, the second X-ray reflection mirror controlling unit 872 controls the rocking operation of the second X-ray reflection mirror 886 and the movement (mirror scanning amount) in parallel with the optical axis of the second X-ray reflection mirror 886, based on the relative positional relationship data and the collimation data of the X-ray beam. Like the above, the alignment exposure can be executed sequentially by controlling the operation of the X-ray reflection mirror driving unit.

FLOWCHART IN FIG. 25

As shown in a flowchart of FIG. 25, it is possible to execute a parallel processing. That is, the predetermined exposure field is segmented into N areas (n=1 to N), information of the next scanned position (n+1-th position) may be detected being ahead of the X-ray beam exposure on the n+1-th position. Namely, the information of the n+1-th position is detected, while the X-ray beam is being irradiated actually on the n-th position to exposure. In other words, the alignment positional signal at the n-th field position stored in the data storing portion 874 are read out in step S191, and then the relative positional relationships (positional displacement, distortion) at the n-th position are calculated in step S192. In step S193, based on the relative positional information at the n-th position and the two dimensional information of the X-ray beam, the first X-ray reflection mirror controlling unit 871 sets/controls the incident position of the X-ray beam relative to the first X-ray reflection mirror 885 and the orientation of the first X-ray reflection mirror 885 by use of the relative positional relationship data and the collimation data of the X-ray beam. At the same time, in step S193, the second X-ray reflection mirror controlling unit 872 controls the rocking operation of the second X-ray reflection mirror 886 and the movement (mirror scanning amount) of the second X-ray reflection mirror 886 in parallel with the optical axis. Then, while determining whether or not the relative positional relationship (positional displacement) at the n-th position becomes below the desired standard in step S194, loops in step S193 and step S194 are carried out repeatedly until the positional displacement can be reduced less than the desired standard. In this manner, if the positional displacement have been less than the desired standard, the n-th field position is irradiated actually by the X-ray beam to expose the photoresist film in step S195. At the same time, in step S195, information of the succeedingly scanned position (n+1-th position) are detected prior to the present field position (n-th position), to which the X-ray is irradiated actually to expose, and then stored in the data storing portion 874. Then, in step S196, it is decided whether or not n=N. If "negative", n is set to n=n+1 and the process returns to step S136. If "affirmative", the process returns to step S103 and goes to the next exposure field. Thus, prior to the field position (n-th position) to which the X-ray is irradiated actually to expose, information of the succeedingly scanned position (n+1-th position) are detected and calculated sequentially and then stored in the data storing portion 874, so that the predetermined field positions which are segmented into N areas can be exposed sequentially. Furthermore, in the step-and-repeat operation, information of the succeedingly scanned position can be stored in the data storing portion 874 and necessary constituent elements of the X-ray lithography system can be driven and controlled based on the data to enable the alignment exposure. In this way, high speed sequential moving exposure can be achieved by getting information at the succeedingly scanned position (n+1-th) previously and performing the alignment exposure by driving/ controlling the necessary constituent elements of the system based on such information.

It is possible to obtain the relative positional information of beyond the next position (n+1-th position) beforehand, such the relative positional information of n+2-th position, or n+3-th position, . . . , while a present field position (n-th position) is irradiated by the X-ray beam.

It is further possible to perform the position detection previously without loading of the X-ray mask 812 and the wafer 814 into the X-ray exposure chamber 809, then store the data in the data storing portion 874, and then perform the exposure based on the data.

Figure 21:
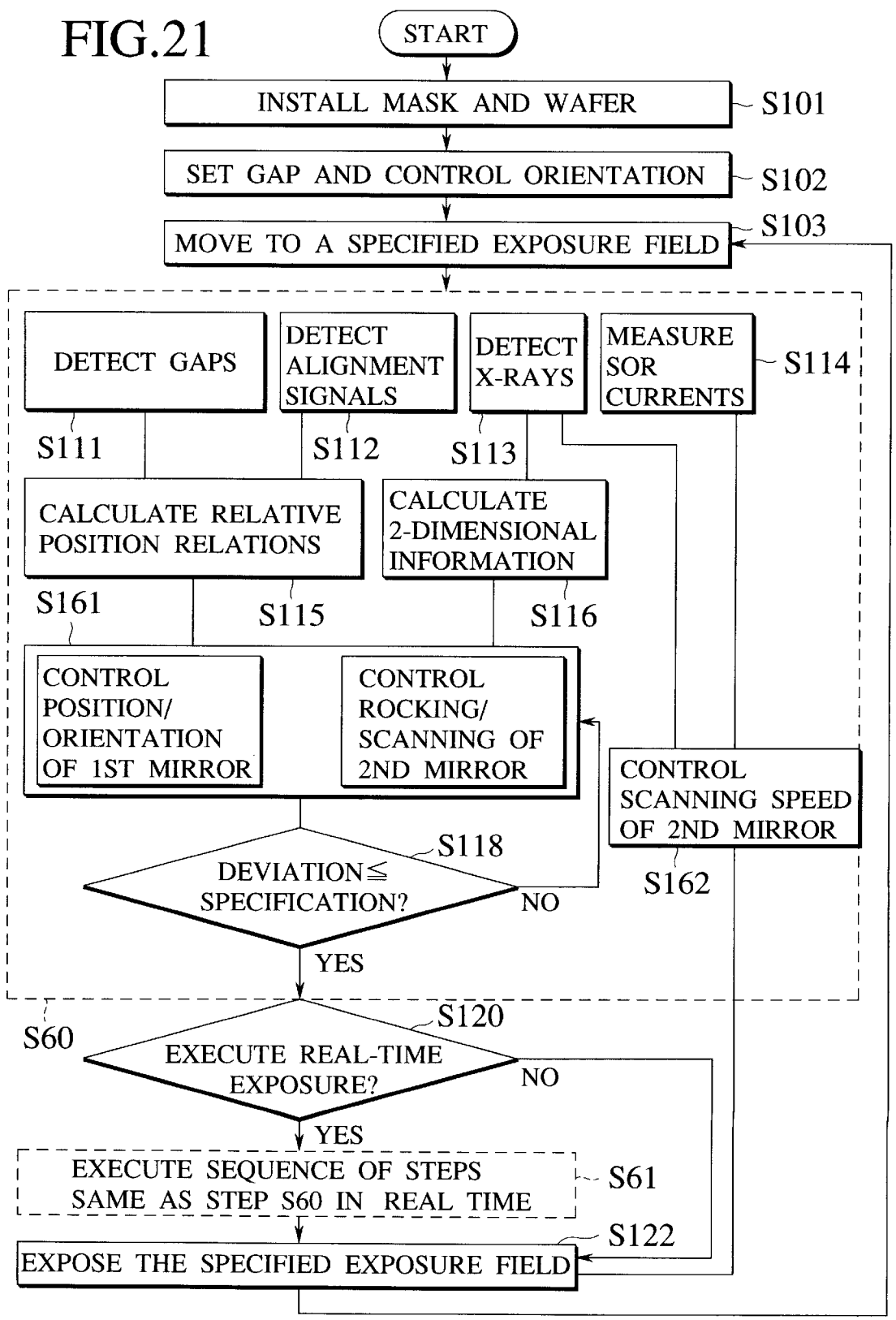
FIG. 21 is a flowchart showing exposure sequence of X-ray lithography according to the fifth embodiment of the present invention.
Figure 26:
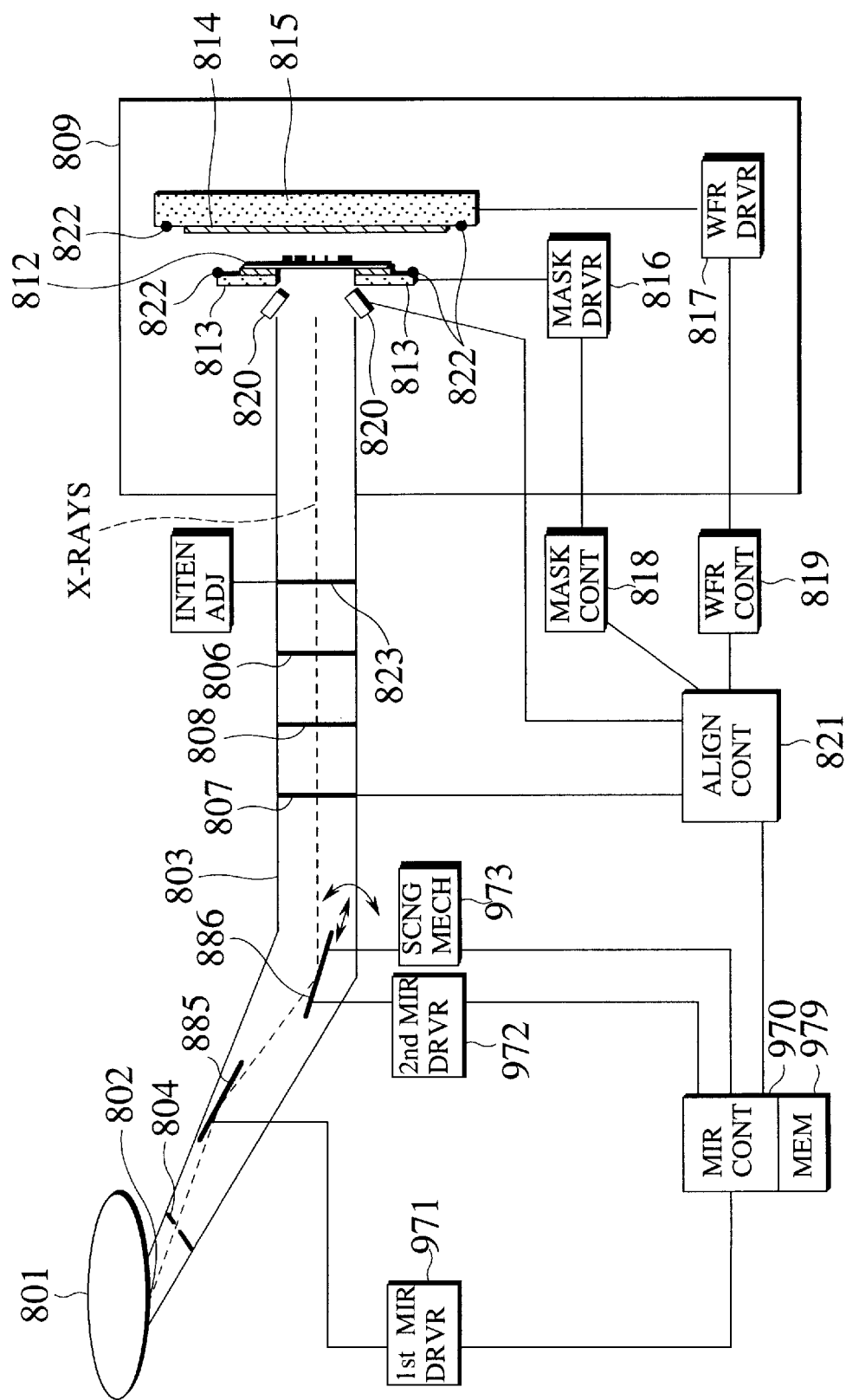
FIG. 26 is a view showing a schematic configuration of an X-ray lithography system according to a modification of the sixth embodiment of the present invention.

Three exposure sequences shown in FIGS. 23 to 25 make possible suitable employment according to the exposure object if a part or all of such three exposure sequences are executed together with the exposure sequence shown in FIG. 18 or FIG. 21. As a result, the advantages of the present invention can be made higher. If the three exposure sequences are employed in combination with the exposure sequence shown in FIG. 21, a data storing portion 979 may be connected to the X-ray reflection mirror controlling unit 970 as shown in FIG. 26, otherwise a data storing portion may be built in the X-ray reflection mirror controlling unit 970. Information of the relative positional relationship of the overall exposure fields, the collimation of the X-ray beam, etc. may be stored in this data storing portion 979. Alternatively, in the step-and-repeat exposure, the alignment positional signal at the n+1-th field position may be detected previously at the time of exposure of the n-th field position, and then such information may be stored in the data storing portion 979.

In addition, as with the shape of the X-ray reflection mirror, the shape shown in FIG. 3A is preferable since it can be easily applied to the present invention. However, if the reflection mirror whose in-plane profiles are different according to the positions is employed, data of the divergence angle of the X-ray beam formed according to the incident position and the incident angle into the surface of the X-ray mirror, etc. may be measured in advance and then such data may be stored in the data storing portions 874, 979 and employed as a data table. According to the sixth embodiment of the present invention, the alignment accuracy can be improved without losing various effects being achieved in the fourth and fifth embodiments, and further there is such a merit that the exposure can be treated in a short time.

EXAMPLES

The present invention will be explained in more detail with reference to EXAMPLEs hereunder. EXAMPLEs 1, 2, 4 are associated with the first embodiment of the present invention, EXAMPLEs 6 to 10 are associated with the second embodiment of the present invention. EXAMPLEs 3, 5, 11 are associated with the third embodiment of the present invention. An EXAMPLE 12 is associated with the fourth embodiment of the present invention, EXAMPLEs 15 to 17 are associated with the fifth embodiment of the present invention, and EXAMPLEs 13, 14, 18 are associated with the sixth embodiment of the present invention. These EXAMPLEs show concretely the mask alignment accuracy, etc. respectively when an overlying pattern is projected onto an underlying mask pattern formed on the wafer (process wafer) by means of the X-ray exposure.

Example 1

As described above, the EXAMPLE 1 is concerned with the first embodiment of the present invention.

Figure 27A:
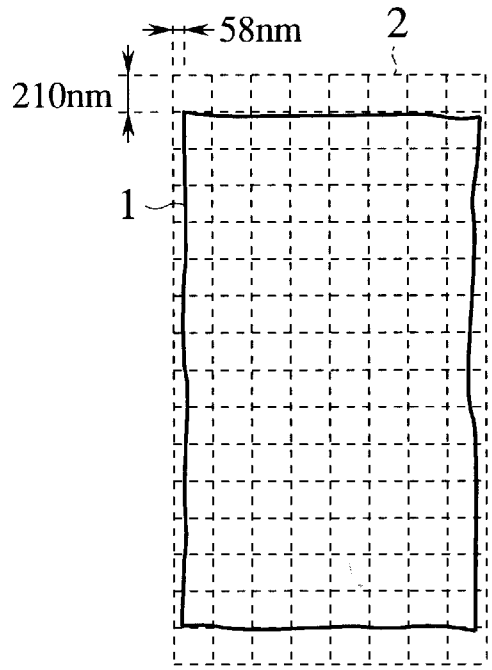
FIGS. 27A to 27D are views showing a relationship between an exposure field pattern of an X-ray mask and an exposure field pattern on wafer respectively.

In the X-ray lithography system according to the first embodiment of the present invention shown in FIG. 1, since the X-ray reflection mirror is swung to assure the exposure field region in the situation that the X-ray reflection mirror 805 and the X-ray mask 812 are fixed at a certain predetermined distance, the divergence angle of the X-ray beam in the vertical direction of the exposure field becomes especially large. Hence, the pattern is expanded in the vertical direction and projected on an image plane, so that the alignment accuracy cannot be attained. For this reason, the X-ray mask 812 which is formed smaller in size than the field size on the wafer 814 to estimate an extended amount previously must be employed. In the EXAMPLE 1, explanation will be made under the assumption that the exposure field is 20 mm×40 mm and a distance between the rocking position of the X-ray reflection mirror 805 and the X-ray mask 812 is about 2000 mm. In this case, pattern displacement of 200 nm in the vertical direction of the field is caused on a calculation. The exposure field being formed on the wafer 814 used in mask alignment is formed as a rectangle having the substantially same size as a design size (20 mm×40 mm), and variations between twenty exposure fields formed on the wafer 814 have been suppressed less than a measuring accuracy. To begin with, positional displacement between an exposure field 1 on the pattern of the X-ray mask 912 and an exposure field 2 on the wafer 814 has been detected by the optical alignment system 820. As a result, as shown in FIG. 27A, the exposure field 1 on the X-ray mask pattern indicated by a solid line has been smaller in size than the exposure field 2 on the wafer 814 indicated by a broken line by the amount of 58 nm in the horizontal direction and 210 nm in the vertical direction, and the exposure field 1 on the X-ray mask pattern has been formed as a roughly rectangular shape. Then, as a result of the measurement in which the alignment displacement is measured with the use of the alignment evaluation marks by executing the alignment exposure of the X-ray mask actually, average values of the positional displacement are −3 nm in the horizontal direction and −15 nm in the vertical direction. Such positional displacement data are an average value in two right and left columns in the horizontal direction and an average value in two upper and lower rows in the vertical direction, which are derived from outermost peripheral measured values of the alignment evaluation patterns 903 arranged at 9×17 points on the exposure field, as shown in FIG. 6. Although the mirror having the shape shown in FIG. 3A has been employed as the X-ray reflection mirror, the divergence angles of the X-ray beam at that time are estimated generally as 3 mrad in the horizontal direction and 10 mrad in the vertical direction. The above resultant alignment displacements are within a negligible accuracy in the horizontal direction, but they are a value to be corrected in the vertical direction. Therefore, in order to maintain the incident angle of the X-ray beam into the X-ray mask in the horizontal direction as it is, the gap is set to 21 μm by separating the wafer 812 from the X-ray mask 805 by 1 μm, while fixing the position of the X-ray reflection mirror surface into which the X-ray beam is input. Furthermore, in the exposure, the rocking speed of the mirror rocking by the X-ray reflection mirror driving unit is controlled to obtain the desired exposure dose according to the X-ray intensity.

The alignment results obtained in this case are suppressed to such extent that respective average values fall into the variation range in measurements in both the horizontal direction and the vertical direction (referred to as "measurement reproducibility" hereinafter). In the EXAMPLE 1, since the magnification is controlled by adjusting the distance between the mask and the wafer while keeping the incident position of the X-ray beam into the X-ray reflection mirror as above, the alignment standard accuracy for the wafer can be achieved even if the X-ray mask which has been below the standards in the prior art is employed. Then, if linewidth variations of resultant projected patterns in the exposure field have been measured to check a critical dimensional (CD) controllability, it has been found that peripheral dimensions become smaller by 10% due to the insufficient exposure dose than the standard dimension. Therefore, when the similar exposure is effected after the X-ray intensity distribution has been adjusted by the X-ray intensity distribution adjusting means 823 to increase the exposure dose on the peripheral portions, a dimensional uniformity of 6% has been derived from the exposure field and also the in-plane uniformity has been improved.

Example 2

Figure 27B:
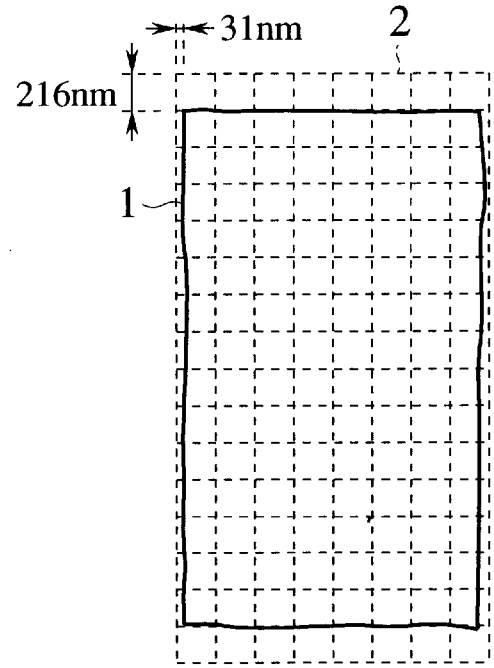

Next, the EXAMPLE 2 according to the first embodiment of the present invention will be explained with reference to FIGS. 1 and 27B. Here the case will be explained where, as a second example in which the X-ray reflection mirror 805 is swung while fixing a distance between the X-ray reflection mirror 805 and the X-ray mask 812 at constant, the patterns are projected by changing the incident position of the X-ray beam into the X-ray reflection mirror 805.

In the case of the X-ray lithography system according to the first embodiment of the present invention shown in FIG. 1, since the pattern is expanded and projected on an image plane because of the similar circumstances to the EXAMPLE 1, the X-ray mask 812 which is formed smaller in size than the field size on the wafer (silicon wafer) 814 to estimate an extended amount previously must be employed. The wafer 814 has been fabricated by employing the device pattern having a different layout and different manufacturing processes from those in the EXAMPLE 1. Hence, variation of the exposure field size on the wafer 814 appears and especially there has been a difference of 30 nm in vertical size. To begin with, average displacement of the field size between an exposure field 1 on the X-ray mask pattern and an exposure field 2 on the wafer, which has been detected by the optical alignment system 820, the exposure field 1 on the X-ray mask pattern indicated by a solid line has been smaller in size than the exposure field 2 on the wafer indicated by a broken line by the amount of 31 nm in the horizontal direction and 216 nm in the vertical direction, and the exposure field 1 on the X-ray mask has been formed as a roughly rectangular shape, as shown in FIG. 27B. Then, as a result of the measurement in which the alignment displacement is measured with the use of the alignment evaluation patterns 903 by executing the alignment exposure of the X-ray mask actually, average values of the positional displacement in twenty exposure fields formed on the wafer are +32 nm in the horizontal direction and −21 nm in the vertical direction. Such positional displacement data are detected first by detecting an average value in two right and left columns in the horizontal direction and an average value in two upper and lower rows in the vertical direction, which are derived from outermost peripheral measured values of the alignment evaluation patterns 903 arranged at 9×17 points on the exposure field, and then calculating average values of all twenty exposure fields on respective wafers. Since the divergence angles of the X-ray beam at that time are estimated generally as 3 mrad in the horizontal direction and 10 mrad in the vertical direction, the incident position of the X-ray beam into the X-ray reflection mirror plane has been adjusted and modified such that the incident angle of the exposure X-ray beam into the mask in the horizontal direction becomes about 1.5 mrad (see FIGS. 3B to 3D). Then, with fixing this incident angle, the exposure has been made while shifting the wafer 814 along the vertical direction relative to the rocking of the X-ray mirror. During exposure, the rocking of the X-ray reflection mirror is directed from the lower side to the upper side and the wafer 814 is moved downward by 20 nm. Then, in sequential exposure on every exposure field, setting of the X-ray reflection mirror being adjusted above is treated as default and then the alignment exposure is performed according to the exposure sequence shown in FIG. 7. At this time, the alignment exposure has been performed by optimizing the horizontal divergence angle of the X-ray beam while changing the incident position of the X-ray beam on occasion based on the positional signal from the alignment marks derived according to the difference in size of the fields. In order to optimize the divergence angle of the X-ray beam, before starting the exposure by opening the X-ray shutter 808, it has been checked that the divergence angle of the X-ray beam measured by the X-ray detector 807 can satisfy the conditions for the object field, and then the exposure is started. In the exposure, the rocking speed of the mirror rocking by the X-ray reflection mirror driving unit 811 is controlled by the X-ray reflection mirror controlling unit 810 to obtain the desired exposure dose according to the X-ray intensity.

The results of alignment displacement obtained in this case are suppressed to the same extent of the measurement reproducibility in both the horizontal and vertical directions on an average of twenty exposure fields which are subjected to the step-and-repeat exposure. Also, linewidth variations have been reduced to ⅓ rather than variations of the underlying patterns which have already been formed prior to the main exposure. In this example, the alignment displacement has been caused since horizontal size variations are present between underlying exposure fields on the wafer 814. However, because the alignment exposure has been performed appropriately by controlling the pattern magnification in the horizontal direction after the incident position of the X-ray beam into the X-ray reflection mirror has been optimized every exposure field in mask alignment of the underlying patterns, alignment displacement due to variations between the exposure fields after exposure can be reduced and thus the alignment standard accuracy can be achieved. In the prior art, if the underlying exposure field is deformed, such deformation has been treated by a mask alignment method of deforming the X-ray mask for each exposure field. However, according to EXAMPLE 2, there is no possibility of damage of the X-ray mask and also mechanisms of the X-ray lithography system do not become complicated. Further, according to EXAMPLE 2, since the X-ray reflection mirror can be driven and controlled speedily based on the alignment positional signal, the exposure process speed can be made higher.

Example 3

Figure 27C:
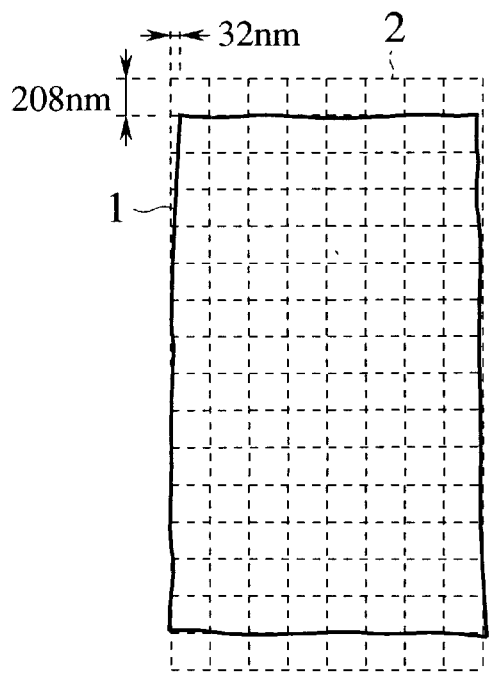

Then, EXAMPLE 3 according to the third embodiment of the present invention will be explained with reference to FIGS. 11 and 27C. In this EXAMPLE 3, the case will be explained where, as a third example in which the X-ray reflection mirror 805 is swung while fixing a distance between the X-ray reflection mirror 805 and the X-ray mask 812 at constant, the patterns are projected while changing the incident position of the X-ray beam into the X-ray reflection mirror 805, as shown in FIGS. 3B to 3D. In this case, the employed X-ray reflection mirror is different from that in the above EXAMPLE 2. Therefore, the divergence angle of the X-ray beam formed according to the incident position and the incident angle of the X-ray beam in the plane of the X-ray reflection mirror 805 is measured in advance and then data obtained by such measurement are employed.

In the case of the X-ray lithography system according to the third embodiment of the present invention, since the pattern is expanded and projected on an image plane, like the first embodiment, the X-ray mask which is formed smaller in size than the field size on the wafer 814 to estimate an extended amount previously must be employed. In EXAMPLE 3, the wafer 814 having the underlying patterns as the object of the mask alignment has been fabricated by employing the device pattern having a different layout and different manufacturing processes from those in EXAMPLEs 1, 2. The exposure field profile on the wafer 814 has a rough barrel shape. To begin with, average displacement of the exposure field size between the X-ray mask 812 and the wafer 814 has been detected by the optical alignment system 820. As a result, as shown in FIG. 27C, the exposure field 1 on the X-ray mask 812 has been smaller in size than the exposure field 2 on the wafer by the amount of 32 nm in the horizontal direction and 208 nm in the vertical direction, and the exposure field 1 on the X-ray mask has been formed as a roughly rectangular shape different from that of the wafer 814. Then, as a result of the measurement in which the alignment displacement of the overlying mask pattern relative to the mask pattern formed on the wafer 814 is measured by executing the alignment exposure of the X-ray mask actually, average values of the positional displacement in twenty exposure fields have been +32 nm at the middle area of the field, +55 nm at the upper area, and +40 nm at the lower area in the horizontal direction. The positional displacement in the vertical direction has been +5 nm. Such positional displacement data are detected first by detecting an average value in two right and left columns in the horizontal direction and an average value in two upper and lower rows in the vertical direction, which are derived from outermost peripheral measured values of the alignment evaluation patterns 903 arranged at 9×17 points on the exposure field, and then calculating average values of all twenty exposure fields on respective wafers which are subjected to the sequential exposure. In the exposure, the alignment exposure has been performed while optimizing the horizontal X-ray divergence angle in real time based on the position signal from the alignment marks derived according to the positional displacement depending upon the position in the field, the incident position of the X-ray beam into the X-ray reflection mirror 805, and the data of the divergence angle stored in the data storing portion 881 connected to the X-ray reflection mirror controlling unit 810. In this exposure, the divergence angle of the X-ray beam has been measured by the X-ray detector 807, but such measured information has not been returned to the data storing portion 881 to control/drive the X-ray reflection mirror 805. In EXAMPLE 3, the in-plane position of the X-ray reflection mirror into which the X-ray beam is radiated is selected from the data of the divergence angles stored in the data storing portion 881 such that the incident angles of the X-ray into the X-ray mask in the horizontal direction are set roughly to 1 mrad at the lower area in one field, 1.5 mrad at the middle area, and almost 0 mrad at the upper area. Also, the mirror rocking by the X-ray reflection mirror driving unit 811 is performed by calculating the desired exposure dose based on the previously measured intensity distribution and then controlling the rocking speed of the X-ray reflection mirror based on such calculation values.

The results of alignment displacement obtained in this case are suppressed to the same extent of the measurement reproducibility in both the horizontal and vertical directions on an average of twenty exposure fields. In this example, such a problem that the alignment displacement which has been caused because underlying exposure field profiles on the wafer 814 and exposure field profiles on the X-ray mask having the overlying mask patterns are different can be solved by controlling the magnification in the horizontal direction with the use of the data of divergence angle of the X-ray beam which is formed according to the incident position and the incident angle, which have been measured previously, of the X-ray beam into the in-plane position of the X-ray reflection mirror. At that time, the horizontal divergence angle of the X-ray beam is controlled such that the incident position of the X-ray beam into the X-ray reflection mirror is optimally selected sequentially according to the positional signal from the alignment marks corresponding to the position of the exposure fields. In this manner, in EXAMPLE 3, since the alignment exposure has been performed by controlling the magnification of the exposure field size in the horizontal direction, the alignment accuracy between the underlying pattern and the overlying mask pattern can be achieved. In EXAMPLE 3, the alignment exposure has been performed in the situation that setting of the X-ray reflection mirror is not optimized previously, like EXAMPLEs 1, 2, but the exposure is not always performed in advance when the exposure is performed in real time. As mentioned above, because the X-ray reflection mirror can be optimally driven and controlled based on the alignment positional signal according to the position in the exposure field, the alignment exposure can be applied to not only a simple magnification correction but also the underlying exposure fields which are deformed or warped to complicated shapes via various LSI manufacturing steps such as heat treatments.

Example 4

Then, EXAMPLE 4 according to the first embodiment of the present invention will be explained with reference to FIG. 1. In this EXAMPLE 4, the case will be explained where, as a fourth example in which the X-ray reflection mirror 805 is swung while fixing a distance between the X-ray reflection mirror 805 and the X-ray mask 812 at constant, perpendicularity correction of the exposure patterns is made in projection by tilting the orientation of the X-ray reflection mirror 805 relative to the optical axis of the X-ray beam.

Figure 27D:
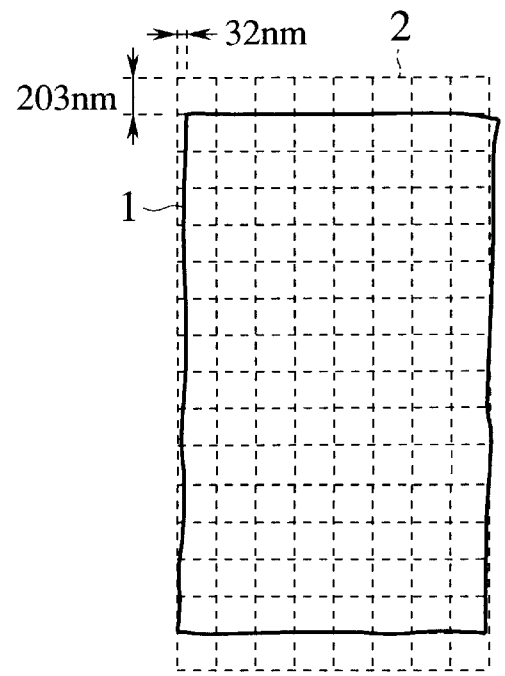
Figure 28A:
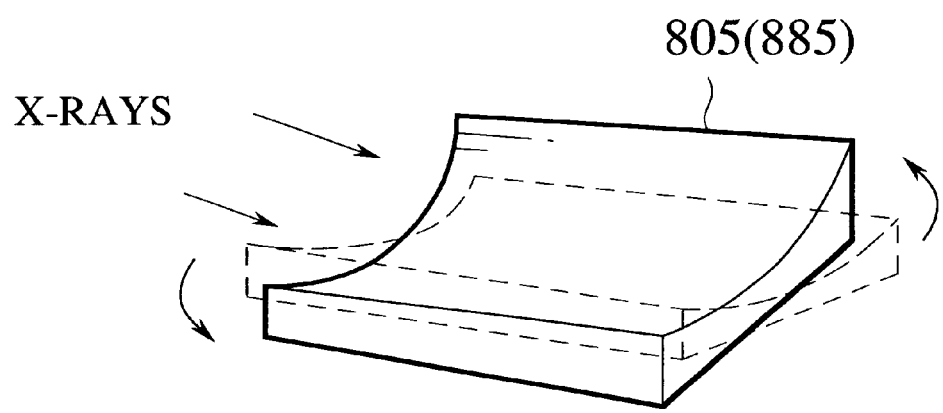
FIG. 28A is a perspective view showing an operation of an X-ray reflection mirror if right and left divergence angles of the X-ray beam in the horizontal direction are set differently.
Figure 28B:
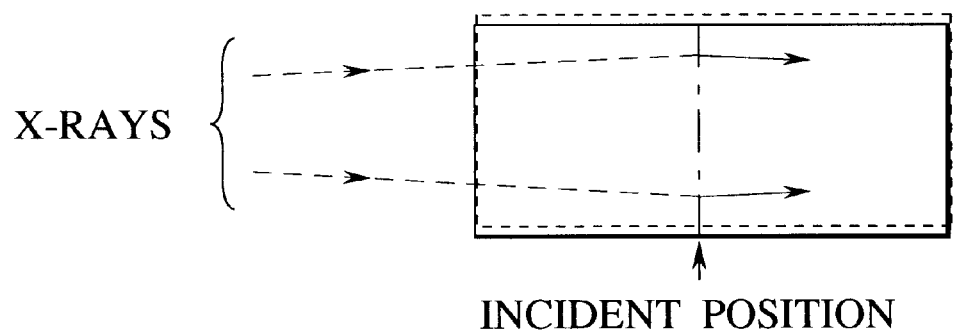
FIG. 28B is a top view showing reflection directions of the X-ray beam.
Figure 29A:
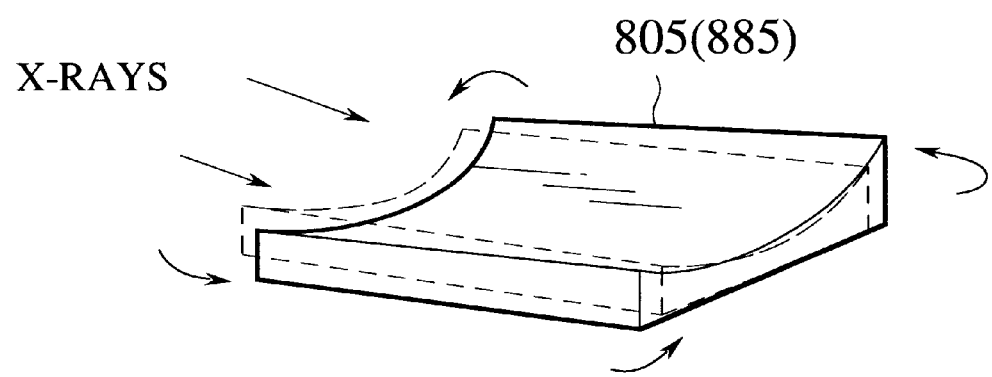
FIG. 29A is a perspective view showing another operation of the X-ray reflection mirror if right and left divergence angles of the X-ray beam in the horizontal direction are set differently.
Figure 29B:
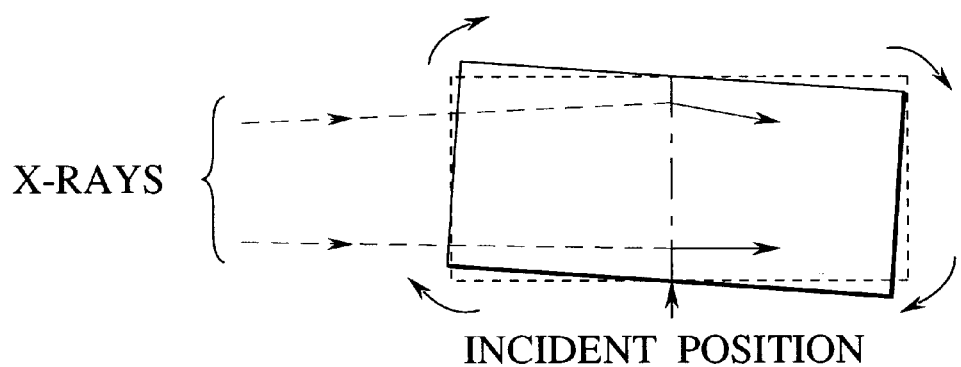
FIG. 29B is a top view showing reflection directions of the X-ray beam.

This EXAMPLE 4 performs the alignment exposure by controlling a divergence amount of the X-ray beam in the horizontal direction in real time with the use of the X-ray lithography system shown in FIG. 1. In the case of the X-ray lithography system according to the first embodiment of the present invention, since the pattern is expanded and projected on an image plane, like the EXAMPLE 1 to EXAMPLE 3, the X-ray mask which is formed smaller in size than the field size on the wafer 814 to estimate an extended amount previously must be employed. The wafer 814 is a silicon wafer which is subjected to the same device process as the above EXAMPLE 1, but employs the device pattern (LSI pattern) having different layouts. The exposure field profile on the wafer 814 which is subjected to the predetermined device process has a rough rectangular shape. As the result of inspection of the exposure field 1 on the X-ray mask 812 before exposure, as shown in FIG. 27D, the exposure field 1 on the X-ray mask 812 has been smaller in size than the exposure field 2 on the wafer by the amount of 32 nm at its maximum in the horizontal direction and 203 nm in the vertical direction, and the exposure field 1 on the X-ray mask 812 has been formed as a roughly parallelogram. A longitudinal side of the exposure field 1 on the X-ray mask 812 has been shifted rightward by +30 nm at its maximum from a reference point in the horizontal direction and tilted. In actual exposure, the alignment exposure has been performed while optimizing the divergence angle of the X-ray beam in the horizontal direction by changing the incident position of the X-ray beam into the X-ray reflection mirror in real time based on the positional signal derived from the alignment marks according to difference in size depending upon the position in the exposure field. In EXAMPLE 4, as shown in FIGS. 28 and 29, the divergence angles of the X-ray beam are changed on the right and left sides by tilting the X-ray reflection mirror relative to the optical axis direction of the X-ray beam. Also, as shown in FIGS. 28 and 29, the X-ray reflection mirror 805 is driven to be tilted in synchronous with the mirror rocking such that the left and right divergence angles are almost 0 mrad and 1.5 mrad at the lower area of the exposure field respectively, both the left and right divergence angles are 0.75 mrad at the middle area of the exposure field respectively, and the left and right divergence angles are 1.5 mrad and almost 0 mrad at the upper area of the exposure field respectively. In this case, the exposure is performed while controlling the rocking speed of the X-ray reflection mirror so as to obtain the desired exposure dose.

The results of alignment displacement obtained in this case are suppressed to the same extent of the measurement reproducibility in both the horizontal and vertical directions on average. In this example, like EXAMPLE 3, the alignment accuracy can be improved since the alignment exposure has been performed by optimizing the incident position of the X-ray beam into the X-ray reflection mirror sequentially according to the position in the exposure field and controlling the magnification of the exposure field size in the horizontal direction. Especially, in EXAMPLE 4, the perpendicularity correction of the angle between the longitudinal side and the lateral side of the exposure field profile can be attained by tilting the X-ray reflection mirror relative to the optical axis direction of the X-ray beam to change the right and left divergence angles in the horizontal direction.

As evident from the above explanation, it is of course that higher order distortions such as barrel shape, trapezoid shape, etc. can be corrected in place of the simple perpendicularity correction.

Example 5

In EXAMPLE 5 according to the third embodiment of the present invention, pattern position information of the exposure fields on the X-ray mask and the wafer, which have been detected by inspection conducted before loading on the X-ray exposure system shown in FIG. 11, are stored in the data storing portion 881 connected to the X-ray reflection mirror controlling unit 810. Then, the alignment exposure is carried out sequentially by driving/controlling the X-ray reflection mirror 805 based on the stored data such that the projected patterns of the X-ray mask mates in size with the field profile 2 on the objective wafer.

The results of alignment displacement obtained by using the X-ray mask 812 and the wafer 814 which are the same as the EXAMPLE 4 are substantially identical to the real-time exposure in EXAMPLE 4. However, strictly speaking, since such results are not the positional information in the situation that they are installed in the X-ray lithography system, the alignment accuracy has been lowered by about 10% because of the distortion generated when they are held on the stage, etc. In the exposure method performed based on the position data derived previously like EXAMPLE 5, there is a possibility that the accuracy is degraded slightly, but a series of repeating operations such as detection of sequential positional information and control of the X-ray reflection mirror driving unit, etc. are not needed in the exposure. Therefore, there is such a merit that the exposure can be completed in a shorter time.

Example 6

Figure 30A:
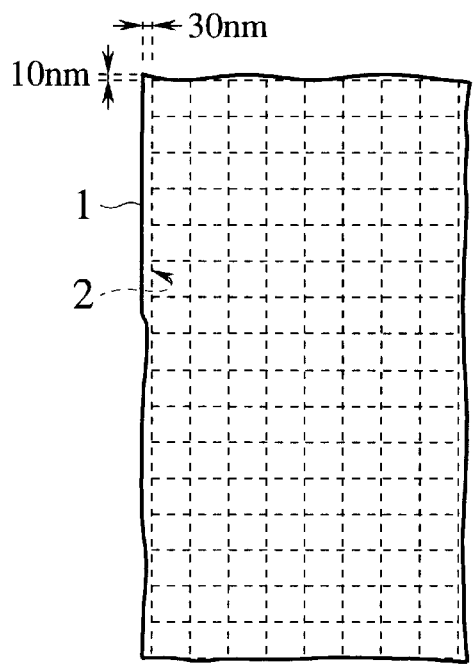
FIGS. 30A to 30I are views showing a relationship between an exposure field pattern of an X-ray mask and an exposure field pattern on a wafer respectively.

EXAMPLE 6 is concerned with the second embodiment of the present invention. The exposure field formed on the wafer 814 used in EXAMPLE 6 is formed as a rectangle having the substantially same size as a design size (20 mm×40 mm), and variations between the exposure fields on the wafer 814 have been suppressed less than 10 nm. As for the positional displacement between the profile 1 on the pattern of the X-ray mask 912 and an profile 2 on the wafer 814, which has been measured by the optical alignment system, as shown in FIG. 30A, the profile 1 on the X-ray mask has been formed smaller in size than the profile 2 on the wafer 814 by the amount of 30 nm in the horizontal direction and 10 nm in the vertical direction, and such profile 1 on the X-ray mask has been formed as a roughly rectangular shape. Then, the alignment exposure of the X-ray mask has been executed actually by using the X-ray lithography system shown in FIG. 8 in the situation that the incident angle and the incident position of the X-ray beam incident into the X-ray mask 812 in the vertical direction are maintained constant by scanning the X-ray reflection mirror along the optical axis while fixing the incident angle of the X-ray beam into the X-ray reflection mirror 805. As a result of the measurement in which the alignment displacement between the mask pattern and the wafer is measured with the use of the alignment evaluation marks, average values of the positional displacement are +48 nm in the horizontal direction and +10 nm in the vertical direction. Such positional displacement data are an average value in two right and left columns in the horizontal direction and an average value in two upper and lower rows in the vertical direction, which are derived from outermost peripheral measured values of the alignment evaluation patterns arranged at 9×17 points on the exposure field. At that time, the divergence angles of the X-ray beam are estimated generally as 1 mrad in the horizontal direction and almost 0 mrad in the vertical direction. Since the resultant alignment displacement has the divergence angle of the X-ray beam of 1 mrad in the horizontal direction, the exposure field on the wafer is larger than the field size of the X-ray mask by about 20 nm. In contrast, since the field size on the X-ray mask is larger than the wafer, it is displaced by the larger size in the vertical direction. The alignment exposure has been done with maintaining the exposure field by selecting the incident position of the X-ray beam into the X-ray reflection mirror surface and scanning the X-ray reflection mirror along the optical axis of the X-ray beam such that the incident angle of the X-ray into the X-ray mask in the horizontal direction is set to −1.5 mrad in order to reduce the alignment displacement in the horizontal direction. At that time, the displacement in the vertical direction has not been corrected since it is merely about 10 nm. Also, as to the mirror scanning by the X-ray reflection mirror scanning mechanism 912, the scanning speed has been controlled by the X-ray reflection mirror controlling unit with reference to the storage current value in the SOR ring 801 to obtain a desired exposure dose.

The results of alignment displacement obtained in this case have been suppressed on average to such extent of the measurement reproducibility in both the horizontal and vertical directions. In this example, the field size on the employed X-ray mask is formed to the same extent as the field size on the wafer in the vertical direction. Therefore, the mirror has been scanned by keeping the incident angle of the X-ray beam into the X-ray mask not to cause the alignment displacement in the vertical direction and then the exposure is executed not to change the magnification in the vertical direction.

Then, since the magnification is controlled in the horizontal direction by adjusting optimally the incident angle of the X-ray beam into the X-ray reflection mirror 805, the alignment standard accuracy for the wafer can be achieved even if the X-ray mask which has been below the standards in the prior art is employed. Then, if linewidth variations of resultant projected patterns in the exposure field have been measured to check a CD controllability, it has been found that the linewidth variation (CD variation) due to the X-ray intensity distribution is smaller than the case in EXAMPLE 1 and become smaller by 7% than the standard dimension. Therefore, it has been found that, unless the X-ray intensity distribution adjusting means 823 is employed, a dimensional in-plane uniformity can be kept good. Further, when the similar exposure has been effected by using the X-ray intensity distribution adjusting means 823, the dimensional uniformity has been able to be improved further and the uniformity of 5% has been derived in the exposure field.

Example 7

Figure 30B:
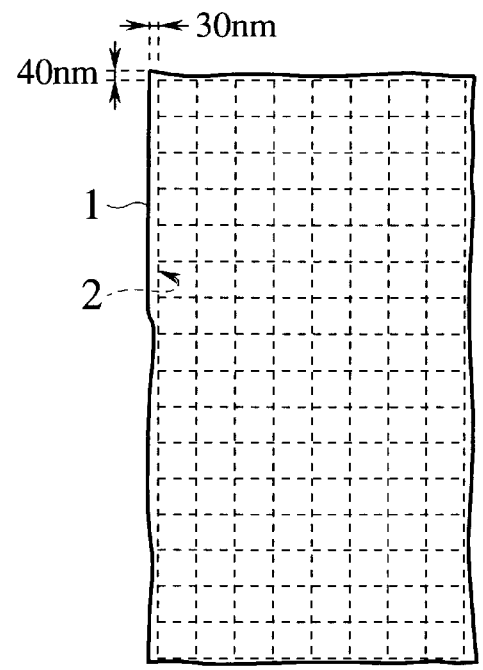

Next, EXAMPLE 7 according to the second embodiment of the present invention will be explained with reference to FIGS. 8 and 30B. As a second example of the case where the X-ray reflection mirror 805 is moved in parallel with the optical axis direction of the X-ray beam, the case will be explained where the projection is executed while changing the incident angle of the X-ray beam into the X-ray mask 812 in the EXAMPLE 7. The X-ray mask 812 employed in EXAMPLE 7 has been the same as EXAMPLE 6, and also the wafer 814 having the same pattern layout as EXAMPLE 6 has been employed. However, since the wafer 814 has been fabricated by the modified manufacturing process, the exposure field profile is formed as a rectangle shape. As for the positional displacement between the exposure field profile on the pattern of the X-ray mask 812 and an exposure field profile on the wafer 814, which has been measured by the optical alignment system, as shown in FIG. 30B, the profile 1 on the X-ray mask has been formed smaller in size than the profile 2 on the wafer 814 by the amount of 30 nm in the horizontal direction and 40 nm in the vertical direction. Then, the exposure has been executed actually by using the X-ray lithography system shown in FIG. 8 in the situation that the incident angle of the X-ray beam incident into the X-ray reflection mirror 805 is fixed in the vertical direction and the incident position of the X-ray beam is selected while fixing the incident angle of the X-ray beam into the X-ray mask 812 at −1.5 mrad in the horizontal direction and also maintaining the incident angle of the X-ray beam into the X-ray mask 812 at about 0 mrad in the vertical direction of the X-ray mask surface. In FIG. 8, if the alignment exposure is executed by scanning the X-ray reflection mirror 805 along the optical axis of the X-ray beam, it can be estimated that the displacement of about 40 nm is caused in the vertical direction. Therefore, in order to reduce the alignment displacement in the vertical direction, while maintaining the divergence angle of the X-ray beam in the horizontal direction by fixing the incident position of the X-ray beam into the X-ray reflection mirror to the selected optimal position, the exposure must be executed by adjusting the incident angle of the X-ray beam into the X-ray mask in the vertical direction optimally. In order to reduce the estimated alignment displacement, the exposure must be effected by controlling the incident angle of the X-ray beam into the X-ray mask to reduce the upper and lower area of the exposure field since the exposure field is expanded at the upper and lower area by 40 nm in the vertical direction. The alignment exposure has been executed by changing the incident angle of the X-ray beam into the X-ray mask continuously in synchronous with the mirror scanning such that the incident angle of the X-ray into the X-ray mask is set to −2 mrad at the upper area of the field, 0 mrad at the middle area, and 2 mrad at the lower area in the vertical direction of the X-ray mask surface. Also, as to the mirror scanning, the scanning speed has been controlled by the X-ray reflection mirror controlling unit 910 with reference to the storage current value in the SOR ring 801 to obtain a desired exposure dose.

The results of alignment displacement obtained in this case have been suppressed below the measuring error in the vertical direction. In EXAMPLE 7, the example has been explained in which the size of the exposure field 1 on the employed X-ray mask is formed larger than the size of the profile 2 on the wafer. However, as for the horizontal direction, it is a matter of course that the divergence angle of the X-ray beam incident into the X-ray mask can be controlled optimally in the horizontal direction by adjusting the incident position of the X-ray beam into the X-ray reflection mirror, the X-ray mask pattern can be reduced at a desired amount by controlling the incident angle in the vertical direction to projection, so that the alignment standard accuracy for the wafer with a higher accuracy can be attained.

Example 8

Figure 30C:
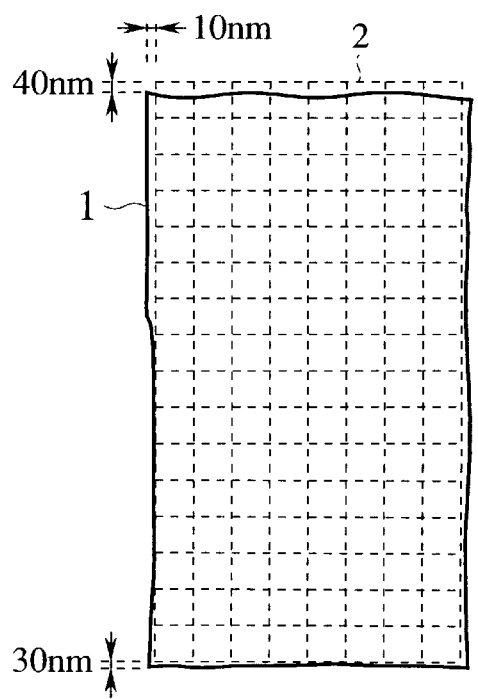

EXAMPLE 8 according to the second embodiment of the present invention will be explained with reference to FIGS. 8 and 30C. As a third example of the case where the X-ray reflection mirror 805 is moved in parallel with the optical axis direction of the X-ray beam, the case will be explained where the projection is executed while changing the incident position and the incident angle of the X-ray beam incident into the X-ray reflection mirror 805. The X-ray mask 812 used in EXAMPLE 8 has been identical to that in EXAMPLE 6, and the wafer 814 having the same pattern layout as EXAMPLE 6 has been employed. However, since the wafer 814 has been fabricated by modified manufacturing process, the exposure field profile has been formed as a rectangular shape, but, in case a long dimension measuring (pattern position measuring) has been performed previously, the profile 1 on the X-ray mask has been expanded by 30 nm at the upper area of the field, and reduced by −20 nm at the lower area of the field. As shown in FIG. 30C, the field profile 2 on the wafer 814 has been deformed smaller than the size of the profile 1 on the X-ray mask by 10 nm in the horizontal direction. Also, the profile 2 on the wafer 814 has been expanded by 40 nm at the upper area and reduced by 30 nm at the lower area in the vertical direction. If the exposure is executed by controlling the incident angle of the X-ray beam into the X-ray mask to expand the upper area and to reduce the lower area, the alignment displacement has been able to be reduced. In the actual exposure, the exposure has been performed while optimizing the divergence angle of the X-ray beam based on the positional signal derived from the alignment marks according to difference in size depending upon the position in the exposure field in compliance with the exposure sequence shown in FIG. 10. In other words, as for the horizontal direction, the divergence angle of the X-ray beam incident into the X-ray mask in the horizontal direction has been optimized by changing the incident position of the X-ray beam into the X-ray reflection mirror in real time. At the same time, as for the vertical direction, the alignment exposure has been performed sequentially while changing the incident angle of the X-ray beam into the X-ray reflection mirror in real time in synchronous with the scanning of the X-ray reflection mirror along the optical axis direction of the X-ray beam, and controlling appropriately optimally the vertical incident angle of the X-ray beam incident into the X-ray mask. For convenience of the alignment exposure in which the divergence angle of the X-ray beam is optimized in real time, the divergence angle of the X-ray beam measured by the X-ray detector 807 is within the range not departing from the conditions for the position of the objective exposure field. In such alignment exposure, the incident angle of the X-ray beam into the X-ray reflection mirror has been changed continuously in synchronous with the scanning the X-ray reflection mirror 805 such that the incident angles of the X-ray beam into the X-ray mask in the horizontal direction are kept at about −0.5 mrad in the vertical direction against the X-ray mask surface, and to 2 mrad at the upper area of the field, 0 mrad at the middle area, and 1.5 mrad at the lower area in the vertical direction.

The results of alignment displacement obtained in this case are suppressed below the measurement reproducibility in both the horizontal and vertical directions. In EXAMPLE 8, such a problem that the alignment displacement caused because the underlying exposure field profile on the wafer is different from the exposure field profile on the X-ray mask, can be solved by optimizing sequentially the incident angle of the X-ray beam into the X-ray reflection mirror based on the positional signals according to the position in the exposure field to then expose, and then the predetermined alignment standard accuracy can be attained. In other words, in EXAMPLE 8, if the alignment exposure is carried out by controlling the magnification of the projected pattern in the vertical direction and the pattern in the horizontal direction to optimal values so as to expand one and reduce the other, it is possible to attain the predetermined alignment standard accuracy.

Example 9

Figure 30D:
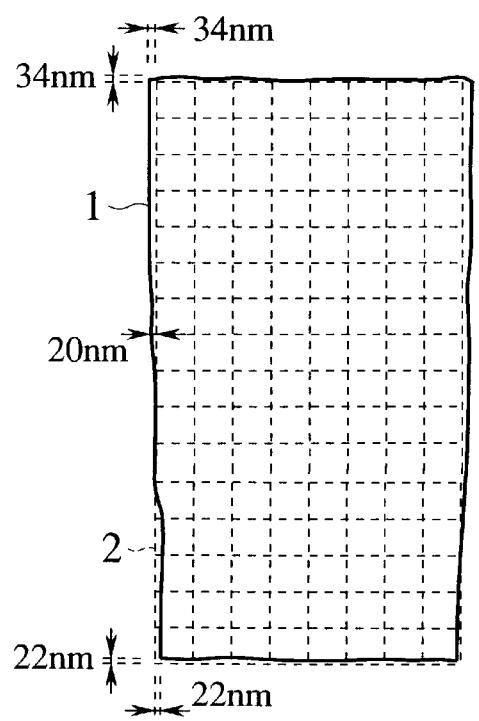

Next, EXAMPLE 9 according to the second embodiment of the present invention will be explained with reference to FIGS. 8 and 30D. As a fourth example of the case where the X-ray reflection mirror 805 is moved in parallel with the optical axis direction of the X-ray beam, the case will be explained where the projection is executed while changing the incident position and the incident angle of the X-ray beam incident into the X-ray reflection mirror 805. In case a long dimension measuring (pattern position measuring) of the X-ray mask 812 and the wafer 814 used in EXAMPLE 9 has been performed previously, as shown in FIG. 30D, the profile 1 on the X-ray mask 812 has been expanded by 34 nm at the upper area of the exposure field in both the horizontal and vertical directions in contrast to the profile 2 on the wafer 814. Also, the profile 1 on the X-ray mask 812 has been expanded by 20 nm at the middle area in the horizontal direction, and reduced by 22 nm at the lower area in both the horizontal and vertical directions. In contrast, the profile 2 on the wafer 814 has been formed as a rectangular shape which is substantially in design size. In order to mate them with each other, the projected pattern must be reduced by 34 nm at the upper area of the field in both the horizontal and vertical directions, reduced by 20 nm at the middle area in the horizontal direction, and expanded by 22 nm at the lower area in both the horizontal and vertical directions. In this manner, in the case of the trapezoidal field profile of the X-ray mask, the alignment exposure has also been able to be performed with high accuracy by controlling the divergence angle of the X-ray beam and the incident angle of the X-ray beam into the X-ray mask in real time based on the positional signal derived from the alignment marks according to difference in size depending upon the position in the exposure field in compliance with the exposure sequence shown in FIG. 10. More particularly, as for the horizontal direction, the exposure has been performed sequentially while appropriately optimizing the divergence angle of the X-ray beam incident into the X-ray mask according to the position in the exposure field on the wafer by changing the incident position of the X-ray beam into the X-ray reflection mirror in real time. Further, as for the vertical direction, the alignment exposure has been performed sequentially while controlling the vertical incident angle of the X-ray beam incident into the X-ray mask according to the position of the exposure field, by changing the incident angle of the X-ray beam into the X-ray reflection mirror in real time in synchronous with the scanning of the X-ray reflection mirror along the optical axis direction of the X-ray beam. As described above, in EXAMPLE 9, if the alignment exposure is carried out while controlling appropriately optimally the divergence angle of the X-ray beam and the incident angle of the X-ray beam into the X-ray mask in real time, the alignment displacement has been able to be reduced. In EXAMPLE 9, such a problem that the alignment displacement caused because the exposure field profile on the X-ray mask is different from the exposure field profile on the wafer, can be improved by carrying out the alignment exposure while optimizing sequentially the incident position and the incident angle of the X-ray beam into the X-ray reflection mirror based on the positional signals according to the position in the exposure field.

Example 10

Then, EXAMPLE 10 according to the second embodiment of the present invention will be explained with reference to FIGS. 8, 28, 29. This EXAMPLE 10 is a fifth example in which the X-ray reflection mirror is moved in parallel with the optical axis of the X-ray beam. As shown in FIGS. 28 and 29, the case will be explained where perpendicularity correction of the projected patterns is made by tilting the orientation of the X-ray reflection mirror 805 around the optical axis of the X-ray beam. In EXAMPLE 10, the perpendicularity correction has been made by applying the X-ray mask 812 and the wafer 814 which are the same as those used in EXAMPLE 4 to the X-ray lithography system shown in FIG. 8. In EXAMPLE 10, the profile 1 on the X-ray mask has been formed smaller than the average profile 2 on the wafer by the amount of 32 nm at its maximum in the horizontal direction and 203 nm in the vertical direction and has been formed as a parallelogram.

A longitudinal side of the exposure field has formed an inclined line shifted by +30 nm at its maximum in the horizontal direction. According to the exposure sequence shown in FIG. 10, the alignment exposure has been performed while controlling the divergence angle of the X-ray beam or the incident angle of the X-ray beam into the X-ray mask by changing the incident position of the X-ray beam into the X-ray reflection mirror 805 based on the positional signal derived from the alignment marks according to the difference in size depending upon the position in the exposure field. More particularly, the exposure has been done while driving/controlling the divergence angle of the X-ray beam into the X-ray mask appropriately/optimally according to the position in the field by changing the incident position of the X-ray beam into the X-ray reflection mirror 805 in real time in the horizontal direction. At the same time, the exposure has been done while driving/controlling the incident angle of the X-ray beam into the X-ray mask in the vertical direction appropriately/ optimally according to the position in the field by changing the incident angle of the X-ray beam into the X-ray reflection mirror 805 in real time in synchronous with the scanning of the X-ray reflection mirror 805 along the optical axis direction of the X-ray beam in the vertical direction. In driving the X-ray reflection mirror 805, as shown in FIGS. 28 and 29, the divergence angles of the X-ray beam are changed on the right and left sides by tilting the X-ray reflection mirror relative to the optical axis direction of the X-ray beam. In this manner, according to EXAMPLE 10, the rocking operation of the X-ray reflection mirror 805 has been controlled in synchronous with the mirror scanning such that the left and right divergence angles are almost 0 mrad and 1.5 mrad at the lower area of the exposure field respectively, both the left and right divergence angles are 0.75 mrad at the middle area of the exposure field respectively, and the left and right divergence angles are 1.5 mrad and almost 0 mrad at the upper area of the exposure field respectively. Also, the pattern has been expanded and projected at the lower area of the exposure field in the vertical direction by adjusting the incident angle of the X-ray beam incident into the X-ray mask, and similarly the pattern has been expanded by +10 nm at the upper area of the exposure field in the vertical direction. The scanning speed of the mirror scanning by the X-ray reflection mirror scanning mechanism 912 along the optical axis direction of the X-ray beam has been controlled by the X-ray reflection mirror controlling unit 910 so as to obtain the desired exposure dose according to the X-ray intensity.

The results of alignment displacement obtained in this case are suppressed to the same extent of the measurement reproducibility in both the horizontal and vertical directions on average. As described above, according to EXAMPLE 10, even in the second embodiment in which the exposure is performed by scanning the X-ray reflection mirror 805 in parallel with the optical axis of the X-ray beam to expand the exposure field, it has been found that the perpendicularity correction of the angle between the longitudinal side and the lateral side of the exposure field profile can be attained by tilting the X-ray reflection mirror 805 relative to the optical axis direction of the X-ray beam to change the right and left divergence angles to different values mutually in the horizontal direction.

Example 11

Then, EXAMPLE 11 according to the third embodiment of the present invention using the X-ray lithography system shown in FIG. 15 will be explained. EXAMPLE 11 has employed the X-ray mask 812 and the wafer 814, which are the same as those in EXAMPLE 1. In EXAMPLE 11, pattern position information of the exposure fields on the X-ray mask and the wafer, which have been detected by inspection conducted before loading on the X-ray exposure system shown in FIG. 15, are stored in the data storing portion 981 connected to the X-ray reflection mirror controlling unit 910. Otherwise, predetermined calculation is carried out to optimize the profile and size of the exposure field by using the above pattern position information of the exposure fields, then the calculation results are stored in the data storing portion 981, and then the alignment exposure is performed by using the stored data.

According to the results of alignment displacement obtained, the accuracy which is the same as the case where the exposure is carried out in real time on the whole exposure field in the above EXAMPLE 10 has been derived. In this way, in EXAMPLE 11, the driving/controlling method of the X-ray reflection mirror is calculated based on the positional data obtained previously, then the data are stored in the data storing portion 981, and then the exposure is conducted by reading the stored data. Therefore, since a series of repeating operations such as detection of sequential positional information and control of the X-ray reflection mirror driving unit based upon each field information, etc. are not needed in the exposure, there is such a merit that the exposure can be completed in a shorter time.

Example 12

Figure 30E:
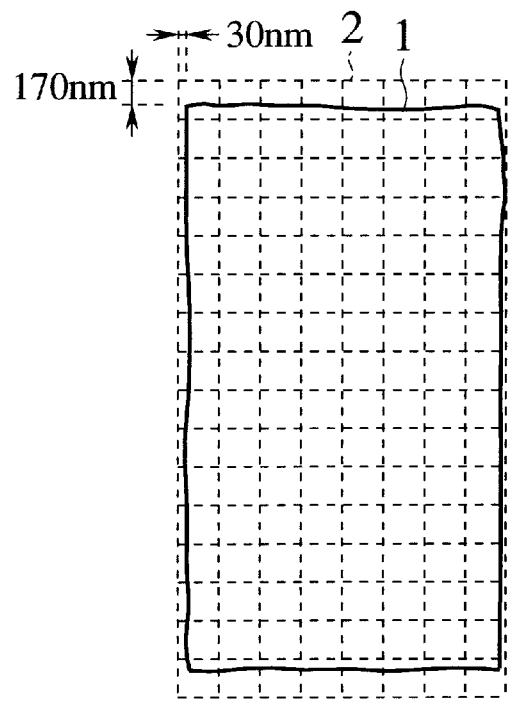

Next, the EXAMPLE 12 of the X-ray lithography system according to the fourth embodiment of the present invention will be explained with reference to FIGS. 16 and 30E. EXAMPLE 12 corresponds to the case where the patterns are projected by changing the incident position of the X-ray beam into the first X-ray reflection mirror 885. In the configuration of the X-ray lithography system according to the fourth embodiment of the present invention shown in FIG. 16, since the pattern is expanded and projected on an image plane, the X-ray mask 812 which is formed smaller in size than the field size on the wafer 814 to estimate an extended amount previously must be employed. In EXAMPLE 12, the explanation will be made in the situation that the exposure field is 20 mm×40 mm and a distance between the rocking position of the second X-ray reflection mirror 886 and the X-ray mask 812 is about 2000 mm.

At that time, the pattern displacement of 200 nm is caused in calculation on the field in the vertical direction if the gap of 20 $\mu$m is set between the X-ray mask 812 and the wafer 814. Hence, variation of the exposure field size on the wafer 814 on which the underlying pattern as the mask alignment object used actually is caused and especially there has been a difference of 30 nm in vertical size. As for an average displacement of twenty exposure field sizes between the X-ray mask pattern 812 and the wafer 814, as shown in FIG. 30E, the profile 1 on the X-ray mask has been smaller in size than the profile 2 on the wafer by the amount of 30 nm in the horizontal direction and 170 nm in the vertical direction, and the exposure field 1 has been formed as a roughly rectangular shape. As a result of the measurement in which the alignment displacement is measured with the use of the alignment evaluation patterns by executing the alignment exposure of the X-ray mask 812 actually, average values of the positional displacement in twenty exposure fields are +32 nm in the horizontal direction and +34 nm in the vertical direction. Such positional displacement data has been derived from outermost peripheral measured values of the alignment evaluation patterns 903 arranged at 9×17 points on the exposure field (see FIG. 6). In this case, horizontal displacement has been detected as an average value of alignment evaluation patterns in two right and left columns, then vertical displacement has been detected as an average value of alignment evaluation patterns in two upper and lower rows, and then average values of all twenty exposure fields are calculated on respective wafers 814. At that time, the divergence angles of the X-ray beam are estimated generally as 3 mrad in the horizontal direction and 10 mrad in the vertical direction. The incident position of the X-ray beam into the plane of the first X-ray reflection mirror 885 has been adjusted such that the incident angle of the exposure X-ray beam into the X-ray mask in the horizontal direction becomes about 1.5 mrad. Then, the exposure has been made while shifting the wafer 814 gradually by 70 nm in the direction opposite to the rocking direction of the X-ray mirror along with the mirror rocking in the vertical direction. Then, in performing the sequential exposure on every exposure field, setting of two X-ray reflection mirrors 885, 886 being adjusted above is treated as default, and then the alignment exposure is performed according to the exposure sequence shown in FIG. 18. At this time, the alignment exposure has been performed by optimizing the horizontal divergence angle of the X-ray beam while changing the incident position of the X-ray beam into the first X-ray reflection mirror 885 on occasion based on the positional signal from the alignment marks derived according to the difference in size of the fields. In the exposure, the rocking speed of the second X-ray reflection mirror, swung by the driving unit 872, is controlled by the X-ray reflection mirror controlling unit 873 to obtain the desired exposure dose according to the X-ray intensity.

The results of alignment displacement obtained in this case are suppressed to the same extent of the measurement reproducibility in both the horizontal and vertical directions on an average of twenty exposure fields. Also, linewidth variations between the exposure fields have been reduced to ⅓ rather than variations of the underlying patterns which have already been formed prior to the main exposure. In this EXAMPLE 12, the alignment displacement has been caused since horizontal size variations are present between the exposure fields of underlying patterns formed on the wafer and also the projected pattern is larger in size than the exposure field size on the wafer. Then, because the alignment exposure has been performed appropriately by controlling the pattern magnification in the horizontal direction after the incident position of the X-ray beam into the X-ray reflection mirror has been optimized every exposure field in mask alignment of the underlying patterns, alignment displacement due to variations between the exposure fields after exposure can be reduced and thus the alignment standard accuracy can be achieved.

Example 13

Figure 30F:
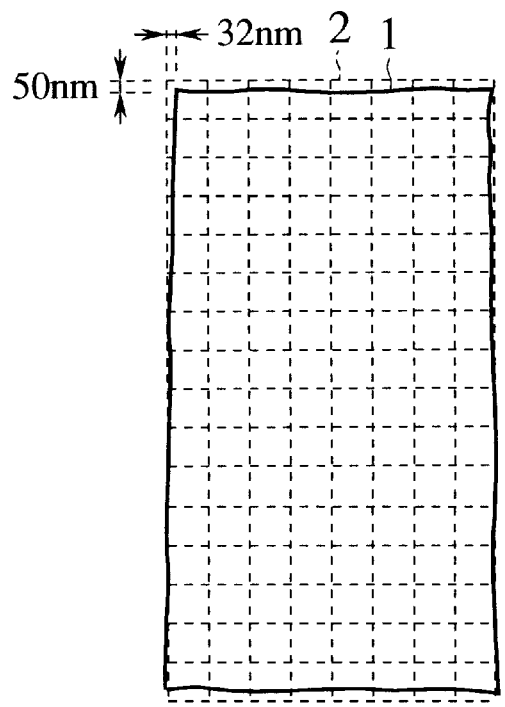

Next, EXAMPLE 13 of the X-ray lithography system according to the sixth embodiment of the present invention will be explained with reference to FIGS. 16 and 30F. In EXAMPLE 13, the case will be explained where the patterns are projected, by changing the incident position of the X-ray beam into the first X-ray reflection mirror 885. However, the first X-ray reflection mirror 885 and the second X-ray reflection mirror 886 employed in EXAMPLE 13 are the same as the above EXAMPLE 12, but the horizontal divergence angle of the X-ray beam formed according to the incident position of the X-ray beam into the plane of the first X-ray reflection mirror 885 has been measured previously and the data obtained by such measurement are stored in the data storing portion 874 and used. In the configuration of the X-ray lithography system used in this EXAMPLE 13, since the pattern is expanded and projected on an image plane because of the same circumstances as EXAMPLE 12, the X-ray mask 812 which is formed smaller in size than the field size on the wafer 814 to estimate an extended amount previously must be employed. The wafer 814 has been fabricated by using the device pattern having a different layout and different manufacturing process from EXAMPLE 12. The variation of the field sizes on the wafer 814 has been suppressed within the measuring accuracy and the field profile is a rough barrel shape. As for an average displacement of exposure field sizes between the X-ray mask pattern 812 and the wafer 814, as shown in FIG. 30F, the profile 1 on the X-ray mask has been smaller in size than the profile 2 on the wafer by the amount of 32 nm in the horizontal direction and 50 nm in the vertical direction, and the exposure field 1 has been formed as a roughly rectangular shape. As a result of the measurement in which the alignment displacement is measured with the use of the alignment evaluation patterns by executing the alignment exposure of the X-ray mask 812 actually, average values of the positional displacement in twenty exposure fields have been +28 nm at the middle area of the exposure field, +55 nm at the upper area, and +40 nm at the lower area in the horizontal direction. The average values of the positional displacement have been +140 nm at the upper area of the exposure field, and +145 nm at the lower area in the vertical direction.

Such positional displacement data has been derived from outermost peripheral measured values of the alignment evaluation patterns 903 arranged at 9×17 points on the exposure field (see FIG. 6). In this case, horizontal displacement has been detected as an average value of alignment evaluation patterns in two right and left columns, then vertical displacement has been detected as an average value of alignment evaluation patterns in two upper and lower rows, and then average values of all twenty exposure fields are calculated on respective wafers 814. In exposure, in compliance with the exposure sequence shown in FIG. 24, according to difference in horizontal size depending upon the position in the exposure field, the incident position of the X-ray beam in the plane of the first X-ray reflection mirror 885 has been changed based on the data of the divergence angle stored in the data storing portion 874. Also, the alignment exposure is done while moving the wafer 814 by 280 nm in the direction identical to the rocking direction of the second X-ray reflection mirror 886 in the vertical direction. In this exposure, the divergence angle of the X-ray beam has been measured by the X-ray detector 807, but this measured information is not returned to the X-ray reflection mirror controlling unit 873 to control/drive the first X-ray reflection mirror 885 and the second X-ray reflection mirror 886. At that time, the incident angles of the X-ray beam into the X-ray mask in the horizontal direction are adjusted to 1.5 mrad at the lower area, 1.5 mrad at the middle area, and almost 0 mrad at the upper area in one field against the vertical direction of the X-ray mask surface. This adjustment is performed by selecting the incident position of the X-ray beam into the first X-ray reflection mirror 885 from the data stored in the data storing portion 874. In the exposure, the rocking of the second X-ray reflection mirror 886 by the second X-ray reflection mirror driving unit 872 is controlled by the X-ray reflection mirror controlling unit 873 to obtain the desired exposure dose according to the X-ray intensity.

The results of alignment displacement obtained in this case are suppressed to the same extent of the measurement reproducibility in both the horizontal and vertical directions on an average of total exposure fields. Also, in EXAMPLE 13 like the EXAMPLE 12, the alignment exposure has been done in the situation that setting of the X-ray reflection mirror is not optimized previously, the exposure is not always needed previously if the exposure is performed in real time. Since the X-ray reflection mirror is driven and controlled optimally based on the alignment positional signal according to the position in the exposure field, the alignment exposure can be applied to not only the simple magnification correction but also the exposure fields having complicated geometries.

Example 14

EXAMPLE 14 is associated with the sixth embodiment of the present invention. In EXAMPLE 14, the X-ray mask 812 and the wafer 814 which are the same as those in EXAMPLE 13 have been employed. Pattern position information of the exposure fields on the X-ray mask and the wafer, which have been detected by inspection conducted before loading on the X-ray exposure system shown in FIG. 22, are stored in the data storing portion 874. Then, the alignment exposure has been carried out sequentially by driving/controlling the X-ray reflection mirror 805 based on the stored data such that the projected patterns of the X-ray mask mates in size with the exposure field profile on the objective wafer.

The results of alignment displacement obtained are equivalent to the real-time exposure in EXAMPLE 13. However, since such results are not the positional information in the situation that they are installed in the X-ray lithography system, the alignment accuracy has been lowered slightly because of the distortion generated when they are held on the stage, etc. In the method of storing the position data derived previously in the data storing portion and then performing the exposure based on the stored position data, a series of repeating operations such as detection of sequential positional information and control of the X-ray reflection mirror driving unit, etc. are not needed in the exposure. Therefore, there is such a merit that the exposure can be completed in a shorter time.

Example 15

Figure 30G:
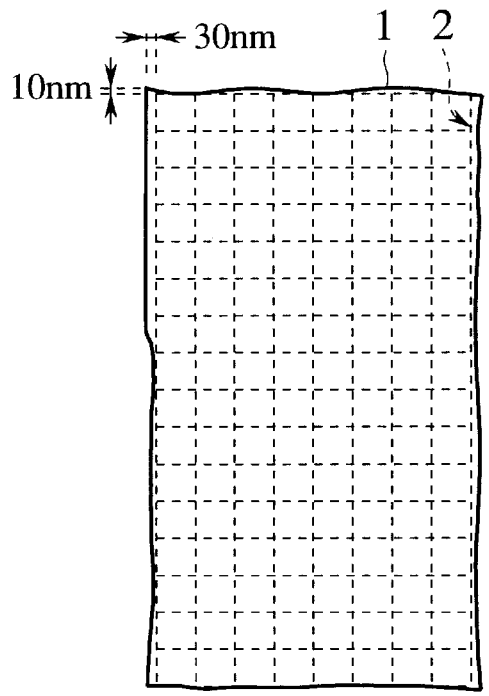

EXAMPLE 15 is concerned with the fifth embodiment of the present invention. The exposure field on the wafer 814 used in EXAMPLE 15 has been formed as a rectangle having the substantially same size as a design size (20 mm×40 mm), and variations between twenty exposure fields formed on the wafer 814 have been suppressed less than the measuring accuracy. As for positional displacement between the exposure field 1 on the pattern of the X-ray mask and the exposure field 2 on the wafer has been detected by the optical alignment system 820, as shown in FIG. 30G, the exposure field 1 on the X-ray mask pattern indicated has been smaller in size than the exposure field 2 on the wafer by the amount of 30 nm in the horizontal direction and 10 nm in the vertical direction, and the exposure field 1 has been formed as a roughly rectangular shape. Then, in the situation that the reflection angle of the X-ray beam from the second X-ray reflection mirror 886 is fixed to provide the incident angle of the X-ray beam of 90° into the X-ray mask pattern, actually the alignment exposure has been executed by scanning the second X-ray reflection mirror 886 along the optical axis direction with the use of the X-ray lithography system shown in FIG. 19. At that time, the positional displacement between the mask pattern and the wafer 814 have been +48 nm in the horizontal direction and +8 nm in the vertical direction, and the divergence angles of the X-ray beam have been estimated as roughly 1 mrad in the horizontal direction and almost 0 mrad in the vertical direction. Resultant alignment displacement has been larger by about 20 nm than the field size on the X-ray mask in the horizontal direction since the X-ray has the divergence angle of 1 mrad, while they are displaced in the vertical direction by the distance by which the exposure field of the X-ray mask is large in size rather than the wafer. The incident position of the X-ray beam into the surface of the first X-ray reflection mirror 885 has been selected such that the incident angle of the X-ray beam into the X-ray mask is set to −1.5 mrad in the horizontal direction to reduce the alignment displacement in the horizontal direction. The mask alignment (exposure) has been done by scanning the second X-ray reflection mirror 886 along the optical axis direction while keeping its orientation as it is. At that time, since the displacement in the vertical direction has been a small value like 8 nm within the measuring error range, no correction has been performed. In addition, in the scanning operation of the second X-ray reflection mirror 886 along the optical axis, the scanning speed of the X-ray beam is controlled with reference to the storage current value of the SOR ring to obtain the desired exposure dose.

The alignment results obtained in this case are suppressed on average to such extent of the measuring error in both the horizontal direction and the vertical direction. In the EXAMPLE 15, the size of the exposure fields on the employed X-ray mask has been formed to the same extent as the field size on the wafer in the vertical direction. Hence, the mirror has been scanned while keeping the incident angle of the X-ray beam into the X-ray mask not to cause alignment displacement in the vertical direction, so that the exposure is carried out not to change the magnification in the vertical direction. The magnification is controlled by adjusting the incident position of the X-ray beam into the first X-ray reflection mirror 885 optically in the horizontal direction. Accordingly, the alignment standard accuracy for the wafer can be achieved even if the X-ray mask which has been below the standards in the prior art is employed. Then, if linewidth variations of resultant projected patterns in the exposure field have been measured to check a CD controllability, it has been found that the linewidth variation (CD variation)due to the X-ray intensity distribution has become small rather than the case in EXAMPLE 13 and the dimensional in-plane uniformity has become good.

Example 16

Figure 30H:
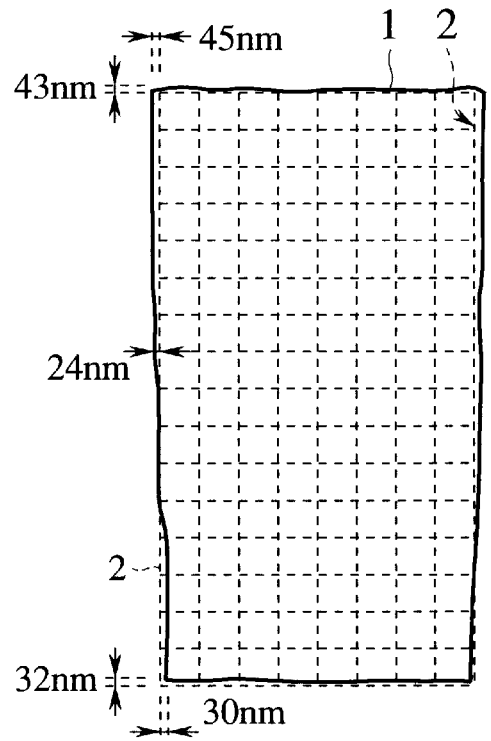
Figure 30I:
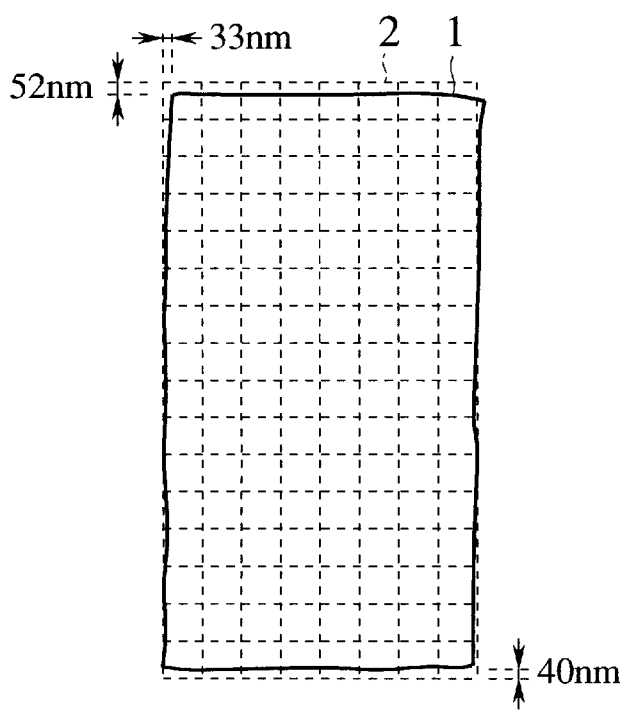

EXAMPLE 16 according to the fifth embodiment of the present invention will be explained with reference to FIGS. 19 and 30H. In EXAMPLE 16, as an example of the case where the second X-ray reflection mirror 886 is moved in parallel with the optical axis direction of the X-ray beam, the case will be explained where the projection is executed while changing the incident position of the X-ray beam incident into the first X-ray reflection mirror 885 and the incident angle of the X-ray beam into the second X-ray reflection mirror 886. In EXAMPLE 16, in case a long dimension measuring (pattern position measuring) of the X-ray mask 812 and the wafer 814 employed has been performed previously, as shown in FIG. 30H, the profile 1 on the X-ray mask has been expanded by 34 nm at the upper area of the field in both the horizontal and vertical directions, expanded by 24 nm at the middle area of the field in the horizontal direction, and reduced by 30 nm at the lower area of the field in both the horizontal and vertical directions in contrast to the size of the exposure field 2 on the wafer, which yields a trapezoidal shape. In contrast, the field profile 2 on the wafer 814 has been formed substantially as a design size which is a rectangular shape. In order to mate them with each other, the upper area of the field of the projected pattern must be reduced by 43 nm in both the horizontal and vertical directions, and the middle area thereof must be reduced by 24 nm in the horizontal direction, and the lower area thereof must be expanded by 30 nm in both the horizontal and vertical directions. In case the field profile on the X-ray mask has been the trapezoidal shape, the alignment exposure has been performed based on the positional signals derived from the alignment marks according to difference in size depending upon the position in the field in compliance with the exposure sequence shown in FIG. 21. In this case, the alignment exposure has be done while optimizing appropriately the horizontal divergence angle of the X-ray beam into the X-ray mask according to the position in the field by changing the incident angle of the X-ray beam into the first X-ray reflection mirror 885 in real time in the horizontal direction. Also, as for the vertical direction, the alignment exposure has been performed while changing the incident angle of the X-ray beam into the second X-ray reflection mirror 886 in real time, rocking the second X-ray reflection mirror 886 in synchronous with the scanning of the second X-ray reflection mirror 886 along the optical axis direction of the X-ray beam, and changed appropriately optimally the vertical incident angle of the X-ray beam incident into the X-ray mask according to the field position. According to such alignment exposure, the alignment displacement has been able to be reduced below the measuring accuracy.

In the EXAMPLE 16, such a problem that the alignment displacement is caused because of difference of the exposure field profile on the X-ray mask from the profile 2 on the wafer can be improved by executing the alignment exposure while changing sequentially the incident position and the incident angle of the X-ray into the X-ray reflection mirror to optimal values based on the positional signal depending upon the position in the exposure field.

Example 17

EXAMPLE 17 is concerned with the fifth embodiment of the present invention. In this EXAMPLE 17, as shown in FIGS. 28 and 29, the case will be explained where, as another example of the case where the second X-ray reflection mirror 886 is moved in parallel with the optical axis of the X-ray beam, the projection operation is performed by tilting the orientation of the first X-ray reflection mirror 885 relative to the optical axis of the X-ray beam. In the EXAMPLE 17, the profile 1 on the X-ray mask 812 has been smaller in size than the average profile 2 on the wafer 814 by the amount of 32 nm at its maximum in the horizontal direction and 52 nm at the upper area and 40 nm at the lower area in the vertical direction. Also, the exposure field 1 on the X-ray mask 812 has been formed as a parallelogram. A longitudinal side of the parallelogram has been an oblique line which is inclined on average by +30 nm at its maximum from a reference point in the horizontal direction. In compliance with the exposure sequence shown in FIG. 21, the alignment exposure has been performed based on the positional signal derived from the alignment marks according to difference in size depending upon the position in the exposure field. At that time, as for the horizontal direction, the divergence angle of the X-ray beam incident into the X-ray mask 812 has been controlled appropriately/optimally according to the position in the exposure field by changing the incident position of the X-ray beam into the first X-ray reflection mirror 885. In addition, as for the vertical direction, the incident angle of the X-ray beam into the second X-ray reflection mirror 886 is controlled appropriately/optimally in real time in synchronous with the scanning of the second X-ray reflection mirror 886 along the optical axis of the X-ray beam. Where the right and left divergence angles of the X-ray beam have been changed by tilting the first X-ray reflection mirror 885 around the optical axis direction of the X-ray beam, as shown in FIG. 28 or FIG. 29. In this manner, the drive of the first X-ray reflection mirror 885 has been controlled in synchronous with the scanning of the second X-ray reflection mirror 886 such that, with respect to the horizontal direction, the left and right divergence angles are almost 0 mrad and 1.5 mrad at the lower area of the exposure field respectively, both the left and right divergence angles are 0.75 mrad at the middle area of the exposure field respectively, and the left and right divergence angles are 1.5 mrad and almost 0 mrad at the upper area of the exposure field respectively. Also, with respect to the vertical direction, the divergence angle of the X-ray beam incident into the X-ray mask has been 2.5 mrad at the upper area of the exposure field to expand the pattern and 2.0 mrad at the lower area of the exposure field to expand the pattern. The scanning speed of the second X-ray reflection mirror 886 driven by the X-ray reflection mirror scanning mechanism 973 along the optical axis direction is controlled so as to obtain the desired exposure dose according to the X-ray intensity.

The results of alignment displacement obtained in this case are suppressed to the same extent of the measurement reproducibility such as 8 nm on average in both the horizontal and vertical directions. In the system configuration according to the EXAMPLE 17 wherein the second X-ray reflection mirror 886 is scanned in parallel with the optical axis direction of the X-ray beam and the exposure field is expanded to expose, it has become evident that the alignment exposure having the corrected perpendicularity can be achieved by tilting/driving the first X-ray reflection mirror 885 around the optical axis direction to change the right and left divergence angles in the horizontal direction.

It is of course that, if the approach described in the EXAMPLE 17 is applied in a further expanded manner, it can correct higher order distortions such as barrel shape, trapezoid shape, etc. in addition to the simple perpendicularity correction.

Example 18

EXAMPLE 18 is associated with the sixth embodiment of the present invention. First, before the X-ray mask 812 and the wafer 814 are loaded in the X-ray exposure system, pattern position information of the exposure fields on the X-ray mask 812 and the wafer 814 have been inspected by using the X-ray mask 812 and the wafer 814 which are the same as the above EXAMPLE 17. Then, the horizontal divergence angle of the X-ray beam reflected by the second X-ray reflection mirror 886 according to the orientation of the first X-ray reflection mirror 885 and the incident position of the X-ray beam has been measured. These data are stored in the data storing portion 979 shown in FIG. 26. Then, methods of driving the first X-ray reflection mirror 885 and the second X-ray reflection mirror 886 are calculated based on the stored data such that the projected pattern of the X-ray mask should mate in size with the field profile on the objective wafer, and then summed up as a data table. In execution of the exposure, the alignment exposure is performed by controlling the drive of the first X-ray reflection mirror 885 and the second X-ray reflection mirror 886 based on the drive data quoted from this data table.

The results of alignment displacement obtained are identical on average to the real-time exposure in EXAMPLE 17 in both the horizontal direction and the vertical direction. According to EXAMPLE 18, the alignment exposure of high level can be attained by storing the resultant positional data and the data of the divergence angle of the X-ray beam previously the data storing portion 979 once and then reading these data in exposure.

OTHER EMBODIMENTS

Various modifications will become possible for those skilled in the art after receiving the teachings of the present disclosure without departing from the scope thereof.

As described above, the present invention has been set forth by the first to sixth embodiments and the EXAMPLE 1 to EXAMPLE 18, but it should not be understood that descriptions and drawings constituting a part of this disclosure limit to the present invention. From this disclosure, various alternative embodiments, alternative EXAMPLEs, and application technology become apparent for the skilled person in the art.

For example, in the above embodiments and EXAMPLEs, although the explanation has been made in the situation that the exposure field size is kept constant at 20 mm×40 mm, such exposure field size may be selected arbitrarily. It is of course that, even if the exposure field size is changed, the present invention may be applied. In addition, in the event that horizontal and vertical lengths are exchanged with each other like 40 mm×20 mm, exposure of the desired region can be achieved by controlling a vertical scanning range of the X-ray reflection mirror if such lengths are within allowable ranges of the system such as various system configuration sizes, driving ranges, etc. Also, in the event that device patterns on the wafer are formed by a scanning type lithography system ("the sannner"), sometimes the patterns have been formed by scanning in the direction different from the scanning direction on the exposure field in the X-ray lithography system of the present invention. If a mix-and-match exposure must be applied between various lithography machines having different exposure equipments, often there is a necessity of putting the scanning direction of the exposure beam in both machines in the same direction. But such request can be satisfied by mating the scanning direction with the direction of the exposure field when the wafer is held on the stage. Also, if the scanning direction of the exposure beam is different every exposure field in the plane, the exposure may be performed after the rocking direction or the scanning direction of the X-ray reflection mirror of the present invention has been adjusted according to the scanning direction.

Moreover, the EXAMPLEs 1 to 18 may be employed in combination. In the above EXAMPLEs, the magnification correction and the distortion correction are performed to mate with the exposure field on the wafer when the X-ray mask pattern is projected. However, for example, the accuracy can be improved by executing the exposure and projection while correcting sequentially the positional distortion due to temperature increase, damage, etc. of the X-ray mask and the wafer generated according to the scanning of the X-ray beam by virtue of feedback in real time. In addition, the present invention may be applied to improve the deterioration of the projected pattern accuracy. At that time, as described in the third and sixth embodiments, if the database of the rocking and scanning operations of the X-ray reflection mirror required to correct the positional distortion are calculated in advance and then the exposure is executed based on the results, calculation for controlling the X-ray reflection mirror in real time can be omitted and the processing speed can be accelerated.

Figure 31A:
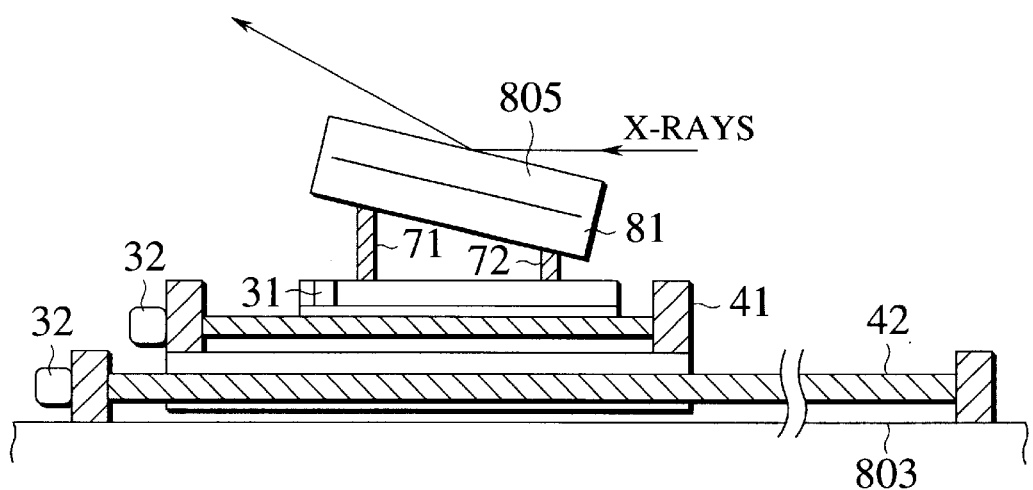
FIG. 31A is a schematic view showing the state wherein an X-ray reflection mirror driving unit and an X-ray reflection mirror scanning mechanism are installed on a wall surface of a beam line when viewed laterally.
Figure 31B:
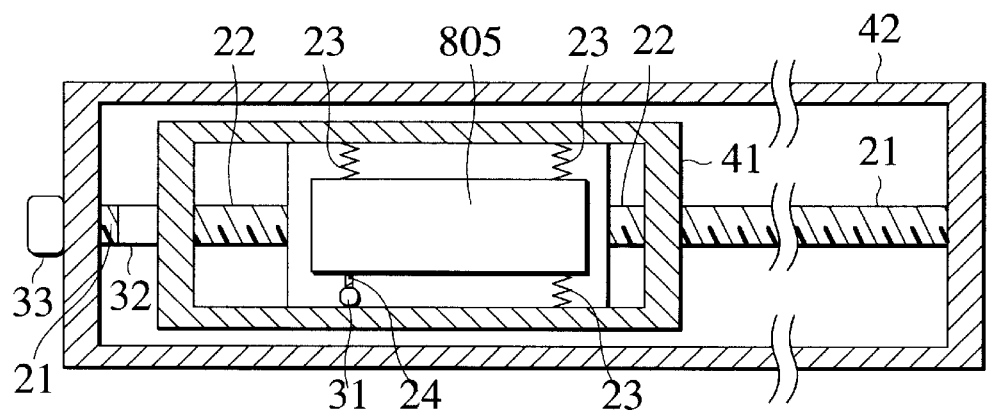
FIG. 31B is a top view showing the X-ray reflection mirror driving unit and the X-ray reflection mirror scanning mechanism in FIG. 31A.
Figure 31C:
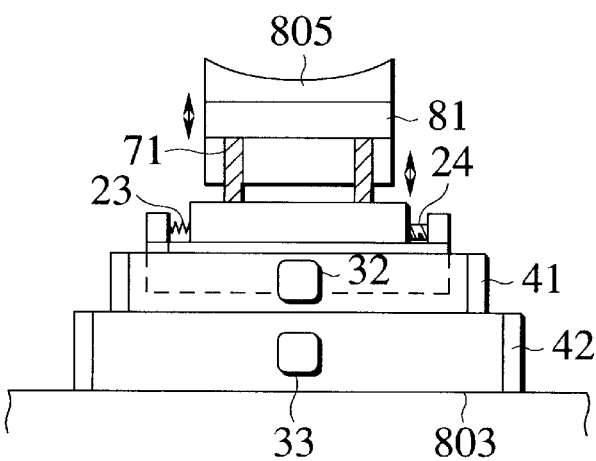
FIG. 31C is a side view showing the same when viewed from the X-ray exposure chamber side.

It is possible to employ data obtained by an external unit of the X-ray lithography system other than the relative positional information acquiring means (820,821), the two dimensional information acquiring means (807,821) and the data storing portions 881,981,979 shown in FIGS. 11,15,26. For example, it is possible to use a line width and coordinate measurement system or a laser interferometric coordinate measurement system. Then it is possible to obtain the similar the relative positional information and/or the similar two dimensional information by measuring the positions of patterns exposed on the wafer under various exposure conditions. The various exposure conditions should have parameters of different mirror positions and different mirror orientations under similar position of mask and underlying pattern as mentioned before As the X-ray reflection mirror driving unit, the X-ray reflection mirror scanning mechanism, etc. of the present invention, driving mechanisms such as the six-axis goniometer known in the art, etc. may be employed. For instance, as shown in FIGS. 31A to 31C, the structure in which the X-ray mirror driving unit is installed on the X-ray reflection mirror scanning mechanism may be employed. FIG. 31A is a schematic view showing the state in which the X-ray mirror driving unit and the X-ray reflection mirror scanning mechanism are installed on a wall surface of a beam line 803 when viewed laterally. FIG. 31B is a top view showing the X-ray reflection mirror driving unit and the X-ray reflection mirror scanning mechanism in FIG. 31A, and FIG. 31C is a side view showing the same when viewed from the X-ray exposure chamber side. In FIGS. 31A to 31C, the X-ray reflection mirror scanning mechanism causes a linear driving motor 33 such as a step motor, etc. to drive a guide rail 41, on 21 provided for a guide rail 42 so as to move a guide rail 41, on which the X-ray reflection mirror driving unit is mounted, along the optical axis direction of the X-ray beam. The X-ray reflection mirror driving unit drives a guide screw 22 provided for the guide rail 41 by a linear driving motor 32 to linearly move along the optical axis direction. As shown in FIGS. 28A and 28B or FIGS. 29A and 29B, vertical or oblique driving relative to the optical axis can be effected by a horizontal driving motor 31 and a guide screw 24 and a compressing spring 23. Further, a mirror holding portion 81 for fixing the X-ray reflection mirror 805 can be moved upward/downward and also swung by actuators 71, 72 in a mirror orientation/rocking driving unit. FIGS. 31A to 31C are mere examples, and various alternative mechanisms may be employed as the X-ray reflection mirror driving unit, the X-ray reflection mirror scanning mechanism, etc. of the present invention. Especially, it has been known that, if precise positional control is required, a friction makes its control difficult. Thus, if a friction-less drive is carried out by using magnetic levitation, the positional control can be achieved in the order of nanometer. In this case, it is preferable that a rough movement is performed by a guide screw while a fine movement is performed by an electromagnetically drive. In addition, in place of the mechanical compressing spring 23 shown in FIGS. 31A to 31C, it is preferable to employ a "magnetic spring" using an attraction force and a repulsion force caused by a magnetic force.

Further, it is a matter of course that various known alternative means may be employed as respective constituent elements used in the X-ray lithography system of the present invention. Furthermore, the configuration and material of the X-ray mask, the pattern layout, etc., which are applicable in the present invention, are not limited to the above embodiments and the above EXAMPLEs, and therefore various system constructions and configurations of the X-ray lithography system may be applied as various modifications if not departs from the scope of the present invention. As described above, it should be understood that the present invention can contains various embodiments, EXAMPLEs, etc. not set forth herein. Accordingly, the present invention should be construed broadly within its spirit and scope as set out in the accompanying claims.

What is claimed is:

1. An X-ray lithography system for exposing photoresist material coated on a wafer by an X-ray beam through an X-ray mask, comprising:

(a) an X-ray reflection mirror whose radius of curvature is changed to differentiate its reflection characteristic according to an in-plane incident position of the X-ray beam;

(b) an X-ray reflection mirror driving unit connected to the X-ray reflection mirror, for changing an incident position of the X-ray beam into the X-ray reflection mirror;

(c) a relative positional information acquiring means for acquiring relative positional information between a pattern on the X-ray mask and a pattern on the wafer during exposure;

(d) a two dimensional information acquiring means for acquiring two dimensional information of the X-ray beam during exposure; and (e) an X-ray reflection mirror controlling unit for feedback-controlling the X-ray reflection mirror driving unit in real time, based upon at least one of the relative positional information and the two dimensional information during exposure by the X-ray beam.

2. The system of claim 1, wherein said relative positional information acquiring means comprises, an optical alignment system for detecting position signals from alignment marks on the X-ray mask and alignment marks on the wafer, and an alignment controlling unit for calculating a relative positional relationship between the pattern on the X-ray mask and the pattern on the wafer based on the position signals.

3. The system of claim 2, wherein said two dimensional information acquiring means comprises an X-ray detector for detecting the X-ray beam, wherein the alignment controlling unit calculates horizontal and vertical collimation of the X-ray beam reflected by the X-ray reflection mirror as two dimensional information by using a detection signal from the X-ray detector.

4. The system of claim 1, wherein said X-ray reflection mirror driving unit and said X-ray reflection mirror controlling unit feedback-control the X-ray reflection mirror such that an incident position of the X-ray beam moves along a predetermined axis direction.

5. The system of claim 1, wherein said X-ray reflection mirror driving unit and said X-ray reflection mirror controlling unit move the X-ray reflection mirror in a predetermined direction, feedback-control a divergence angle of the X-ray beam in a horizontal direction, and feedback-control the divergence angle of the X-ray beam in a vertical direction by rocking the X-ray reflection mirror.

6. The system of claim 1, further comprising:
an X-ray reflection mirror scanning mechanism which is connected to the X-ray reflection mirror and feedback-controlled by the X-ray reflection mirror controlling unit to be moved in parallel with an optical axis direction of the X-ray beam.

7. The system of claim 1, further comprising:
another X-ray reflection mirror for reflecting the X-ray beam reflected by the X-ray reflection mirror; and
another X-ray reflection mirror driving unit which is connected to the another X-ray reflection mirror and different from the X-ray reflection mirror driving unit.

8. The system of claim 1, wherein said X-ray reflection mirror driving unit and said X-ray reflection mirror controlling unit differentiate a right horizontal divergence angle and a left horizontal divergence angle of the X-ray beam by rotating or tilting the X-ray reflection mirror around an optical axis.

9. An X-ray lithography system for exposing photoresist material coated on a wafer by an X-ray beam through an X-ray mask, comprising:
(a) an X-ray reflection mirror whose radius of curvature is changed to differentiate its reflection characteristic according to an in-plane incident position of the X-ray beam;
(b) an X-ray reflection mirror driving unit connected to the X-ray reflection mirror, for changing an incident position of the X-ray beam into the X-ray reflection mirror;
(c) a relative positional information acquiring means for acquiring relative positional information between a pattern on the X-ray mask and a pattern on the wafer prior to exposure;
(d) a two dimensional information acquiring means for acquiring two dimensional information of the X-ray beam prior to exposure;
(e) a data storing unit for storing at least one of the relative positional information and the two dimensional information; and
(f) an X-ray reflection mirror controlling unit for controlling the X-ray reflection mirror driving unit based upon said at least one of the relative positional information and the two dimensional information stored in the data storing unit.

10. The system of claim 9, wherein said relative positional information acquiring means comprises,
an optical alignment system for detecting position signals from alignment marks on the X-ray mask and alignment marks on the wafer, and
an alignment controlling unit for calculating a relative positional relationship between the pattern on the X-ray mask and the pattern on the wafer based on the position signals.

11. The system of claim 10, wherein said two dimensional information acquiring means comprises an X-ray detector for detecting the X-ray beam,
wherein the alignment controlling unit calculates horizontal and vertical collimation of the X-ray beam reflected by the X-ray reflection mirror as two dimensional information by using a detection signal from the X-ray detector.

12. The system of claim 9, wherein a predetermined exposure field is segmented into N areas (n=1 to N), and
said relative positional information acquiring means obtains beforehand the relative positional information of a next field position (n+1-th position)or beyond the next position, during a present field position (n-th position) on which the X-ray beam is actually irradiated,
and then the relative positional information is stored in said data storing unit.

13. The system of claim 9, wherein said X-ray reflection mirror driving unit and said X-ray reflection mirror controlling unit control the X-ray reflection mirror such that an incident position of the X-ray beam moves along a predetermined axis direction.

14. The system of claim 9, wherein said X-ray reflection mirror controlling unit moves the X-ray reflection mirror in a predetermined direction, controls a divergence angle of the X-ray beam in a horizontal direction, and controls the divergence angle of the X-ray beam in a vertical direction by rocking the X-ray reflection mirror with the X-ray reflection mirror driving unit.

15. The system of claim 9, further comprising:
an X-ray reflection mirror scanning mechanism which is connected to the X-ray reflection mirror and feedback-controlled by the X-ray reflection mirror controlling unit to be moved in parallel with an optical axis direction of the X-ray beam.

16. The system of claim 9, further comprising:
another X-ray reflection mirror for reflecting the X-ray beam reflected by the X-ray reflection mirror; and
another X-ray reflection mirror driving unit which is connected to the another X-ray reflection mirror and different from the X-ray reflection mirror driving unit.

17. The system of claim 9, wherein said X-ray reflection mirror driving unit and said X-ray reflection mirror controlling unit differentiate a right horizontal divergence angle from a left horizontal divergence angle of the X-ray beam by rotating or tilting the X-ray reflection mirror around an optical axis.

18. An X-ray lithography method for exposing photoresist material coated on a wafer by an X-ray beam through an X-ray mask, comprising the steps of:
(a) acquiring relative positional information between a pattern on the X-ray mask and a pattern on the wafer during exposure;
(b) acquiring two dimensional information of the X-ray beam during exposure; and
(c) correcting in real time relative positional displacement between the pattern on the X-ray mask and the pattern on the wafer by performing feedback-control of the X-ray reflection mirror driving unit based upon at least one of the relative positional information and the two dimensional information to move a position of the X-ray beam incident into the X-ray reflection mirror which has different reflection characteristics according to its position.

19. The method of claim 18, wherein said step of correcting relative positional displacement controls a horizontal divergence angle of the X-ray beam by moving the position of the X-ray incident into the X-ray reflection mirror, and control a vertical divergence angle of the X-ray beam by rocking the X-ray reflection mirror.

20. The method of claim 18, wherein movement of an incident position of the X-ray beam in said step of correcting relative positional displacement is either continuous movement or sequential movement.

21. The method of claim 18, wherein said step of correcting relative positional displacement controls an incident angle of the X-ray beam relative to the X-ray mask by moving the X-ray reflection mirror in parallel with an optical axis direction thereof, while either fixing an incident position of the X-ray beam to a certain position in the X-ray reflection mirror or changing the incident position of the X-ray beam.

22. The method of claim 18, wherein said step of correcting relative positional displacement is performed by radiating the X-ray beam, which is reflected by another X-ray reflection mirror different from the X-ray reflection mirror, into the X-ray reflection mirror.

23. The method of claim 22, wherein said step of correcting relative positional displacement is performed by rocking the another X-ray reflection mirror to control the vertical divergence angle of the X-ray beam.

24. The method of claim 22, wherein said step of correcting relative positional displacement is performed by moving the another X-ray reflection mirror in a certain direction to control an incident angle of the X-ray beam relative to the X-ray mask.

25. An X-ray lithography method for exposing photoresist material coated on a wafer by an X-ray beam through an X-ray mask, comprising the steps of:

(a) acquiring relative positional information between a pattern on the X-ray mask and a pattern on the wafer prior to exposure;

(b) acquiring two dimensional information of the X-ray beam prior to exposure;

(c) storing at least one of the relative positional information and the two dimensional information; and (d) correcting relative positional displacement between the pattern on the X-ray mask and the pattern on the wafer by reading said at least one of the relative positional information and the two dimensional information, which have been stored, and then moving an incident position of the X-ray beam into the X-ray reflection mirror, which has different reflection characteristics according to its position, by use of such information.

26. The method of claim 25, comprising the additional steps of:

segmenting a predetermined exposure field into N areas (n=1 to N);

obtaining the relative positional information of a next field position (n+1-th position) or beyond the next position beforehand, while a present field position (n-th position) is irradiated by the X-ray beam.

27. The method of claim 25, wherein said step of correcting relative positional displacement corrects perpendicularity between a longitudinal side and a lateral side of an exposure pattern by rotating or tilting the X-ray reflection mirror around an optical axis.

* * * * *